(12) United States Patent
Simsek-Ege

(10) Patent No.: US 10,658,367 B1
(45) Date of Patent: May 19, 2020

(54) INTEGRATED ASSEMBLIES WHICH INCLUDE METAL-CONTAINING INTERCONNECTS TO ACTIVE-REGION PILLARS, AND METHODS OF FORMING INTEGRATED ASSEMBLIES

(71) Applicant: Micron Technology, Inc., Boise, ID (US)

(72) Inventor: Arzum F. Simsek-Ege, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/208,065

(22) Filed: Dec. 3, 2018

(51) Int. Cl.
*H01L 27/108* (2006.01)

(52) U.S. Cl.
CPC .. *H01L 27/10885* (2013.01); *H01L 27/10805* (2013.01); *H01L 27/10855* (2013.01); *H01L 27/10888* (2013.01)

(58) Field of Classification Search
CPC ......... H01L 27/10885; H01L 27/10805; H01L 27/10855; H01L 27/10888
See application file for complete search history.

(56) References Cited

U.S. PATENT DOCUMENTS

| | | | |
|---|---|---|---|
| 9,431,400 B2 | 8/2016 | Takemura | |
| 2004/0195610 A1* | 10/2004 | Morikado | H01L 21/84 257/300 |
| 2005/0164454 A1 | 7/2005 | Leslie | |
| 2009/0072291 A1* | 3/2009 | Takaishi | H01L 27/0207 257/306 |
| 2013/0187279 A1 | 7/2013 | Surthi et al. | |
| 2013/0256828 A1* | 10/2013 | Lee | H01L 27/04 257/506 |
| 2014/0117492 A1* | 5/2014 | Kim | H01L 27/10855 257/508 |
| 2018/0350695 A1* | 12/2018 | Cheng | H01L 29/401 |

FOREIGN PATENT DOCUMENTS

JP 2012-182446 9/2012
WO WO 12/2019
PCT/US2019/048621

* cited by examiner

*Primary Examiner* — Mark W Tornow
(74) *Attorney, Agent, or Firm* — Wells St. John P.S.

(57) ABSTRACT

Some embodiments include an integrated assembly having active-region-pillars. Each of the active-region-pillars has contact regions. The contact regions include a pair of storage-element-contact-regions, and include a digit-line-contact-region between the storage-element-contact-regions. The active-region-pillars include silicon. Wordlines are along the active-region-pillars and extend along a first direction. Cobalt silicide is directly against the silicon of one or more of the contact regions. Metal-containing material is directly against the cobalt silicide. Digit-lines are electrically coupled with the digit-line-contact-regions and extend along a second direction which crosses the first direction. Storage-elements are electrically coupled with the storage-element-contact-regions. Some embodiments include methods of forming integrated assemblies.

25 Claims, 48 Drawing Sheets

INTEGRATED ASSEMBLIES WHICH INCLUDE METAL-CONTAINING INTERCONNECTS TO ACTIVE-REGION PILLARS, AND METHODS OF FORMING INTEGRATED ASSEMBLIES

TECHNICAL FIELD

Integrated assemblies which include metal-containing interconnects to active-region pillars, and methods of forming integrated assemblies.

BACKGROUND

Memory is one type of integrated circuitry, and is used in computer systems for storing data. An example memory is DRAM (dynamic random-access memory). DRAM cells may each comprise a transistor in combination with a capacitor. The DRAM cells may be arranged in an array; with wordlines extending along rows of the array, and digit lines extending along columns of the array. The wordlines may be coupled with the transistors of the memory cells. Each memory cell may be uniquely addressed through a combination of one of the wordlines with one of the digit lines.

It is desirable to develop new methods for fabricating highly-integrated DRAM, and to develop new architectures fabricated with such methods.

BRIEF DESCRIPTION OF THE DRAWINGS

FIG. 1 is a diagrammatic top-down view; FIG. 1C is a diagrammatic cross-sectional top-down view.

FIG. 2 is a diagrammatic top view; FIG. 2B is a diagrammatic cross-sectional side view along the lines B-B of FIGS. 2 and 2A.

FIG. 3 is a diagrammatic top view; FIG. 3B is a diagrammatic cross-sectional side view along the lines B-B of FIGS. 3 and 3A.

FIG. 4 is a diagrammatic top view; FIG. 4B is a diagrammatic cross-sectional side view along the lines B-B of FIGS. 4 and 4A.

FIG. 5 is a diagrammatic top view; FIG. 5B is a diagrammatic cross-sectional side view along the lines B-B of FIGS. 5 and 5A.

FIG. 6 is a diagrammatic top view; FIG. 6B is a diagrammatic cross-sectional side view along the lines B-B of FIGS. 6 and 6A.

FIG. 7 is a diagrammatic top view; FIG. 7B is a diagrammatic cross-sectional side view along the lines B-B of FIGS. 7 and 7A.

FIG. 8 is a diagrammatic top view; FIG. 8B is a diagrammatic cross-sectional side view along the lines B-B of FIGS. 8 and 8A.

FIG. 9 is a diagrammatic top view; FIG. 9B is a diagrammatic cross-sectional side view along the lines B-B of FIGS. 9 and 9A.

FIG. 10 is a diagrammatic top view; FIG. 10B is a diagrammatic cross-sectional side view along the lines B-B of FIGS. 10 and 10A.

FIG. 11 is a diagrammatic top view; FIG. 11B is a diagrammatic cross-sectional side view along the lines B-B of FIGS. 11 and 11A.

FIG. 12 is a diagrammatic top view; FIG. 12B is a diagrammatic cross-sectional side view along the lines B-B of FIGS. 12 and 12A.

FIG. 13 is a diagrammatic top view; FIG. 13B is a diagrammatic cross-sectional side view along the lines B-B of FIGS. 13 and 13A.

FIG. 14 is a diagrammatic top view; FIG. 14B is a diagrammatic cross-sectional side view along the lines B-B of FIGS. 14 and 14A.

DETAILED DESCRIPTION OF THE ILLUSTRATED EMBODIMENTS

Some embodiments include methods of forming connections to digit-line-contact-regions and/or methods of forming connections to storage-element-contact-regions. The connections may include interconnects having metal over metal silicide; and in some embodiments the interconnects may include ruthenium over cobalt silicide. The interconnects may directly contact monocrystalline silicon of the digit-line-contact-regions and/or of the storage-element-contact-regions. Some embodiments include integrated assemblies having conductive interconnects which include metal-containing material (e.g., one or more of copper, molybdenum, palladium, platinum, ruthenium, tungsten, titanium, etc.) over cobalt silicide. Example embodiments are described below with reference to FIGS. 1-19.

Figure 1:
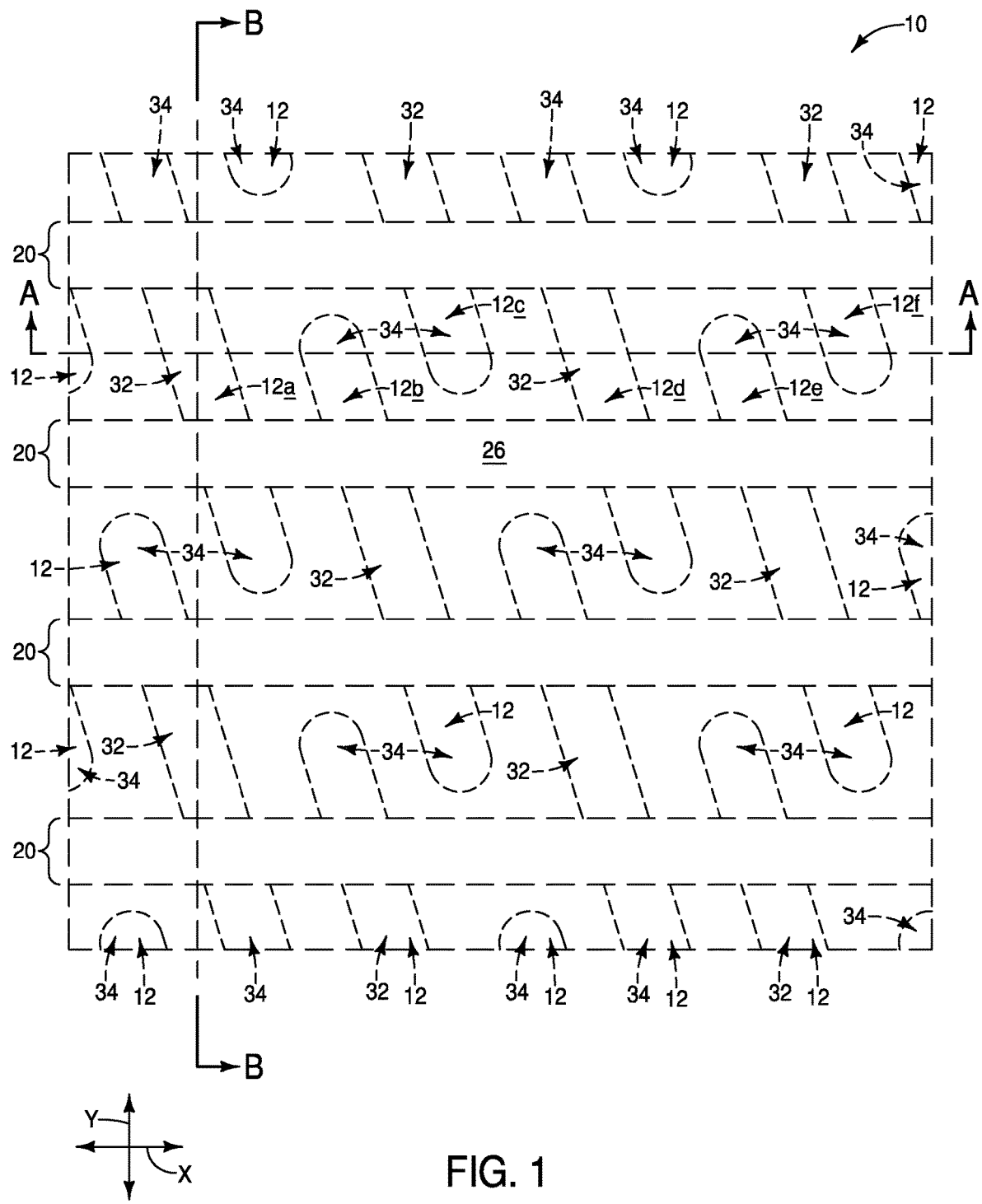
FIGS. 1-1C are diagrammatic views of a region of an example construction at an example initial process stage of an example method of forming an example integrated assembly.
Figure 1A:
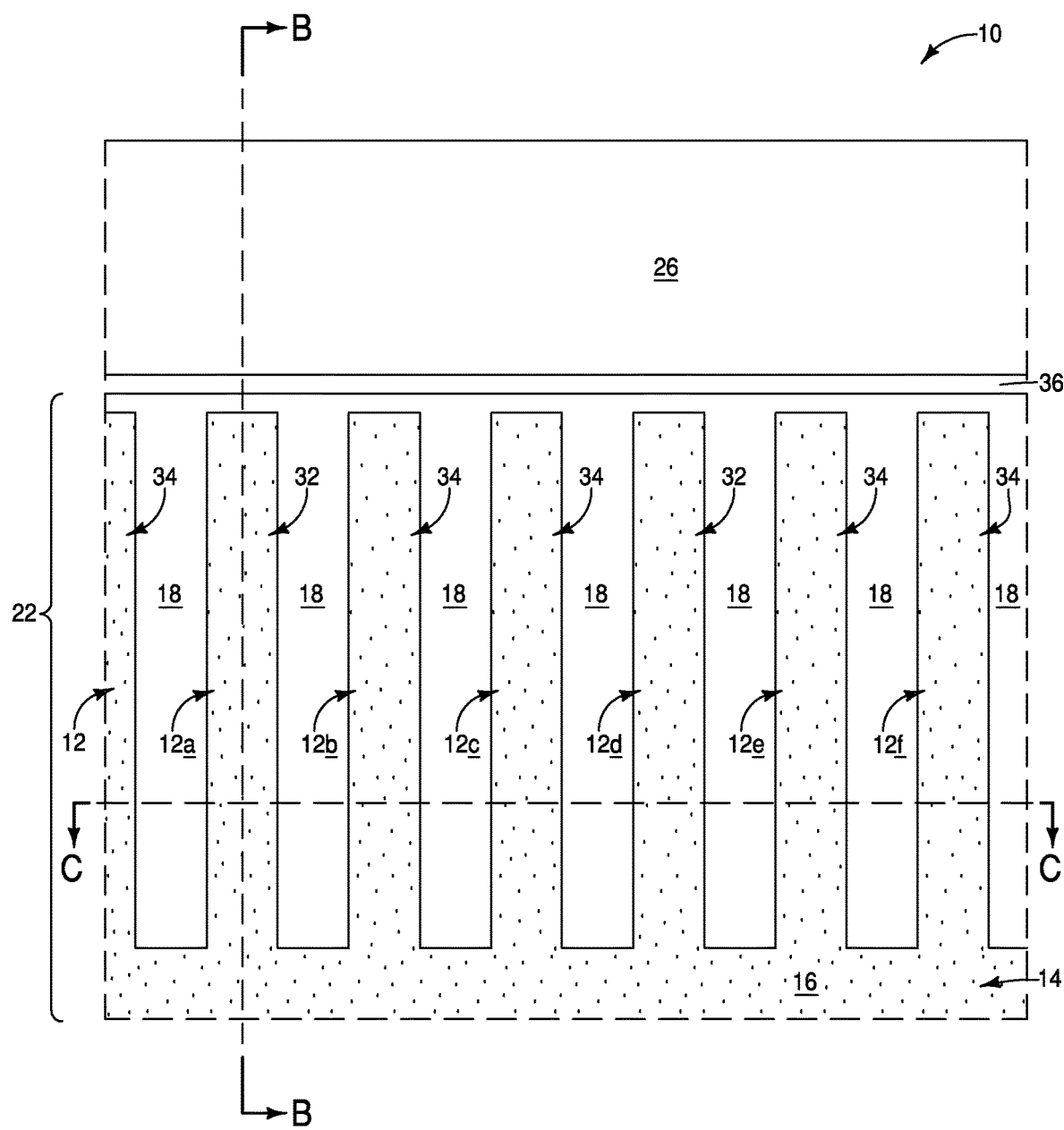
FIGS. 1A and 1B are diagrammatic cross-sectional side views. The view of FIG. 1A is along the lines A-A of FIGS. 1, 1B and 1C. The view of FIG. 1B is along the lines B-B of FIGS. 1, 1A and 1C. The view of FIG. 1C is along the lines C-C of FIGS. 1A and 1B.
Figure 1B:
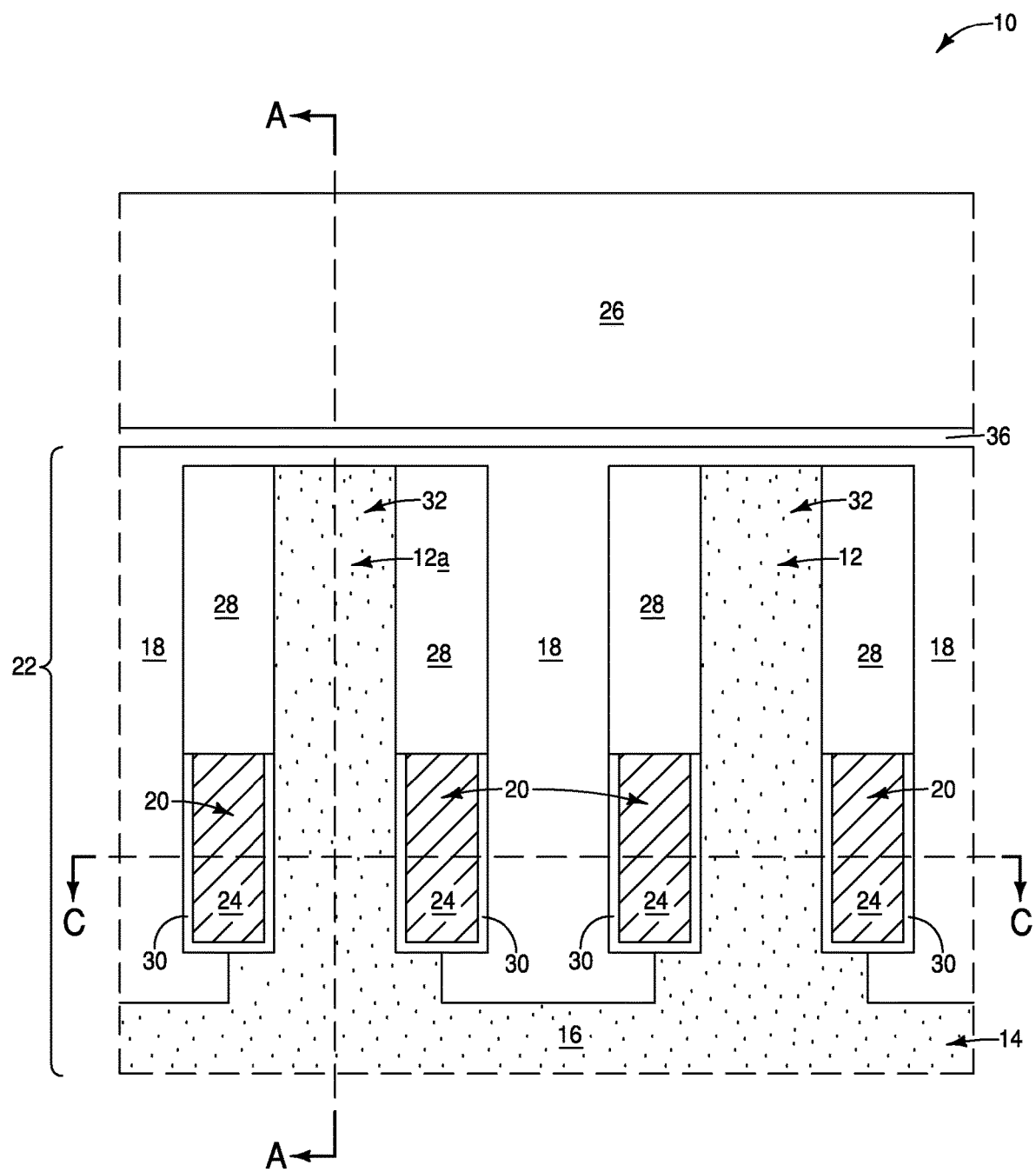
Figure 1C:
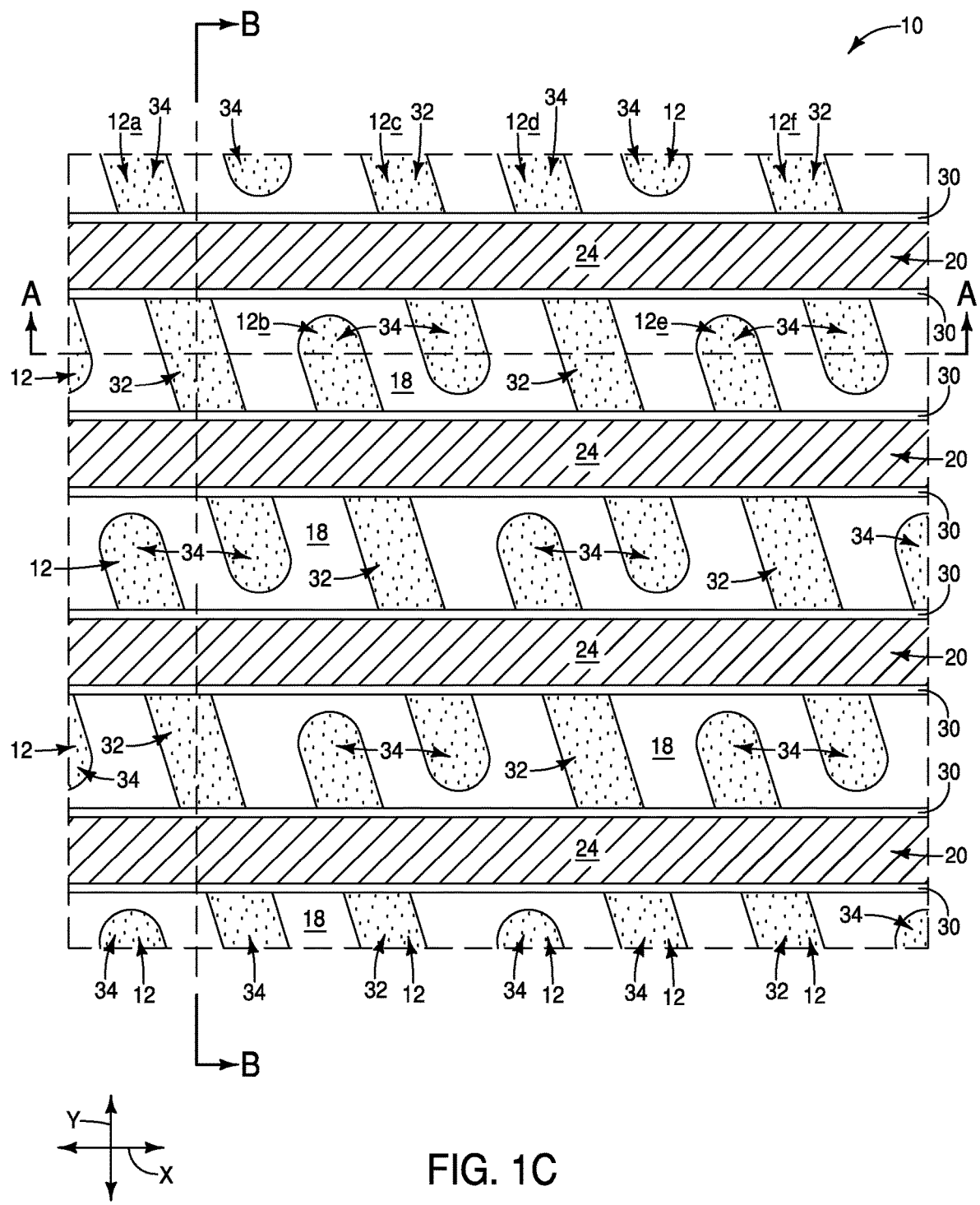

Referring to FIGS. 1-1C, a portion of an example integrated assembly 10 is illustrated. Such assembly may be formed with any suitable methodology. The assembly 10 includes a plurality of active regions 12 (also referred to herein as active-region-pillars) extending upwardly from a semiconductor base 14. Some of the active regions 12 are labeled as 12a-f so that they may be distinguished relative to one another, and relative to others of the active regions. All of the active regions 12 may be substantially identical to one another; with the term "substantially identical" meaning identical to within reasonable tolerances of fabrication and measurement. The active regions 12 are illustrated with dashed lines (phantom view) in FIG. 1 in order to indicate that they are under other materials.

The active regions 12 and semiconductor base 14 comprise semiconductor material 16. Such semiconductor material may comprise any suitable composition(s); and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). In some embodiments, the semiconductor material 16 may comprise, consist essentially of, or consist of appropriately-doped silicon. The silicon may be in any suitable form; and in some embodiments may be monocrystalline silicon. In some embodiments, the semiconductor material 16 of the active regions may be referred to as active-region-material.

The base 14 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above.

The active regions 12 are spaced from one another by intervening regions comprising insulative materials 18 and 28. The insulative material 18 may comprise any suitable composition or combination of compositions; and in some embodiments may comprise, consist essentially of, or consist of silicon dioxide. The insulative material 28 may comprise any suitable composition(s); and in some embodiments may comprise, consist essentially of, or consist of silicon dioxide and/or silicon nitride. The insulative 28 may be the same composition as the insulative material 18, or may be a different composition relative to the insulative material 18.

Wordlines (i.e., access lines) 20 extend along a first direction (represented by an x-axis, which is shown in FIGS. 1 and 1C). The first direction may correspond to a row direction of a memory array. The wordlines 20 are illustrated with dashed lines (phantom view) in FIG. 1 in order to indicate that they are under other materials. Digit-lines (i.e., sense-lines, bitlines) will be formed with processing described herein, and such digit lines will extend along a second direction (represented by a y-axis) which may correspond to a column direction of the memory array. The wordlines are adjacent to the active-region-pillars 12. The second direction (i.e., the column direction) may be orthogonal to the first direction (i.e., the row direction), or may simply cross the first direction.

The wordlines 20 comprise conductive material 24. The conductive material 24 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

The insulative material 28 is over the wordlines 20.

Gate dielectric material 30 extends around lower regions of the wordlines 20, and is between the wordlines and the active regions 12. The gate dielectric material 30 may comprise any suitable composition(s); and in some embodiments may comprise, consist essentially of, or consist of silicon dioxide.

The wordlines 20 comprise transistor gates along the active regions 12. Each of the active regions (i.e., active-region-pillars) 12 may be considered to comprise a digit-line-contact-region 32 between a pair of storage-element-contact-regions 34 (as shown in FIGS. 1A and 1C). In some embodiments, the regions 32 and 34 may be generically referred to as contact regions.

The wordlines 20 comprise transistor gates which gatedly couple the storage-element-contact-regions 34 with the digit-line-contact-regions 32. The digit-line-contact-regions 32 and the storage-element-contact-regions 34 are indicated in FIG. 1C to assist the reader in understanding the relative locations of the wordlines 20 relative to the digit-line-contact-regions 32 and the storage-element-contact-regions 34. However, it is to be understood that the digit-line-contact-regions 32 and the storage-element-contact-regions 34 are actually higher up on the active regions than the section of FIG. 1C, as is indicated in FIGS. 1A and 1B.

The digit-line-contact-regions 32 are eventually coupled with digit lines, and the storage-element-contact-regions 34 are eventually coupled with storage-elements (e.g., capacitors) as described in more detail below.

In some embodiments, the materials 16, 18, 24, 28, and 30 may be considered to form a construction 22. An expanse of first material 26 is formed to extend across the construction 22. In some embodiments, the first material 26 may comprise, consist essentially of, or consist of silicon nitride.

In the shown embodiment, the first material is over an insulative material 36, with in turn is over the construction 22. The insulative material 36 may comprise any suitable composition(s); including, for example, one or more of silicon dioxide, aluminum oxide, hafnium oxide, zirconium oxide, etc.

Figure 2:
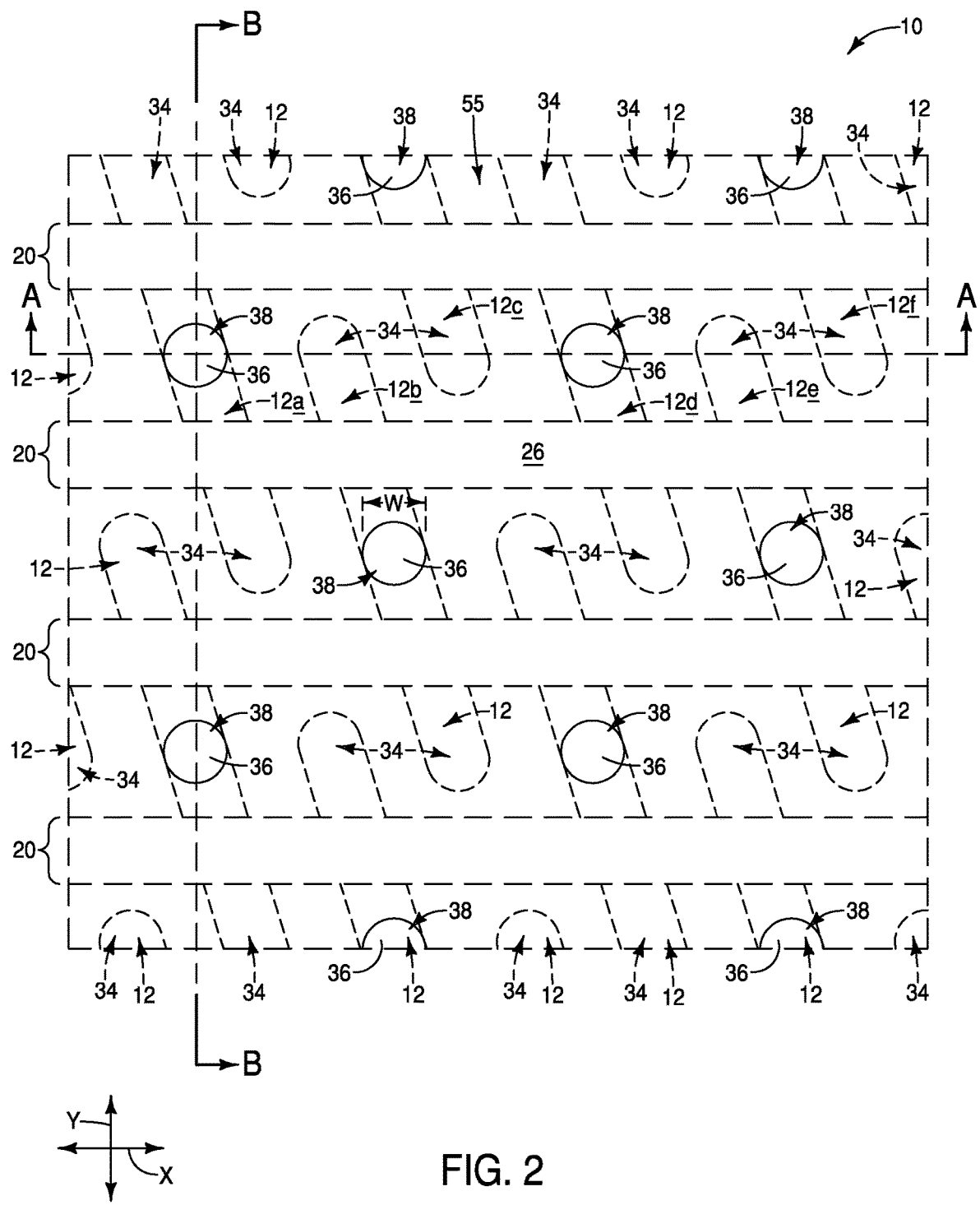
FIGS. 2-2B are diagrammatic views of the region of the example construction of FIGS. 1-1C at an example processing stage subsequent to that of FIGS. 1-1C.
Figure 2A:
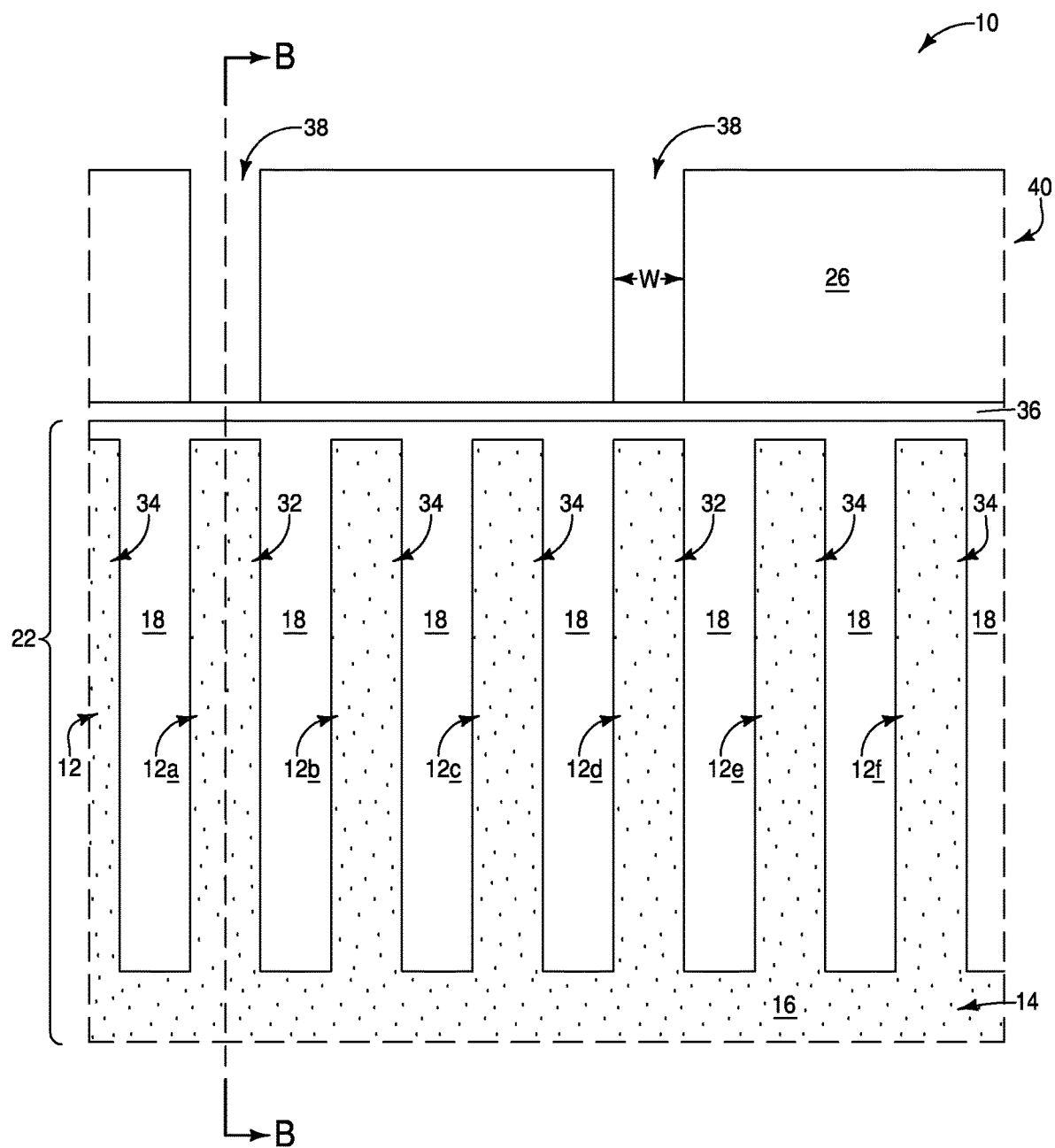
FIG. 2A is a diagrammatic cross-sectional side view along the lines A-A of FIGS. 2 and 2B.
Figure 2B:
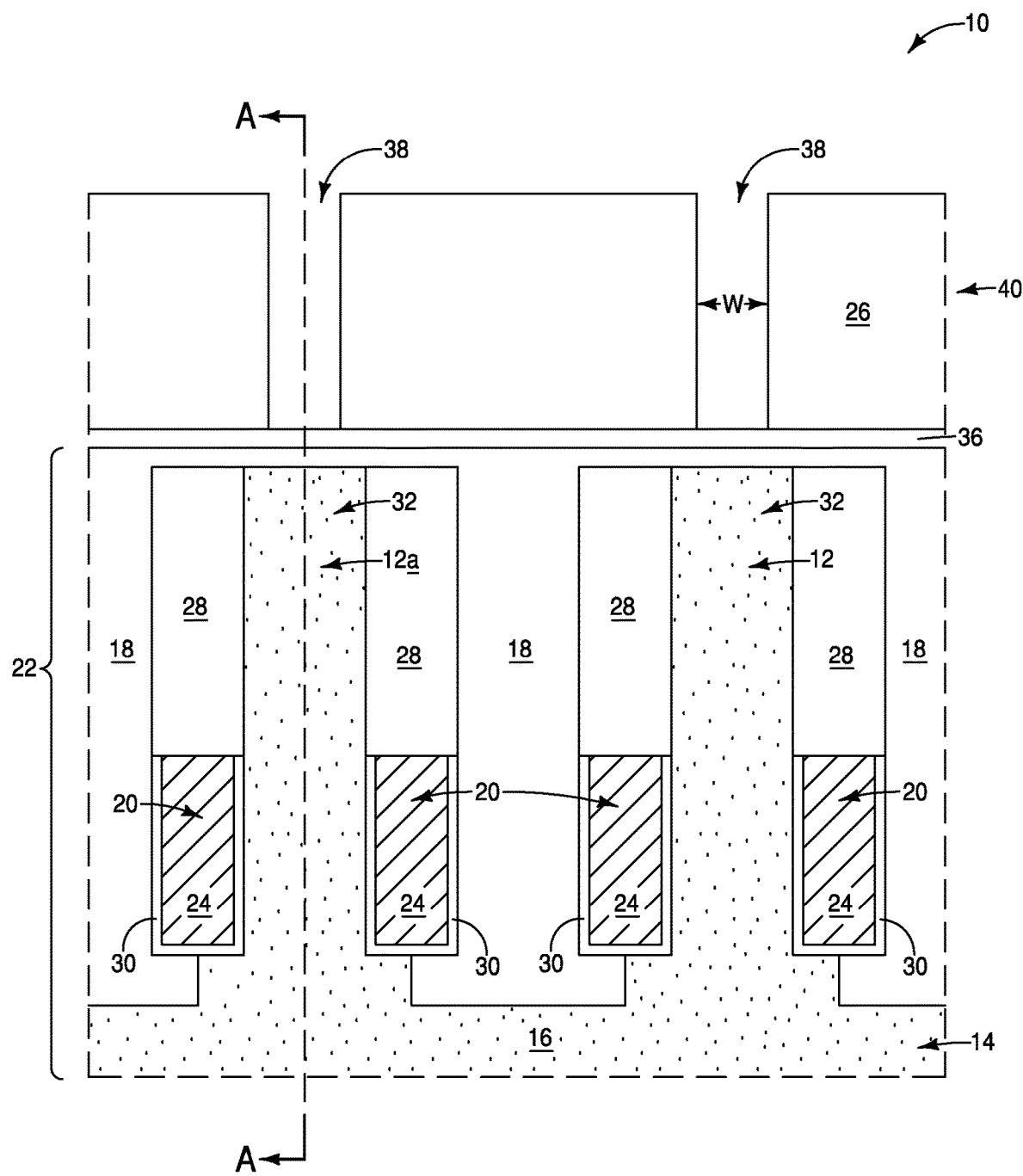

Referring to FIGS. 2-2B, openings 38 are formed to extend into the material 26. The openings 38 may be patterned utilizing a mask (not shown) and any suitable etches. For example, if the material 26 comprises silicon nitride, the etch may utilize phosphoric acid.

The patterned material 26 may be referred to as a patterned mold 40; with such patterned mold having the openings 38 extending therethrough.

Although the openings 38 are shown to be circular in top-down view, it is to be understood that the openings may have other shapes in other embodiments. For instance, in some example embodiments the openings may be elliptical, square, rectangular, polygonal, etc., in top-down view. The openings 38 may have any suitable dimensions, and in some embodiments may have a width W (e.g., a diameter of the illustrated circular openings) within a range of from at least about 2 nanometers (nm); to less than or equal to about 15 nm; and in some embodiments such width may be less than or equal to about 10 nm.

Figure 3:
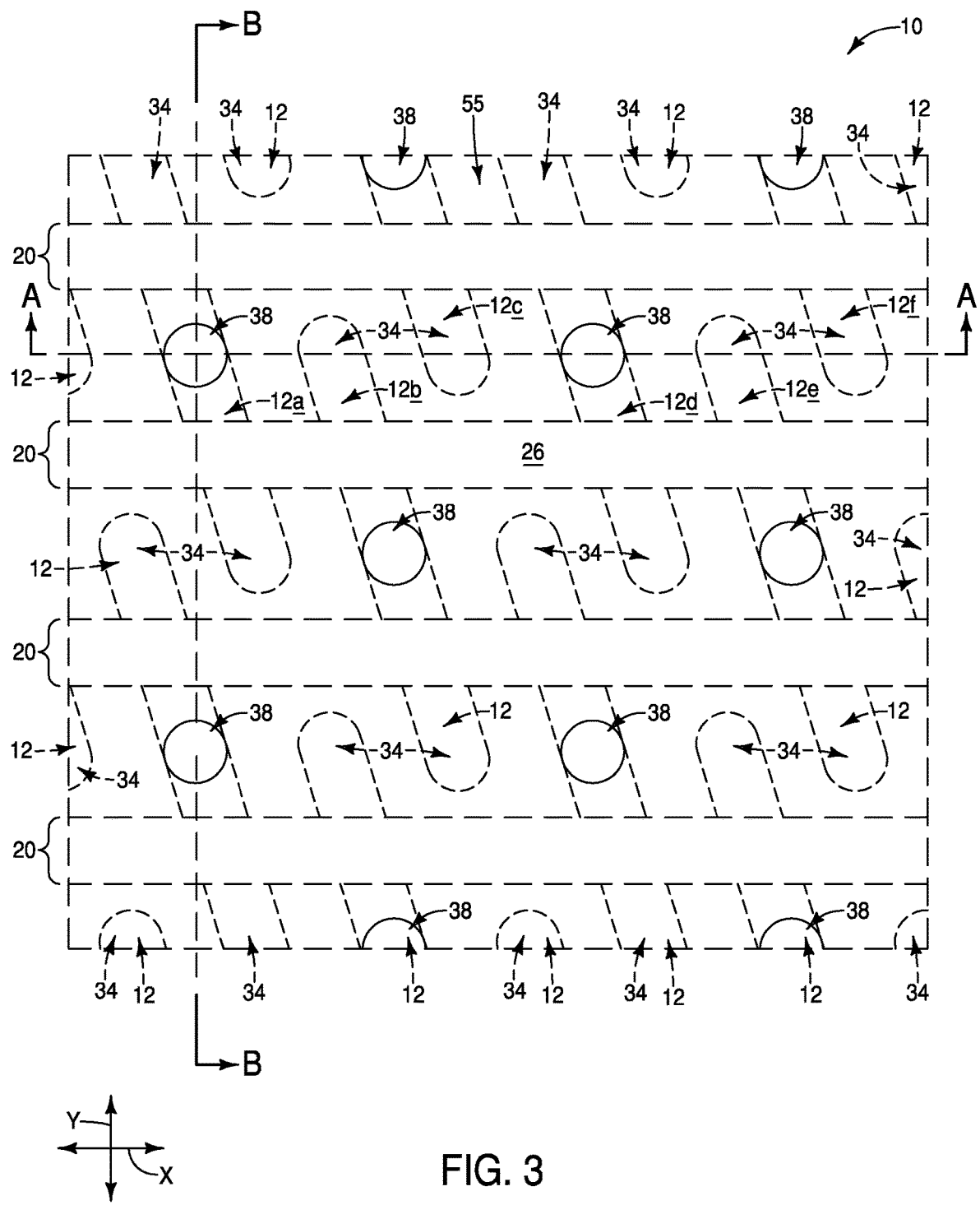
FIGS. 3-3B are diagrammatic views of the region of the example construction of FIGS. 1-1C at an example processing stage subsequent to that of FIGS. 2-2B.
Figure 3A:
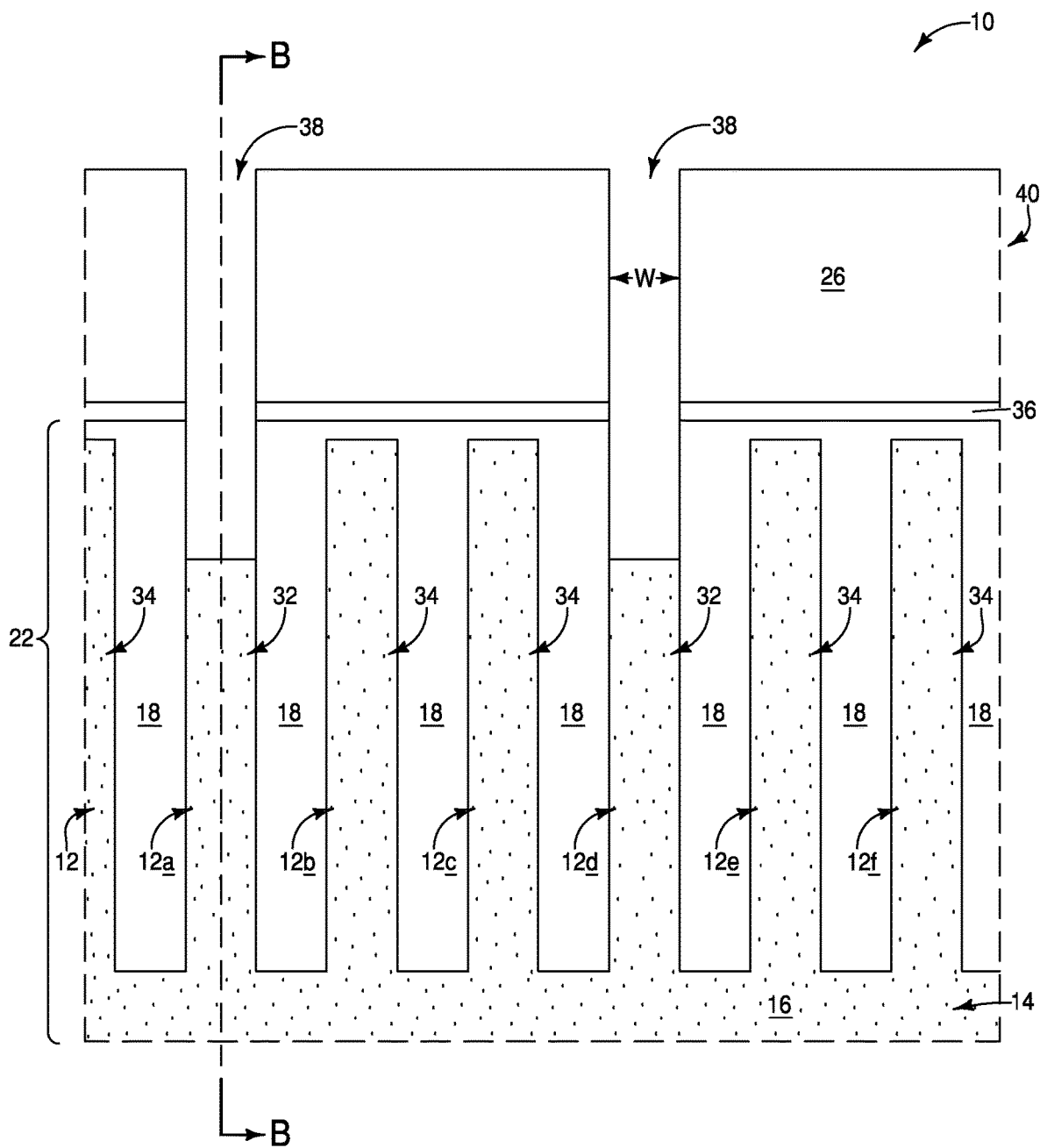
FIG. 3A is a diagrammatic cross-sectional side view along the lines A-A of FIGS. 3 and 3B.
Figure 3B:
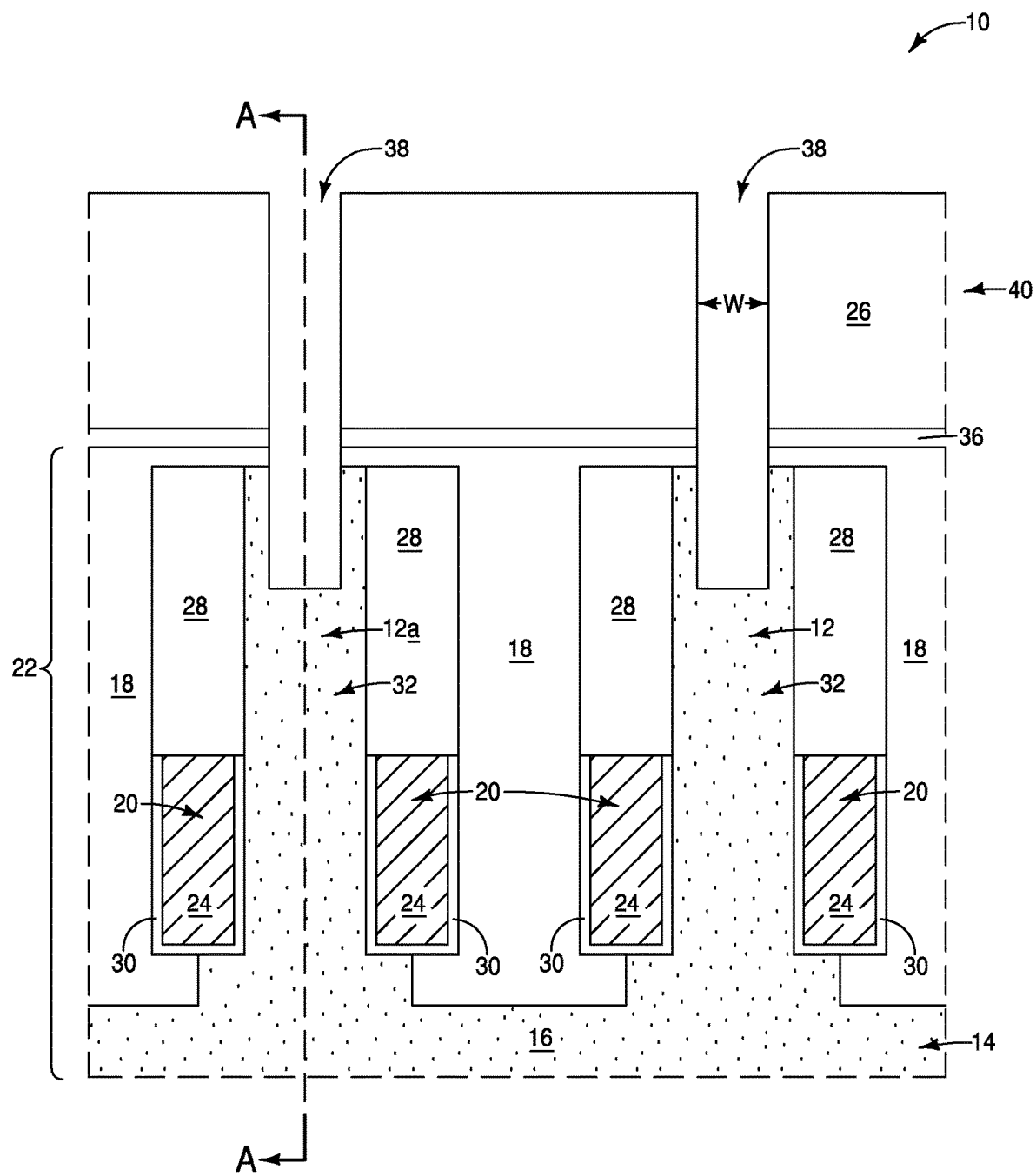

Referring to FIGS. 3-3B, openings 38 are extended through the material 36, and into the construction 22. The openings 38 are aligned with the digit-line-contact-regions 32, and in the shown embodiment extend into the semiconductor material 16 of the digit-line-contact-regions 32. The openings 38 may be extended into the semiconductor material 16 with any suitable etch(es). For instance, in some embodiments the semiconductor material 16 may comprise silicon (e.g., monocrystalline silicon), and the openings may be extended into the semiconductor material with an etch utilizing one or more of nitric acid, potassium hydroxide and tetramethylammonium hydroxide.

Figure 4:
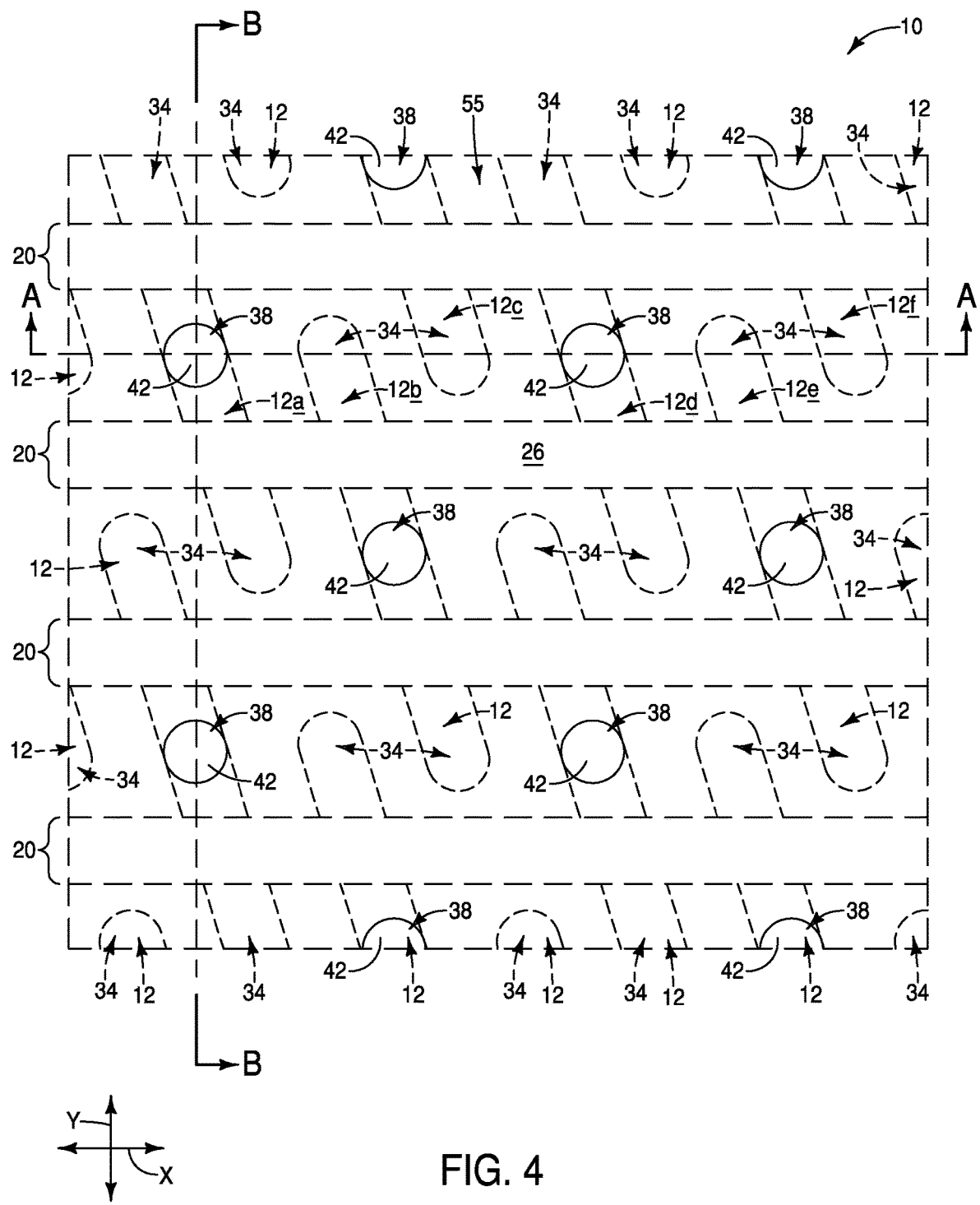
FIGS. 4-4B are diagrammatic views of the region of the example construction of FIGS. 1-1C at an example processing stage subsequent to that of FIGS. 3-3B.
Figure 4A:
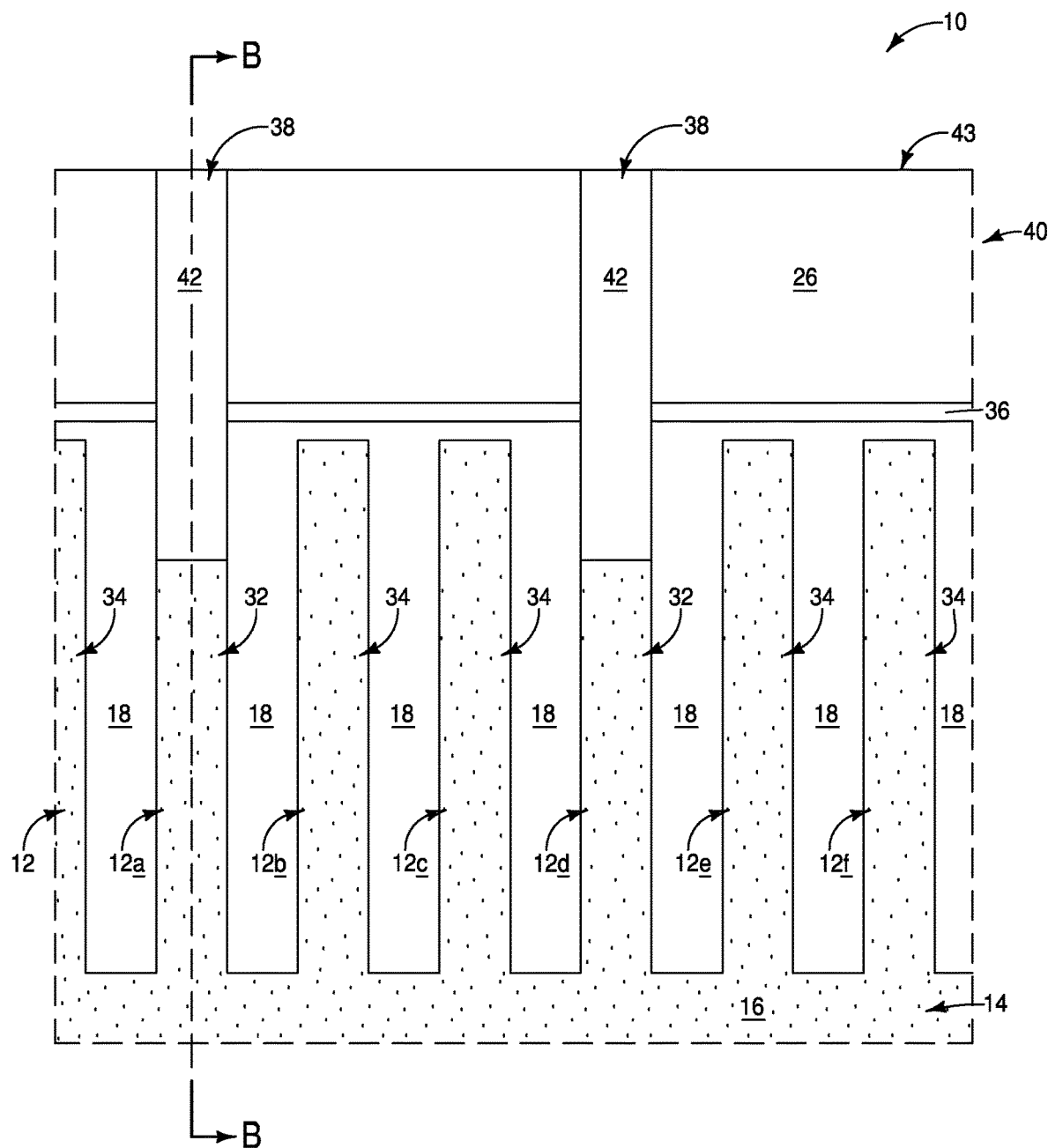
FIG. 4A is a diagrammatic cross-sectional side view along the lines A-A of FIGS. 4 and 4B.
Figure 4B:
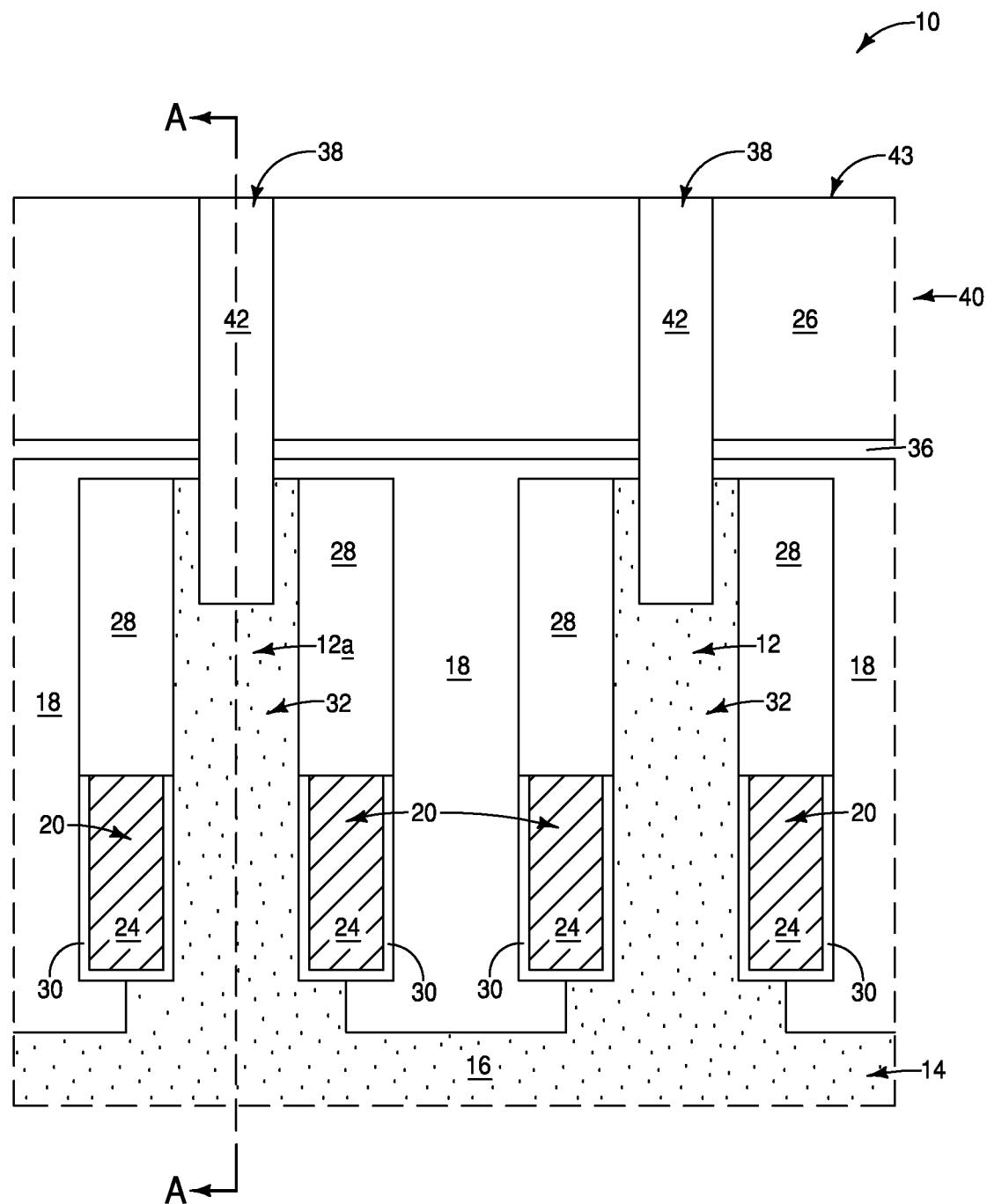

Referring to FIGS. 4-4B, sacrificial material 42 is formed within the openings 38 after such openings are extended into the semiconductor material 12. The sacrificial material 42 may comprise any suitable composition(s); and in some embodiments may comprise, consist essentially of, or consist of one or more carbon-containing-polymers. Such polymers may include carbon and hydrogen; and may also include one or more heteroatoms (e.g., nitrogen, oxygen, etc.). Example polymers may be compositions traditionally utilized as bottom antireflective compositions (BARC), compositions utilized as underlayer (UL), etc.

In some embodiments, the polymer 42 may be initially spread across a surface of the assembly 10 to fill the openings 38, and then the polymer may be cured with a suitable bake. The excess polymer may then be removed with any suitable processing. In the shown embodiment, the assembly 10 has a planarized upper surface 43 extending across the materials 42 and 26. Such planarized surface may be formed by utilizing chemical-mechanical polishing (CMP) to remove the excess polymer 42.

Figure 5:
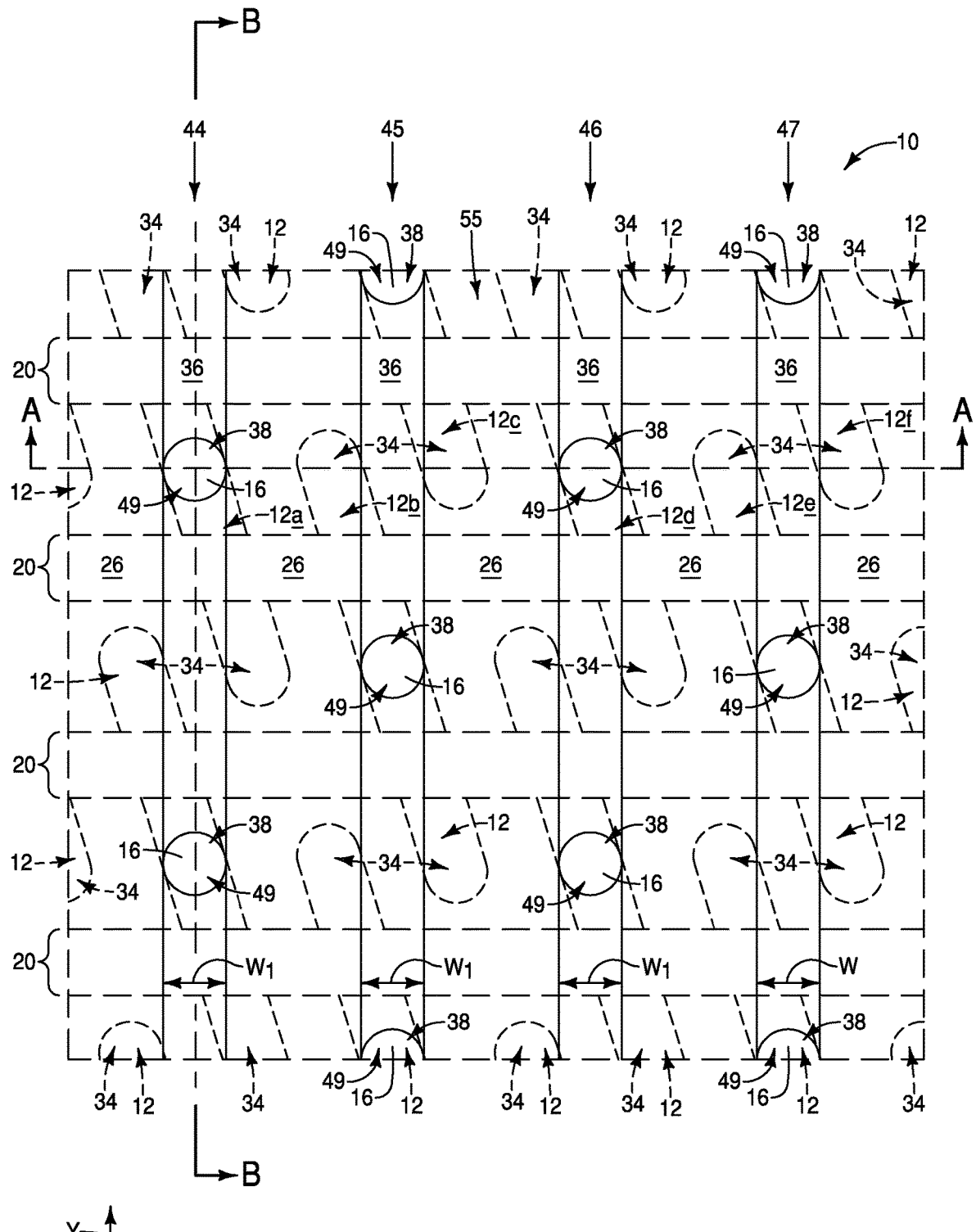
FIGS. 5-5B are diagrammatic views of the region of the example construction of FIGS. 1-1C at an example processing stage subsequent to that of FIGS. 4-4B.
Figure 5A:
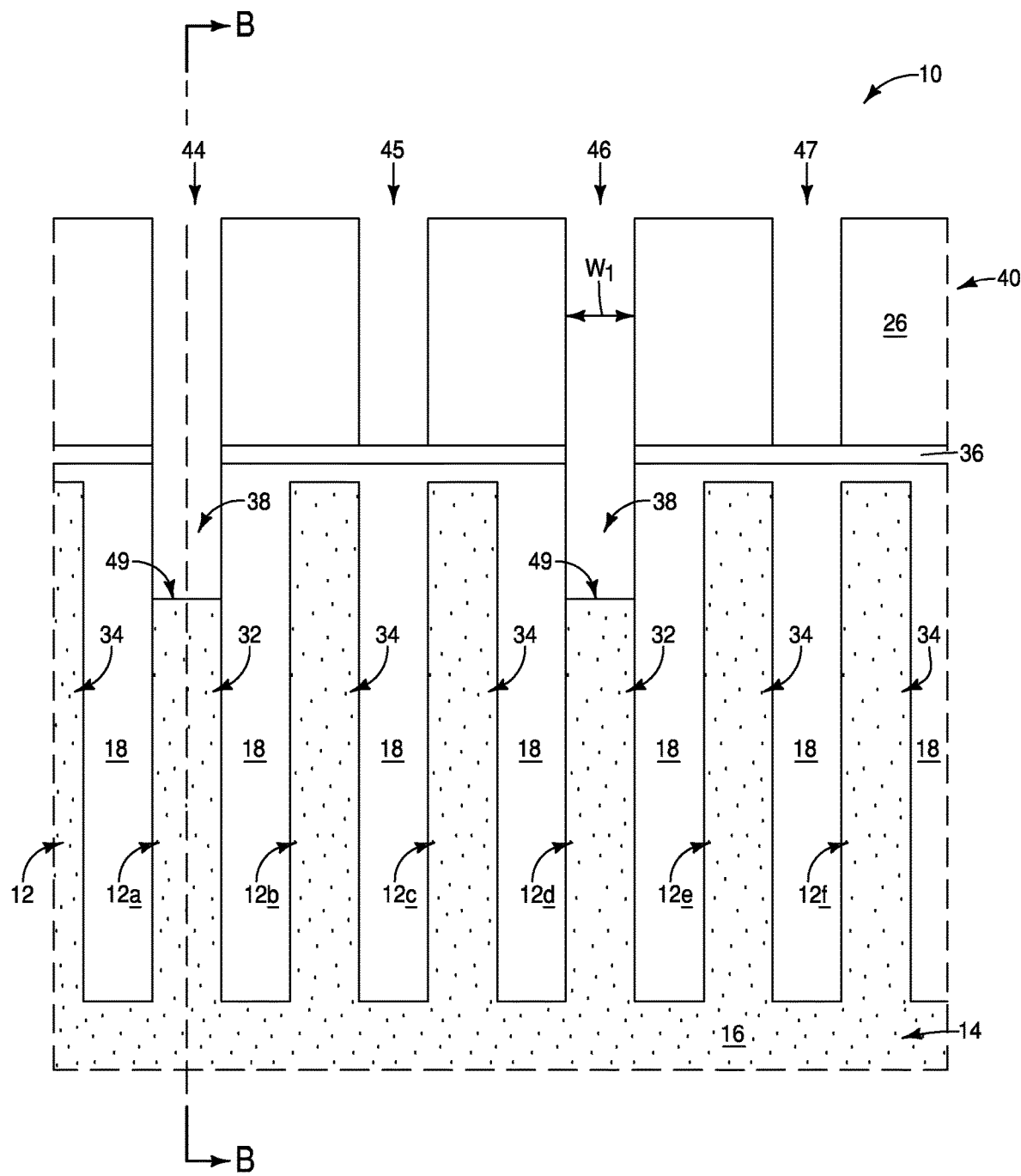
FIG. 5A is a diagrammatic cross-sectional side view along the lines A-A of FIGS. 5 and 5B.
Figure 5B:
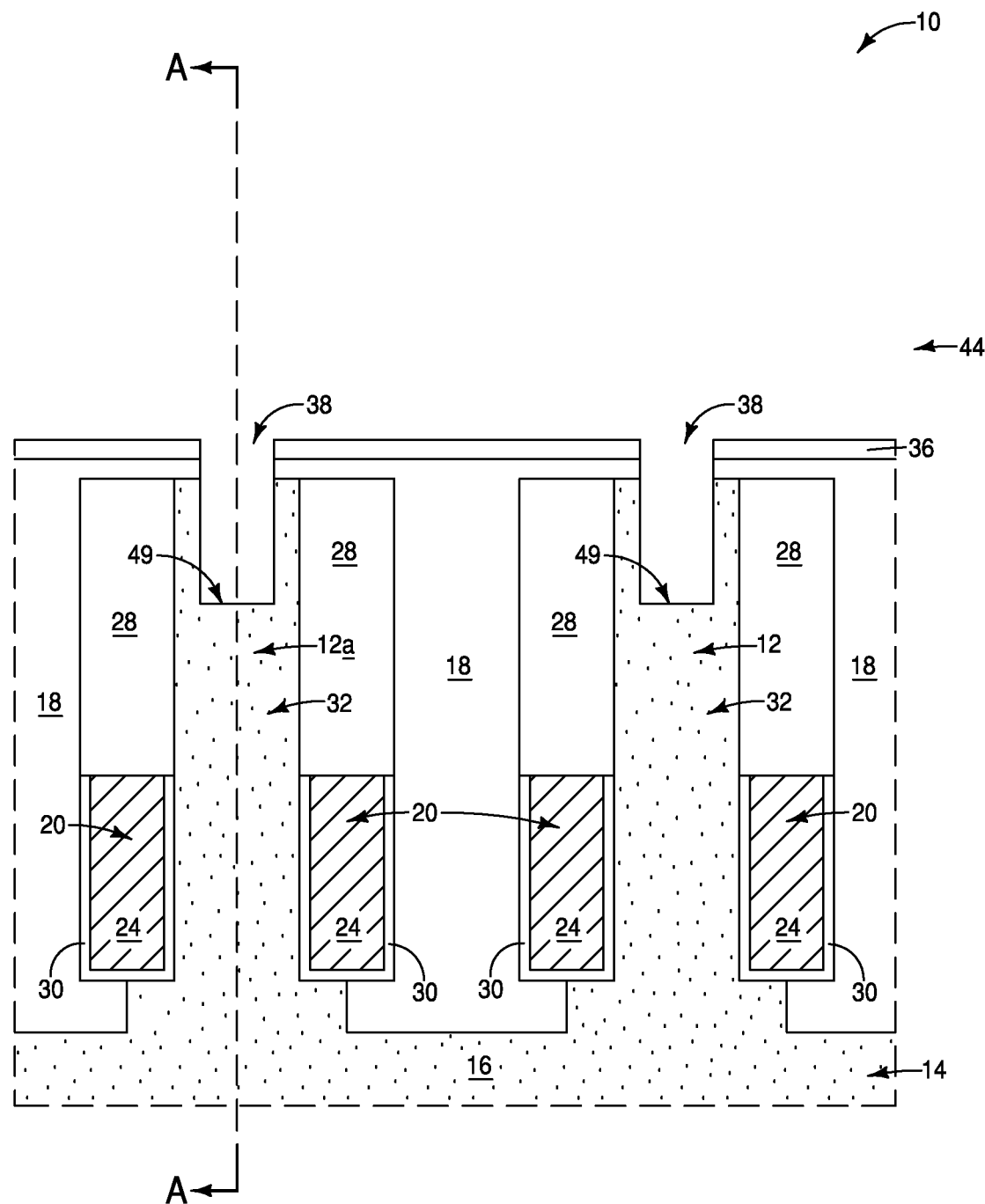

Referring to FIGS. 5-5B, trenches 44-47 are formed within the patterned mold 40. The trenches extend along the second direction represented by the y-axis. The trenches 44-47 have widths Wi, comparable to the width W of the openings 38 (described above with reference to FIGS. 2-2B).

The trenches 44-47 may be formed with any suitable processing; and in some embodiments may be formed with an etch selective for the material 26 relative to the material 36 (e.g., an etch selective for silicon nitride relative to silicon dioxide). For purposes of understanding this disclosure and the claims which follow, a material is to be understood as being "selectively removed" relative to another material if it is removed faster than the other material; which can include, but is not limited to, conditions which are 100% selective for one material relative to another.

Phosphoric acid may be used in example etches utilized to form the trenches 44-47. In the shown embodiment, the polymeric material 42 (FIGS. 4-4B) is removed during the formation of the trenches 44-47 to reopen the openings 38; with the reopened openings being at the bottoms of the trenches 44-47. In some embodiments, the trenches 44-47 are formed with an etch (e.g., an etch utilizing phosphoric acid) followed by a clean to remove organic residues, and the sacrificial material 42 comprises carbon-containing-polymer which is removed during such clean. An example clean may utilize ammonia and hydrogen peroxide.

The digit-line-contact-regions 32 have exposed surfaces 49 along the bottoms of the reopened openings 38.

Figure 6:
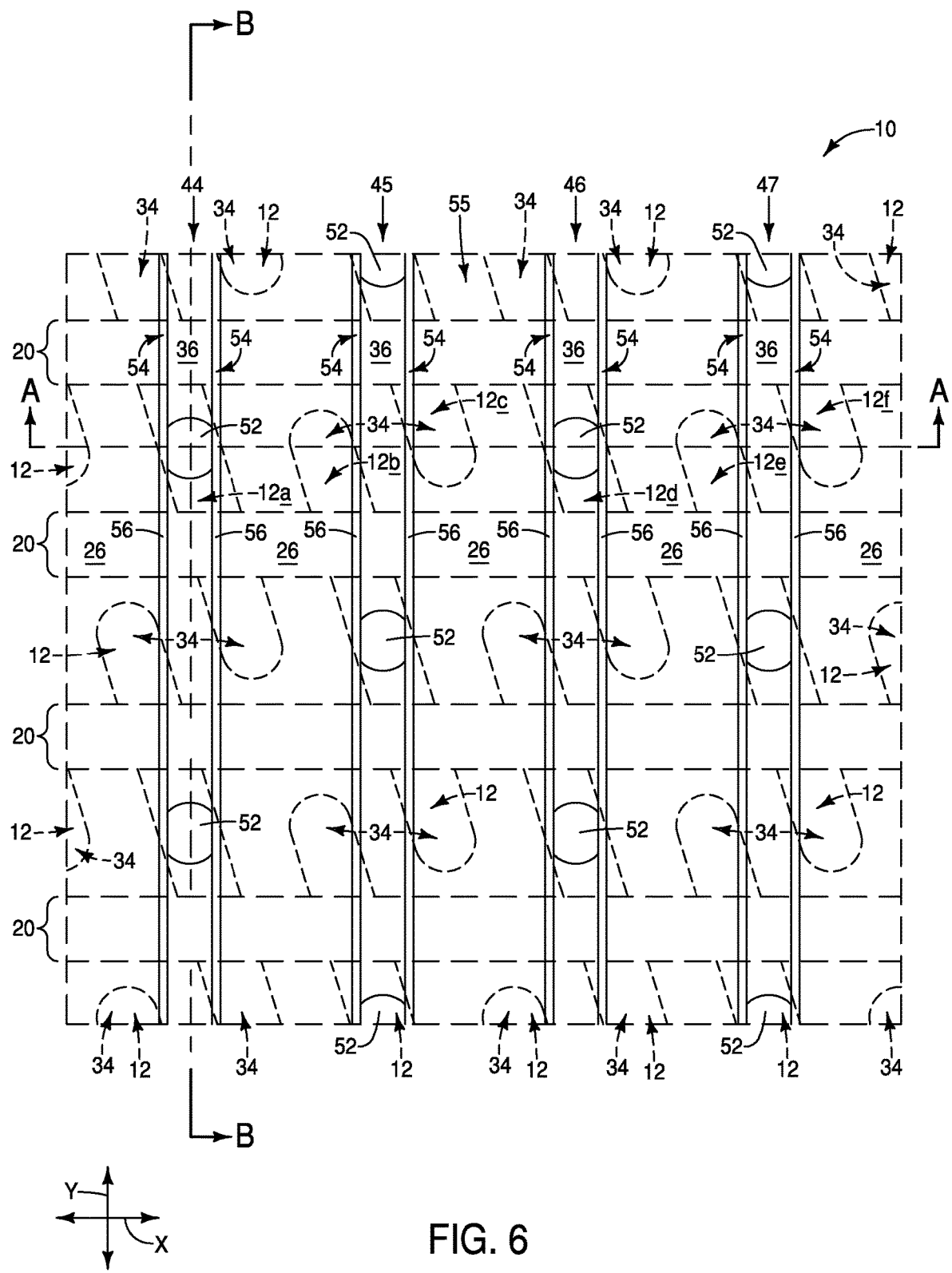
FIGS. 6-6B are diagrammatic views of the region of the example construction of FIGS. 1-1C at an example processing stage subsequent to that of FIGS. 5-5B.
Figure 6A:
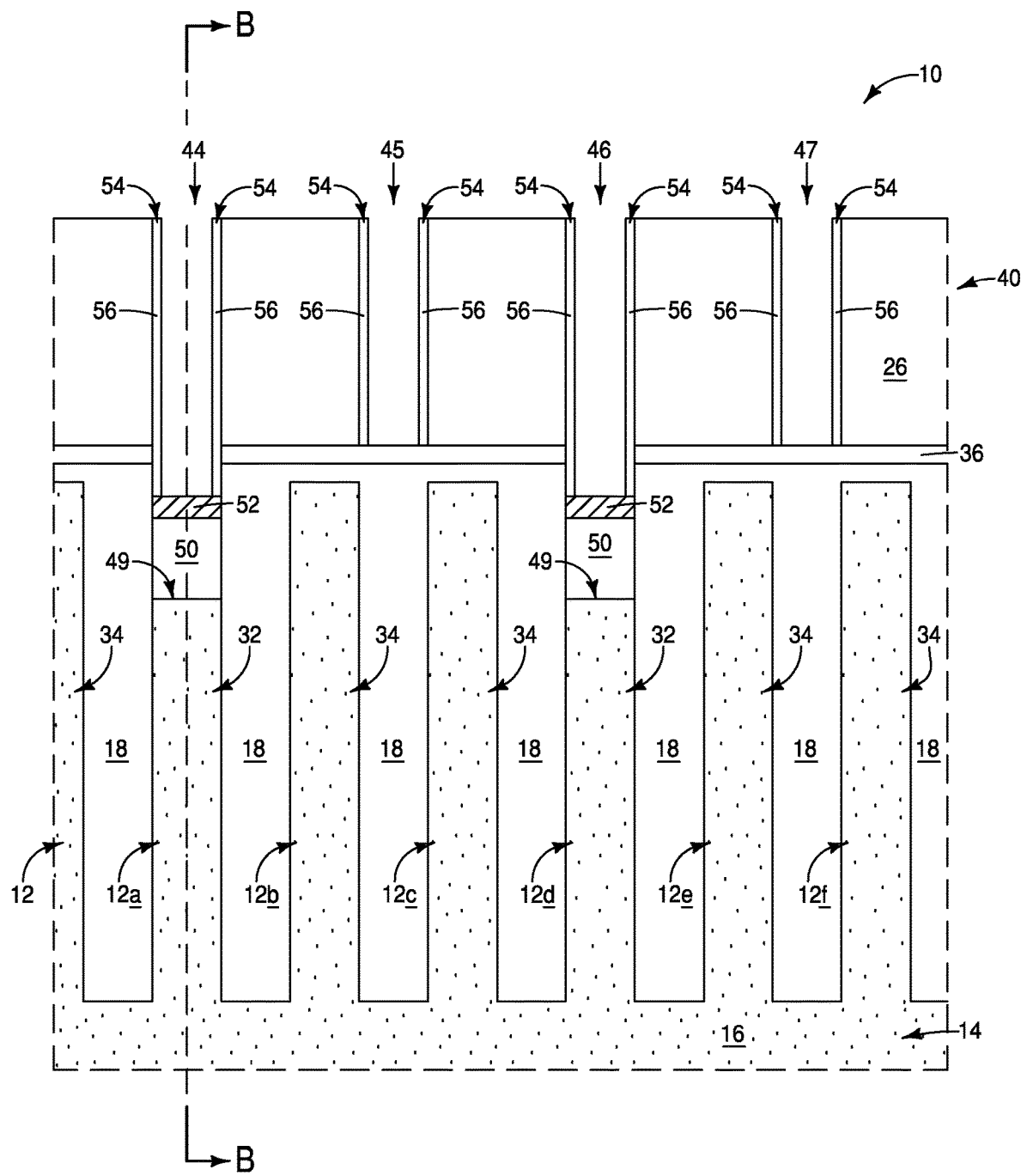
FIG. 6A is a diagrammatic cross-sectional side view along the lines A-A of FIGS. 6 and 6B.
Figure 6B:
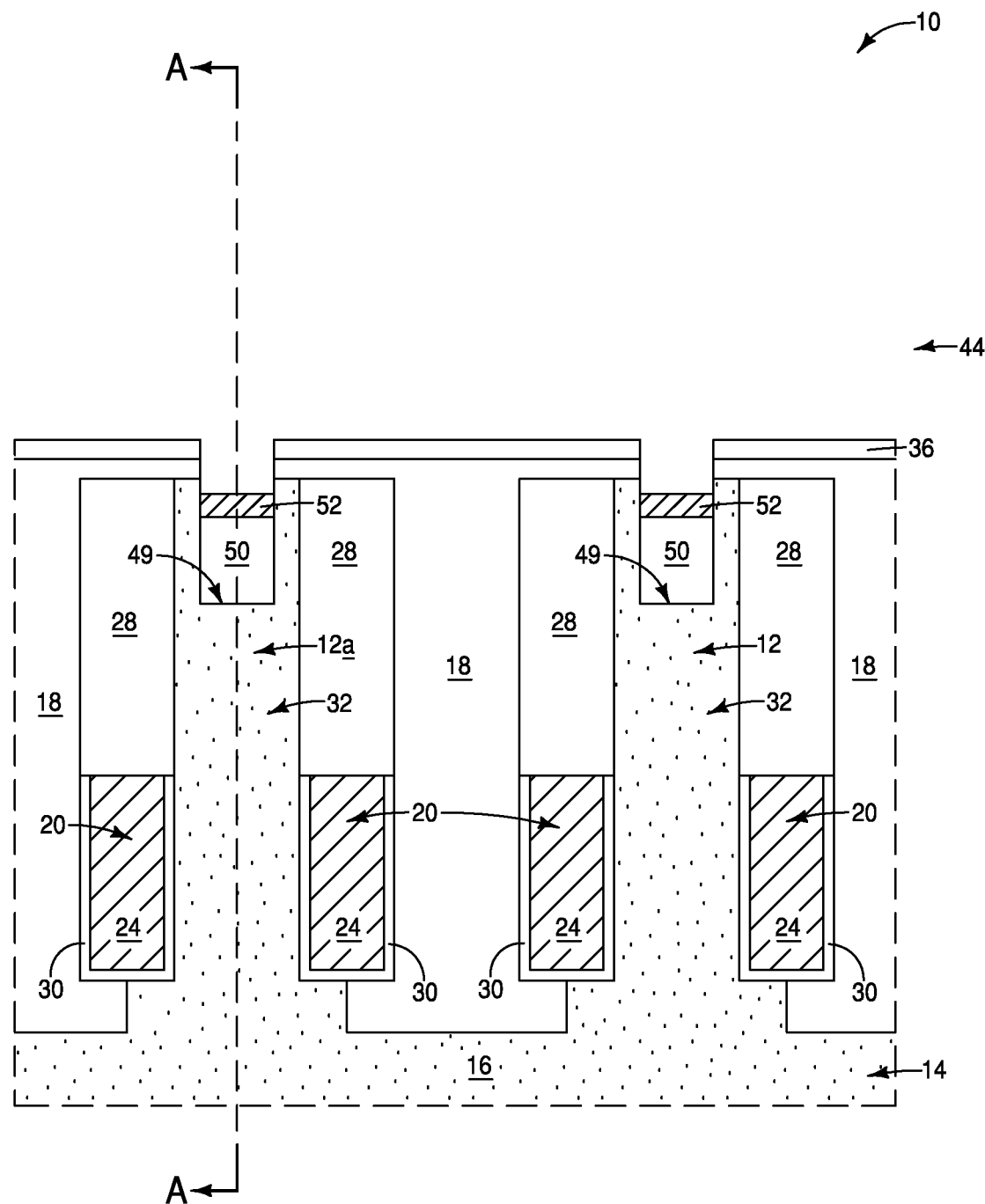

Referring to FIGS. 6-6B, silicon (or other suitable semiconductor material) 50 is epitaxially grown from the exposed surfaces 49 of the semiconductor material 16. The epitaxially-grown silicon may be formed to any suitable thickness. In the shown embodiment, the silicon 50 is grown to a thickness such that it remains below the material 26 of the patterned mold 40. In other embodiments, the silicon 50 may be grown thick enough to extend into the patterned mold 40. In some embodiments, the epitaxially-grown silicon 50 may be omitted. In some embodiments, the epitaxially-grown silicon 50 may be replaced with polycrystalline silicon which is deposited over the surfaces 49. However, in some applications it may be advantageous to utilize epitaxially-grown silicon 50 instead of polycrystalline silicon, in that the epitaxially-grown silicon may provide lower resistance and better uniformity than can be achieved with polycrystalline silicon, particularly in the tight confines of highly-integrated circuitry. The epitaxially-grown silicon 50 may be conductively-doped with one or more suitable dopants (e.g., phosphorus, boron, etc.).

Conductive metal-containing material 52 is formed over and directly against the epitaxially-grown silicon 50. In some embodiments, the metal-containing material 52 may comprise metal silicide. For instance, in some example embodiments the metal-containing material 52 may comprise, consist essentially of, or consist of cobalt silicide. In some embodiments, the metal-containing material 52 may be considered to be directly against silicon of the digit-line-contact-regions 32; regardless of whether the material 52 is directly against epitaxially-grown material 50, or directly against semiconductor material 16.

Spacers 54 are optionally formed adjacent sidewalls of the trenches 44-47. The spacers comprise insulative material 56, which may be referred to as insulative spacer material. The material 56 may comprise any suitable composition(s); and in some embodiments may comprise, consist essentially of, or consist of one or more of silicon dioxide, carbon-doped silicon dioxide (SiOC, where the formula indicates primary constituents rather than a specific stoichiometry), silicon oxynitride (SiON, where the formula indicates primary constituents rather than a specific stoichiometry), etc. The material 56 may be low-k (i.e., may have a dielectric constant less than that of silicon dioxide), in some applications. An advantage of low-k material may be that such may provide high selectivity during subsequent etches and cleans (e.g., during wet cleaning), particularly if dry etch plasma damage can be avoided. In some embodiments, the material 26 of the patterned mold 40 may be referred to as a first material having a first composition, and the material 56 of the spacers 54 may be referred to as a second material having a second composition different from the first composition.

The spacers 54 may be formed after the silicon 50 and metal silicide 52 (as shown); or alternatively may be formed prior to the silicon 50 and the metal silicide 52, in which case the spacers 54 may extend into the openings 38 (with the openings 38 being labeled in FIGS. 5-5B) and along sides of the materials 50 and 52.

The trenches 44-47 are narrowed by the spacers 54; and in some embodiments may have widths of less than or equal to about 10 nm at the processing stage of FIGS. 6-6B.

Figure 7:
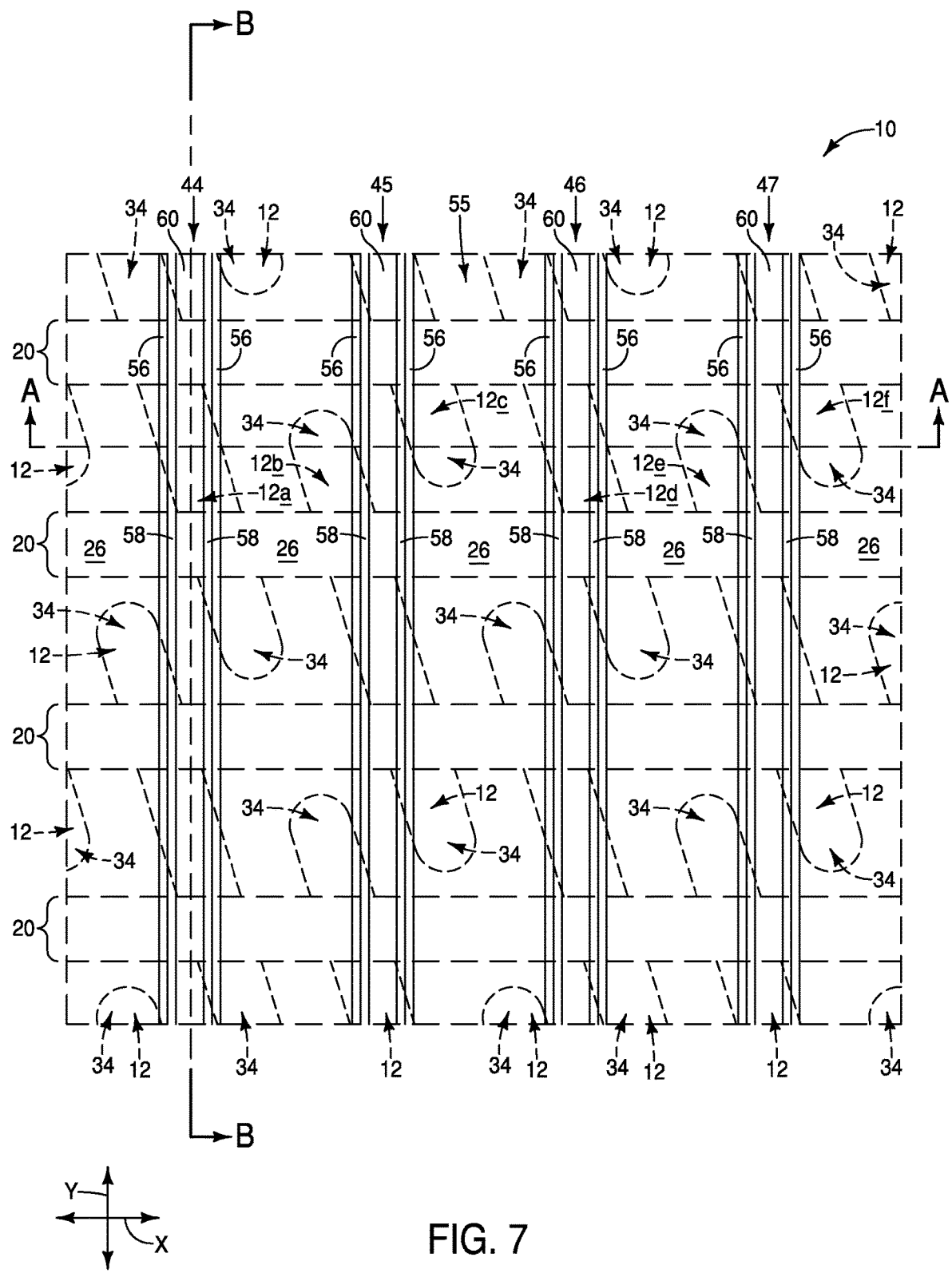
FIGS. 7-7B are diagrammatic views of the region of the example construction of FIGS. 1-1C at an example processing stage subsequent to that of FIGS. 6-6B.
Figure 7A:
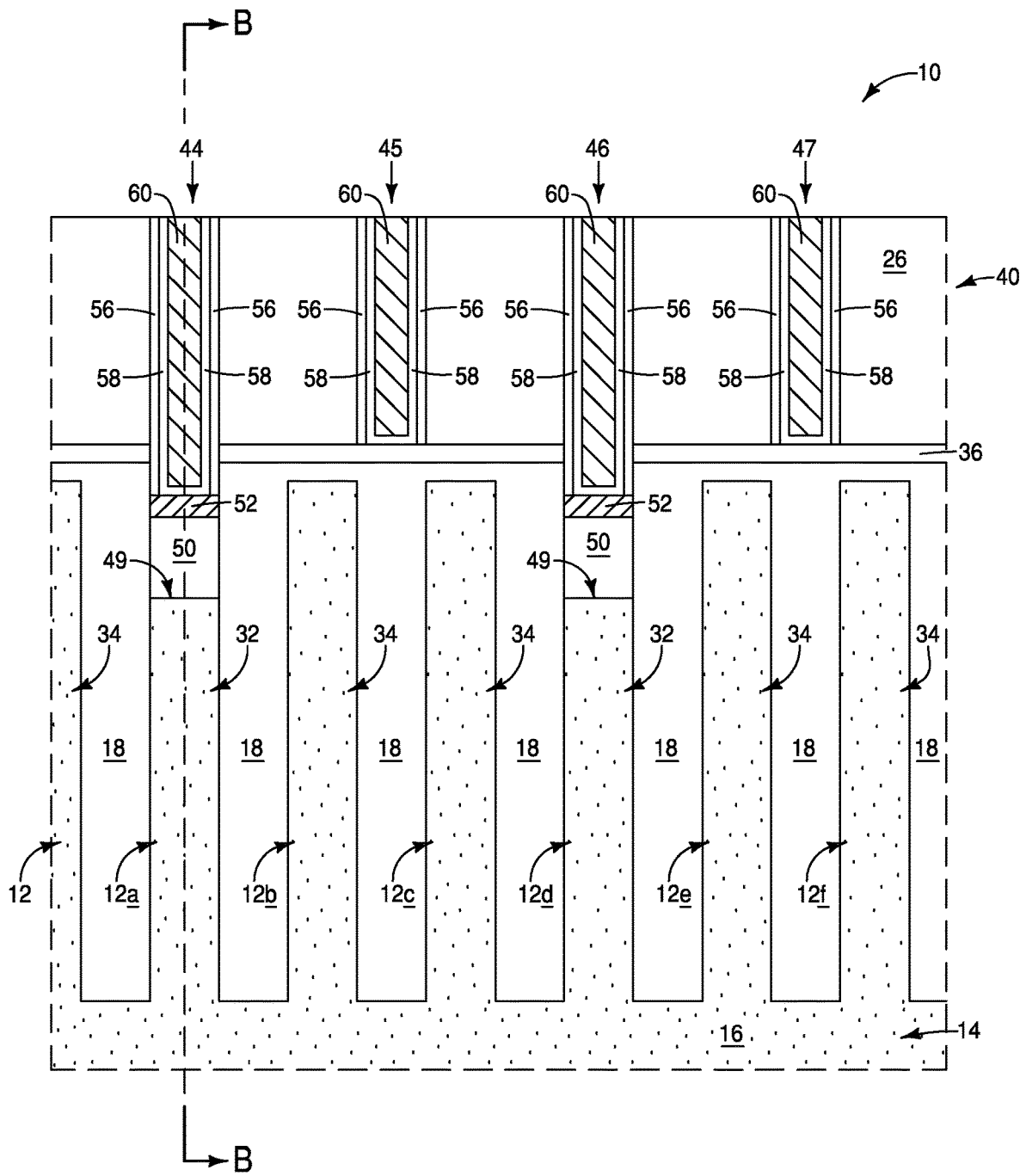
FIG. 7A is a diagrammatic cross-sectional side view along the lines A-A of FIGS. 7 and 7B.
Figure 7B:
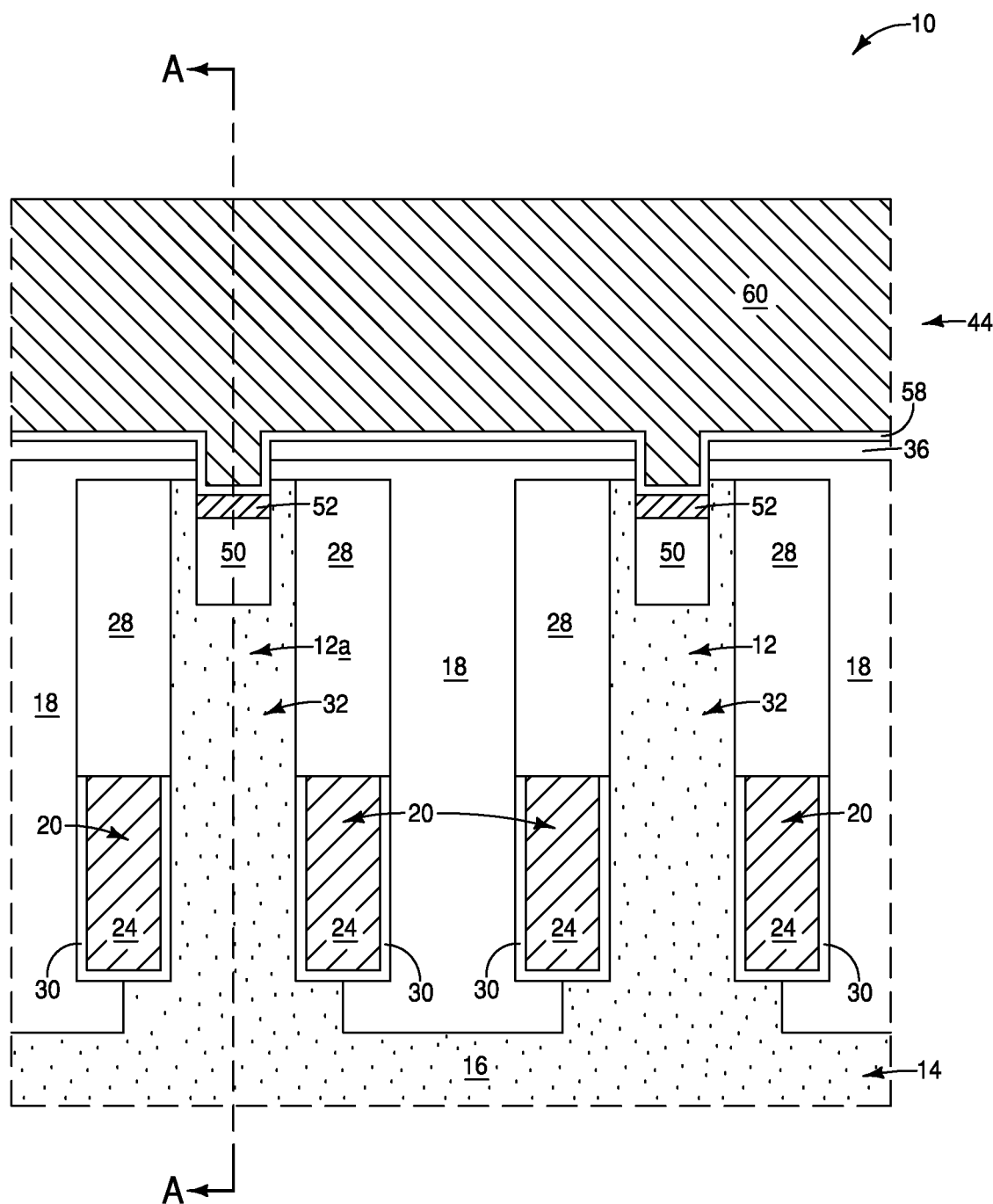

Referring to FIGS. 7-7B, optional barrier material 58 is provided within the trenches 45-47 to line the trenches. In the shown embodiment, the barrier material 58 extends along bottoms of the trenches and sides of the trenches, and is directly against an upper surface of the metal silicide 52. The barrier material 58 may comprise any suitable composition(s); and in some embodiments may comprise one or more of ruthenium, tantalum and titanium.

Digit-line-material 60 is provided within the trenches 44-47 and adjacent the optional barrier material 58. The digit-line-material 60 may comprise any suitable composition(s); and in some embodiments may comprise metal. For instance, in some embodiments the digit-line-material 60 may comprise, consist essentially of, or consist of one or more of copper, molybdenum, palladium, platinum, ruthenium, tungsten, titanium, and mixtures thereof. The barrier material 58 may be particularly useful in applications in which the digit line material comprises copper in order to preclude copper migration. In other embodiments, the barrier material 58 may be omitted, and metal of the digit-line-material 60 may directly contact the metal silicide 52. For instance, in some applications the digit-line-material 60 may comprise, consist essentially, or consist of ruthenium; and such ruthenium may directly contact an upper surface of the metal silicide 52 (e.g., may directly contact an upper surface of a cobalt silicide 52).

Figure 8:
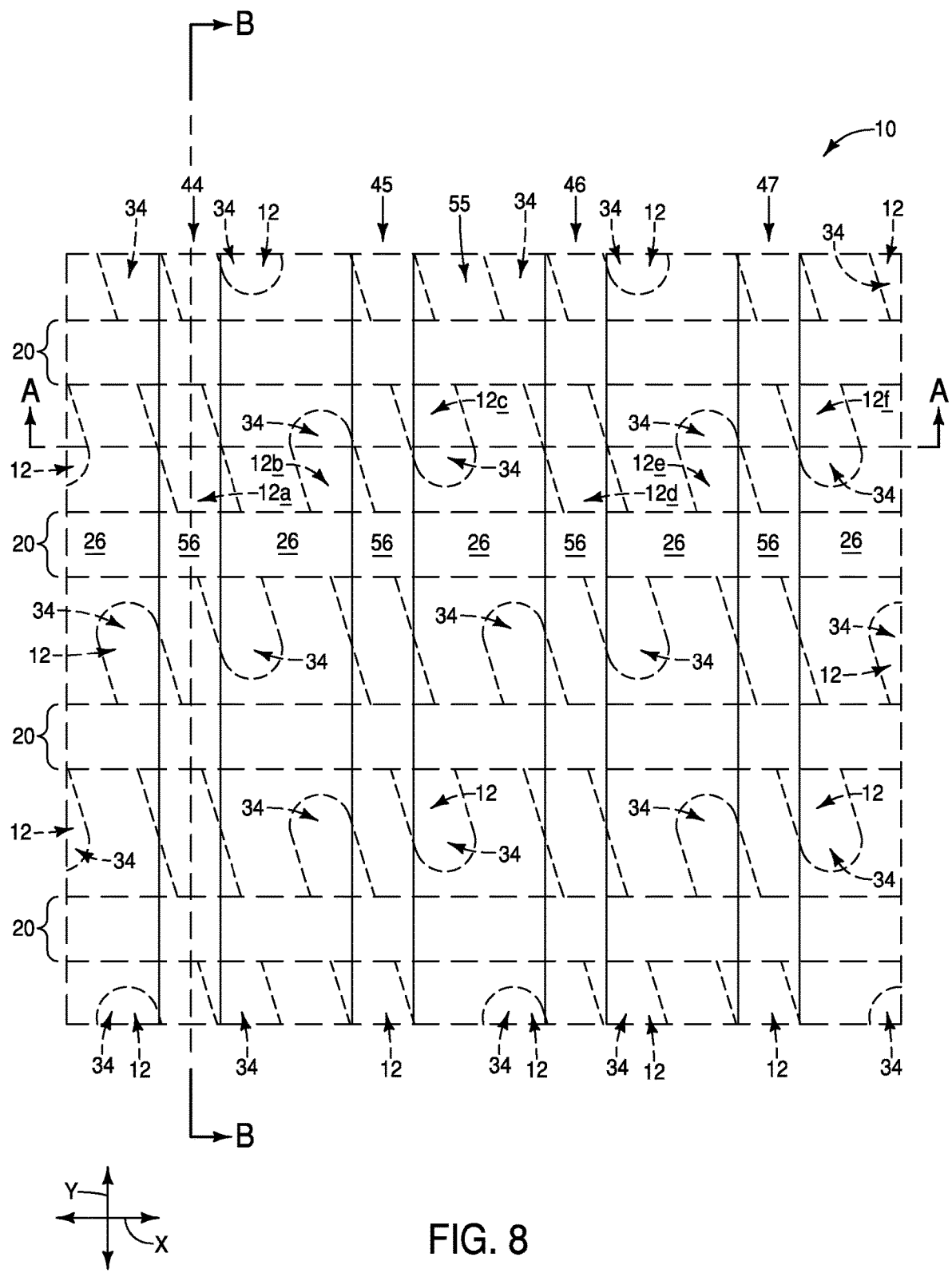
FIGS. 8-8B are diagrammatic views of the region of the example construction of FIGS. 1-1C at an example processing stage subsequent to that of FIGS. 7-7B.
Figure 8A:
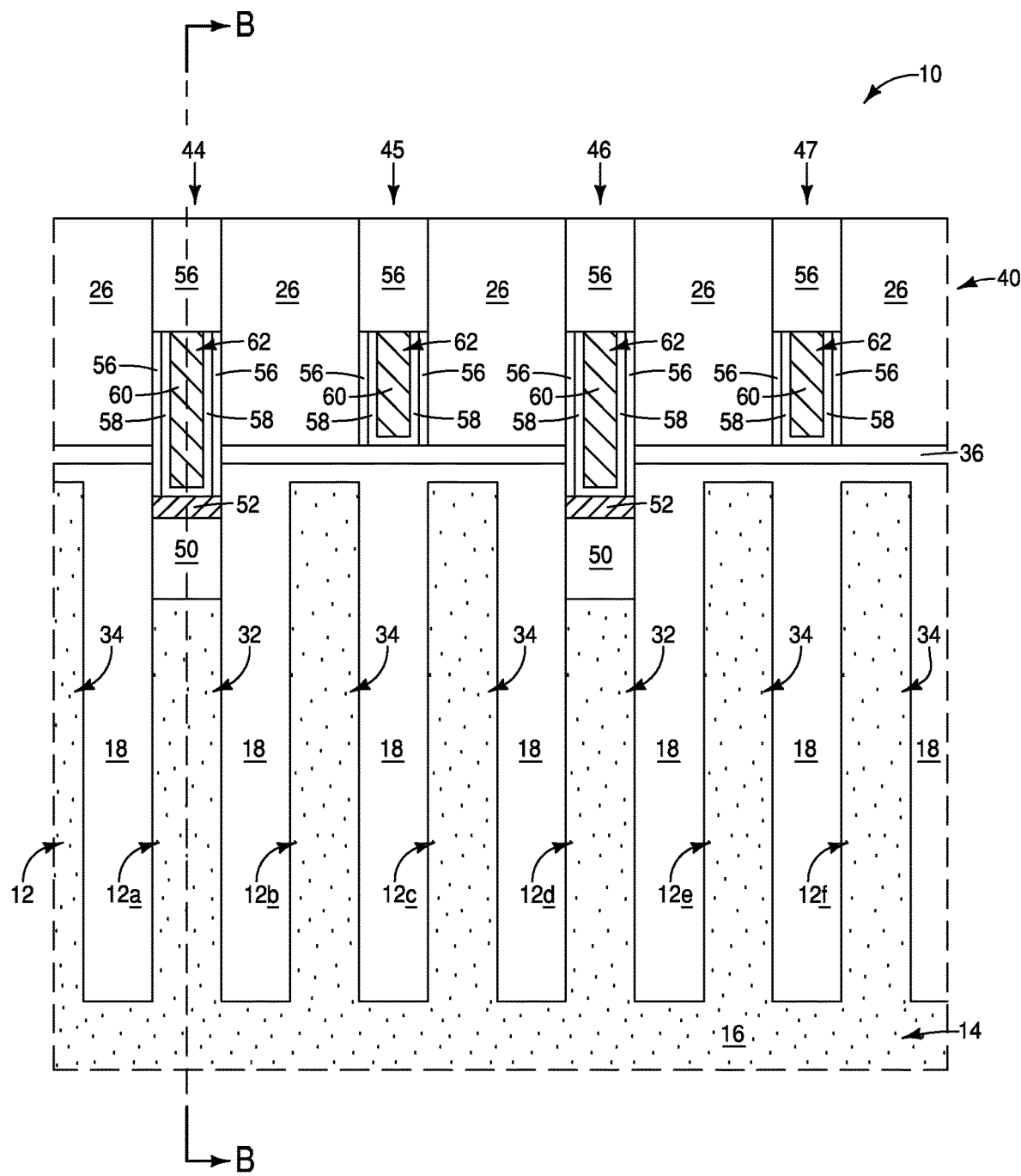
FIG. 8A is a diagrammatic cross-sectional side view along the lines A-A of FIGS. 8 and 8B.
Figure 8B:
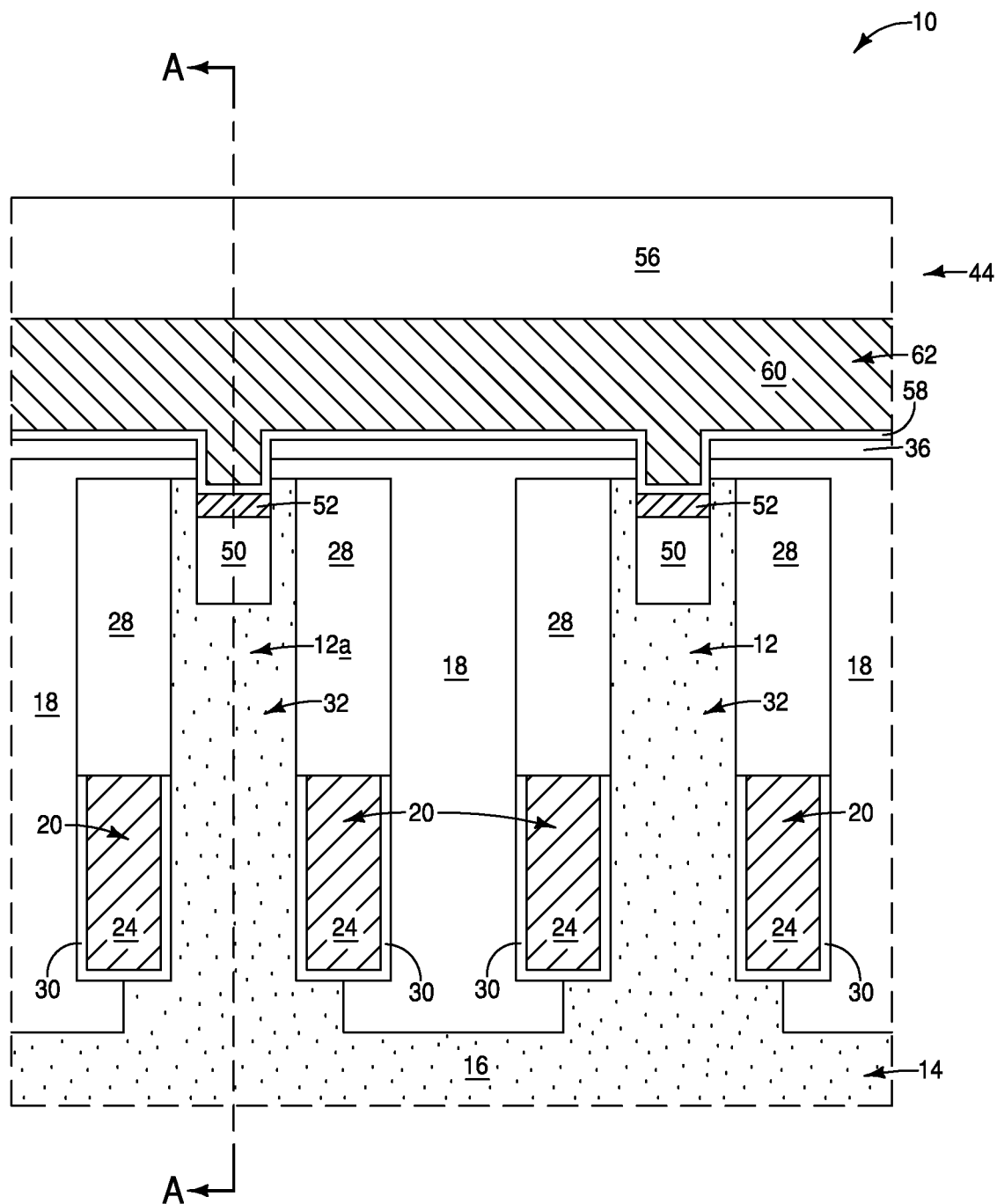

Referring to FIGS. 8-8B, the materials 56, 58 and 60 are recessed within the trenches 44-47, and then additional insulative material 56 is formed over the recessed materials 56, 58 and 60 and utilized to fill the trenches 44-47. In the shown embodiment, the same insulative material 56 is utilized to fill the trenches 44-47 as is utilized in the spacers 54. Such may be advantageous in that such may enable an etch to be readily identified which will selectively remove the material 26 of mold 40 relative to the material 56 surrounding the digit line material 60. In other embodiments, the insulative material utilized to fill the trenches 44-47 may be different than that utilized as the spacers 54. In some embodiments, the materials 26 and 56 may be referred to as first and second materials, respectively; with the first material comprising silicon nitride and the second material comprising silicon dioxide. It is noted that the different structures comprising material 56 would merge with one another to form a single construction comprising the material 56. However, the structures are illustrated separately from one another so that the structures are clearly delineated in the assemblies described herein; in part to assist the reader in identifying structures recited in the claim which follow, and in part because the application also includes embodiments in which the structures do not all comprise the same material 56.

The recessed digit line material 60 of FIGS. 8-8B may be considered to be configured as digit lines 62 which extend along the second direction of the y-axis. Such digit lines are electrically coupled with the digit-line-contact-regions 32.

Figure 9:
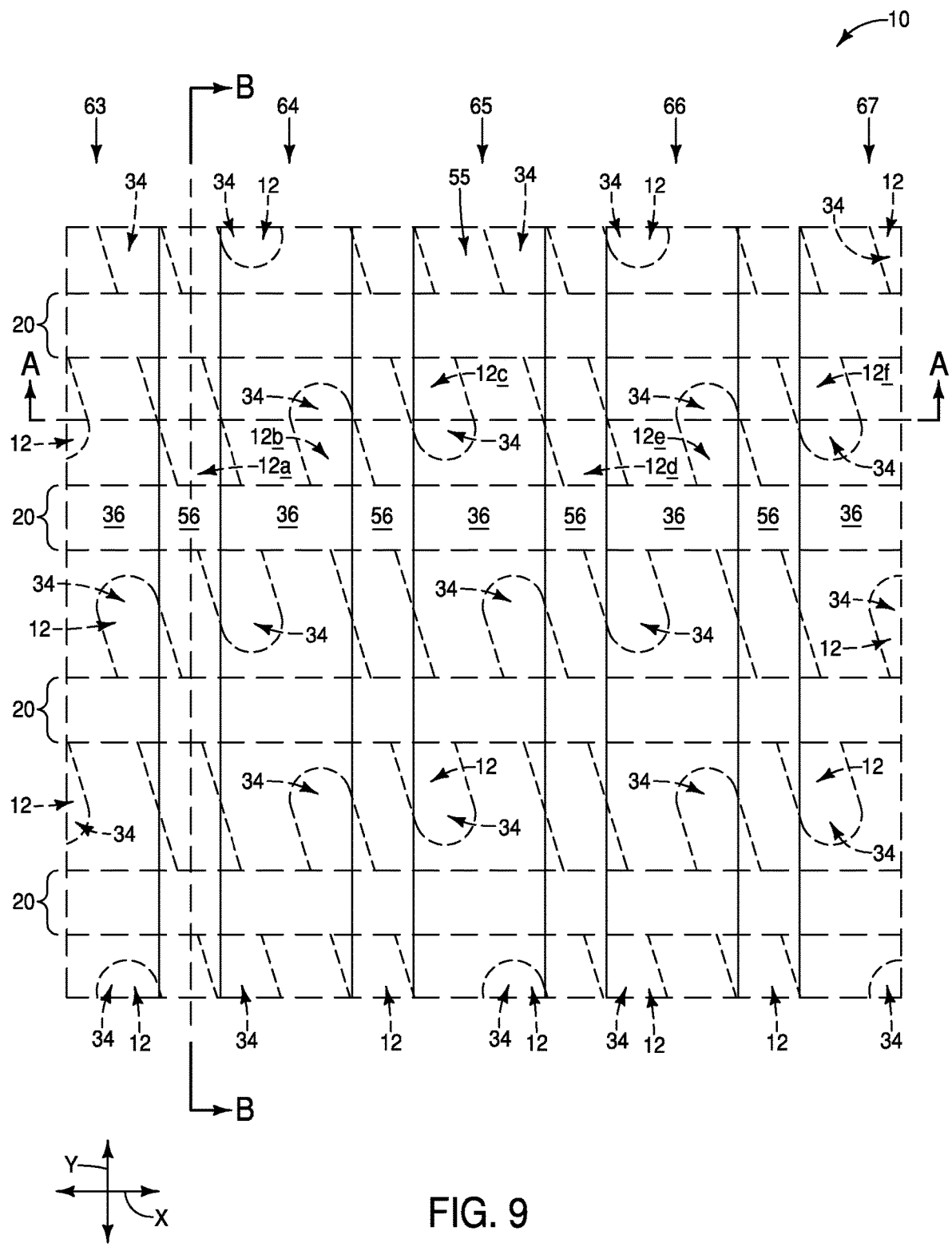
FIGS. 9-9B are diagrammatic views of the region of the example construction of FIGS. 1-1C at an example processing stage subsequent to that of FIGS. 8-8B.
Figure 9A:
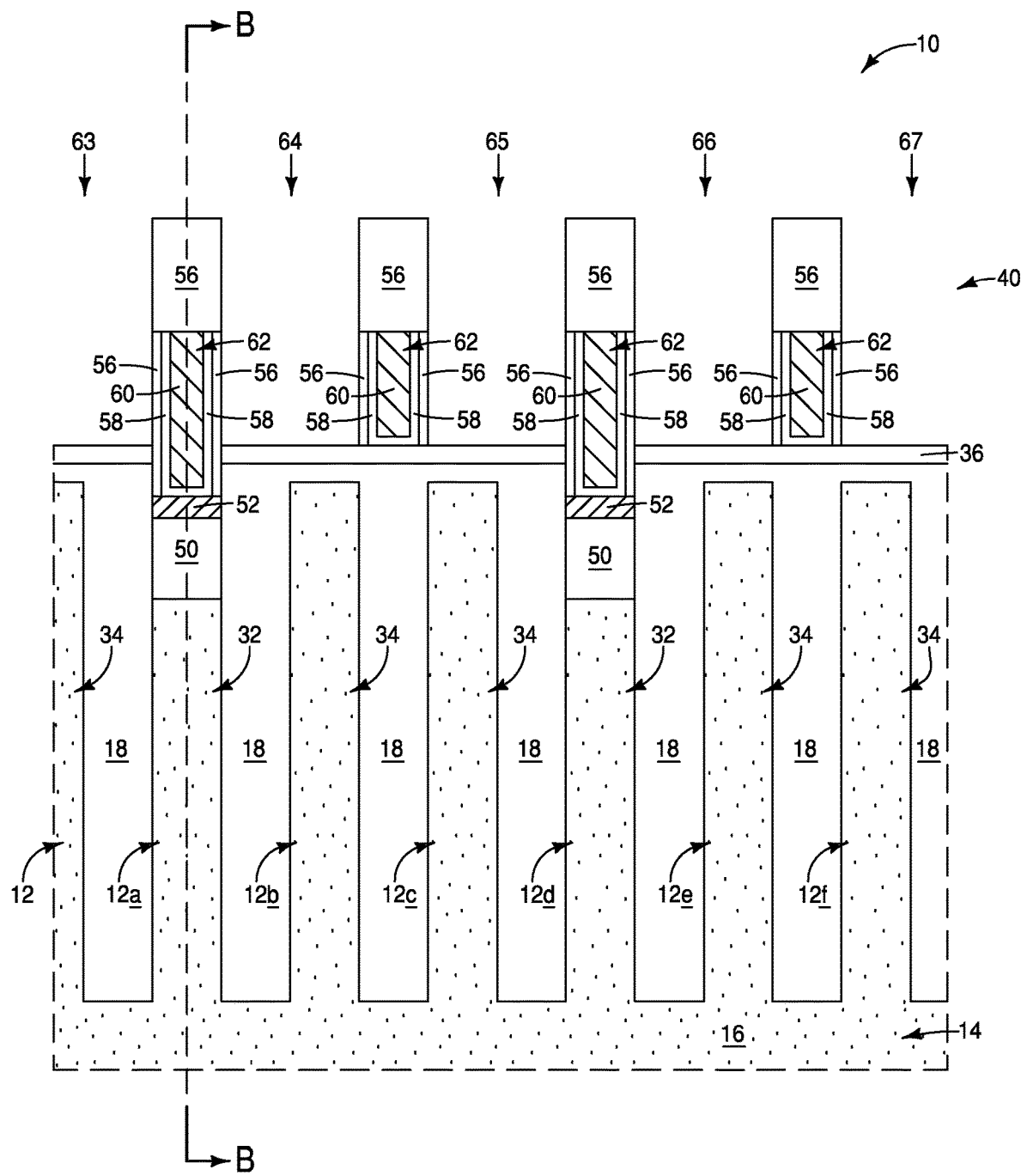
FIG. 9A is a diagrammatic cross-sectional side view along the lines A-A of FIGS. 9 and 9B.
Figure 9B:
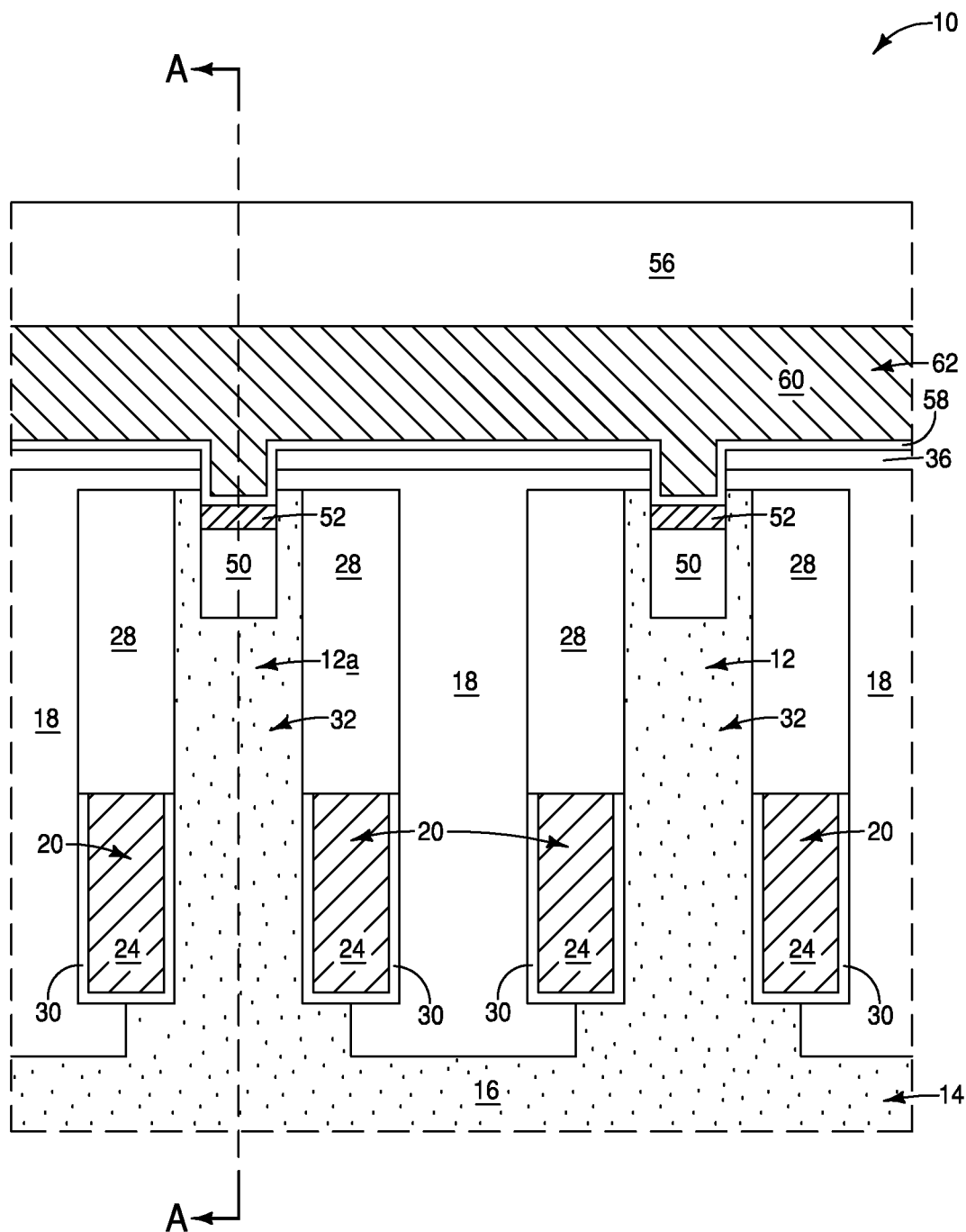

Referring to FIGS. 9-9B, the first material 26 (FIGS. 8-8B) is selectively removed relative to the second material 56. The selective removal of material 26 may utilize any suitable conditions; and in some embodiments may utilize phosphoric acid to selectively remove silicon nitride relative to silicon dioxide.

The removal of the material 26 (FIGS. 8-8B) forms trenches 63-67 which extend along the second direction of the y-axis. In some embodiments, the trenches 63-67 may be referred to as second trenches to distinguish them from the first trenches 44-47 described above with reference to FIGS. 5-5B. The digit lines 62 are between the second trenches 63-67, as shown in FIG. 9A.

Figure 10:
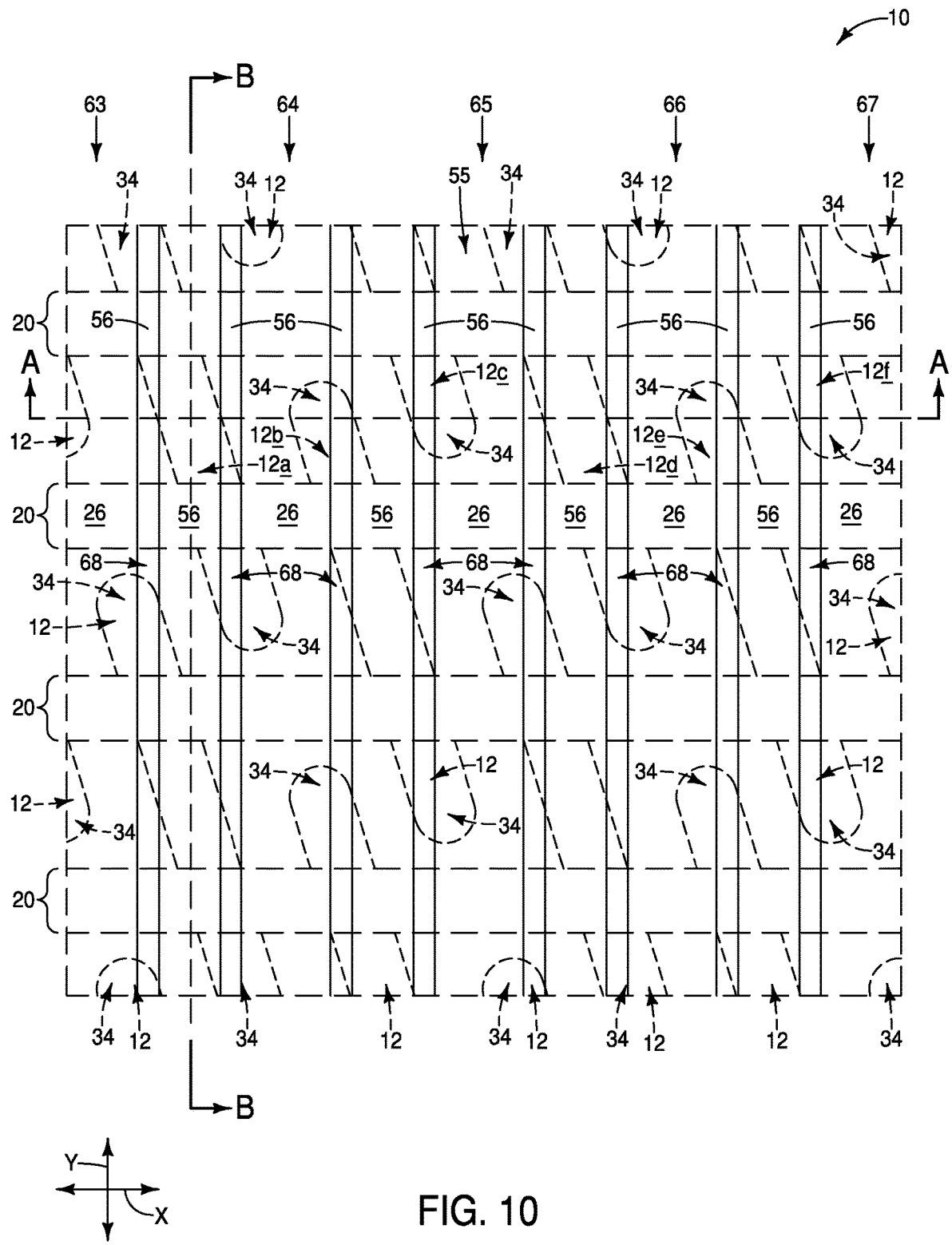
FIGS. 10-10B are diagrammatic views of the region of the example construction of FIGS. 1-1C at an example processing stage subsequent to that of FIGS. 9-9B.
Figure 10A:
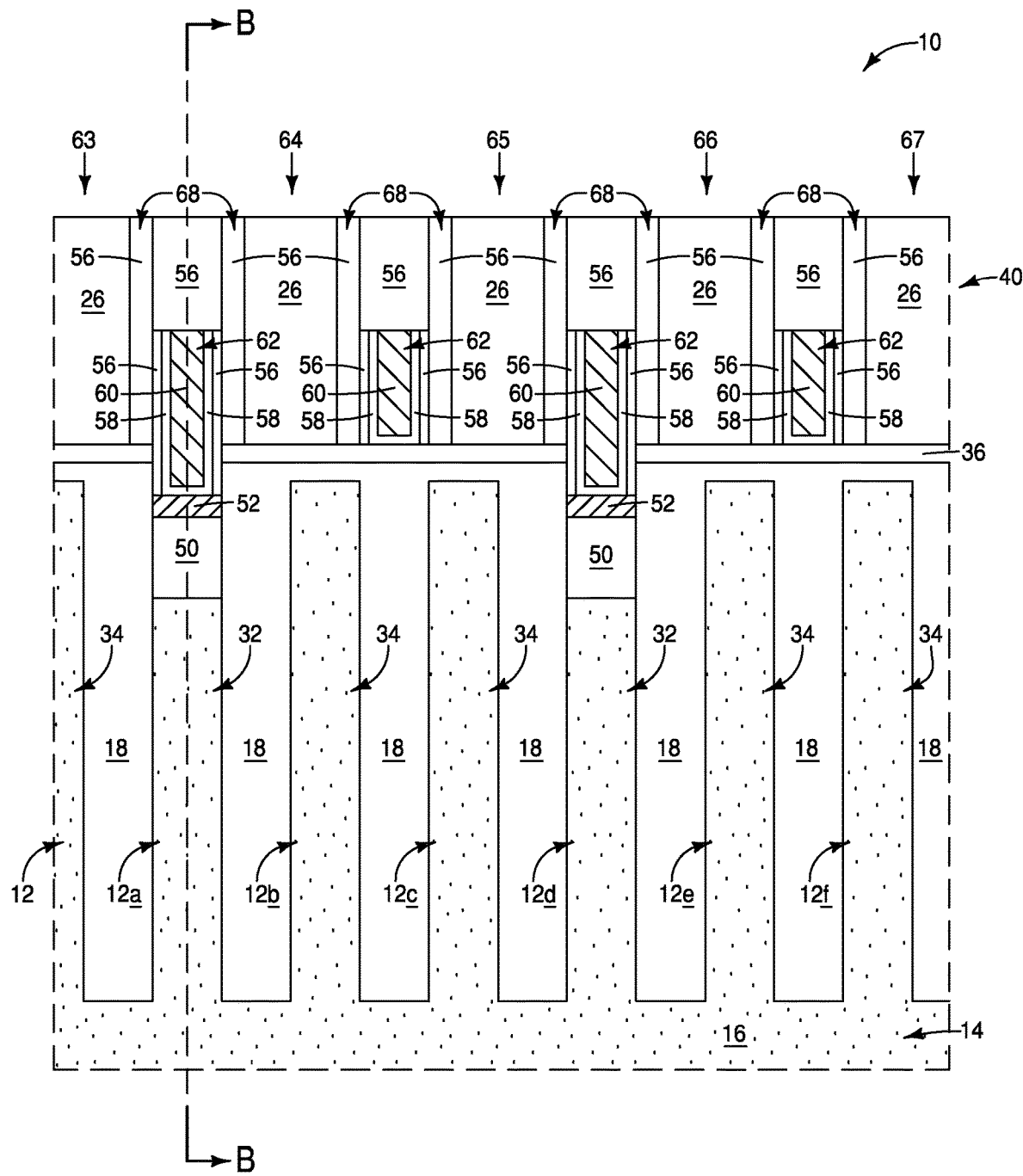
FIG. 10A is a diagrammatic cross-sectional side view along the lines A-A of FIGS. 10 and 10B.
Figure 10B:
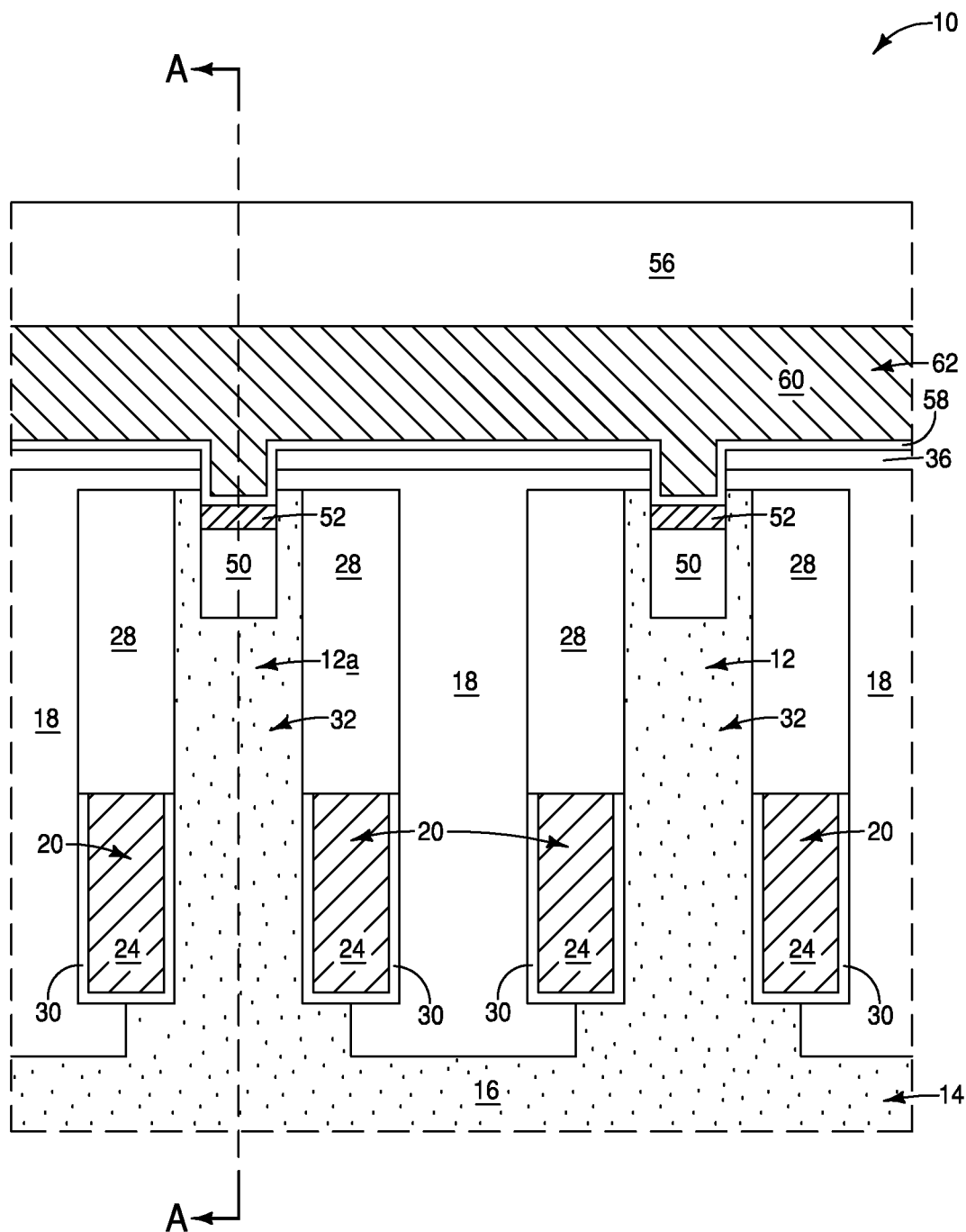

Referring to FIGS. 10-10B, spacers 68 are formed along sidewalls of the second trenches 63-67. In the shown embodiment, the spacers 68 comprise the second material 56 (e.g., silicon dioxide). Subsequently, the trenches 63-67 are filled with the first material 26 (e.g., silicon nitride).

Figure 11:
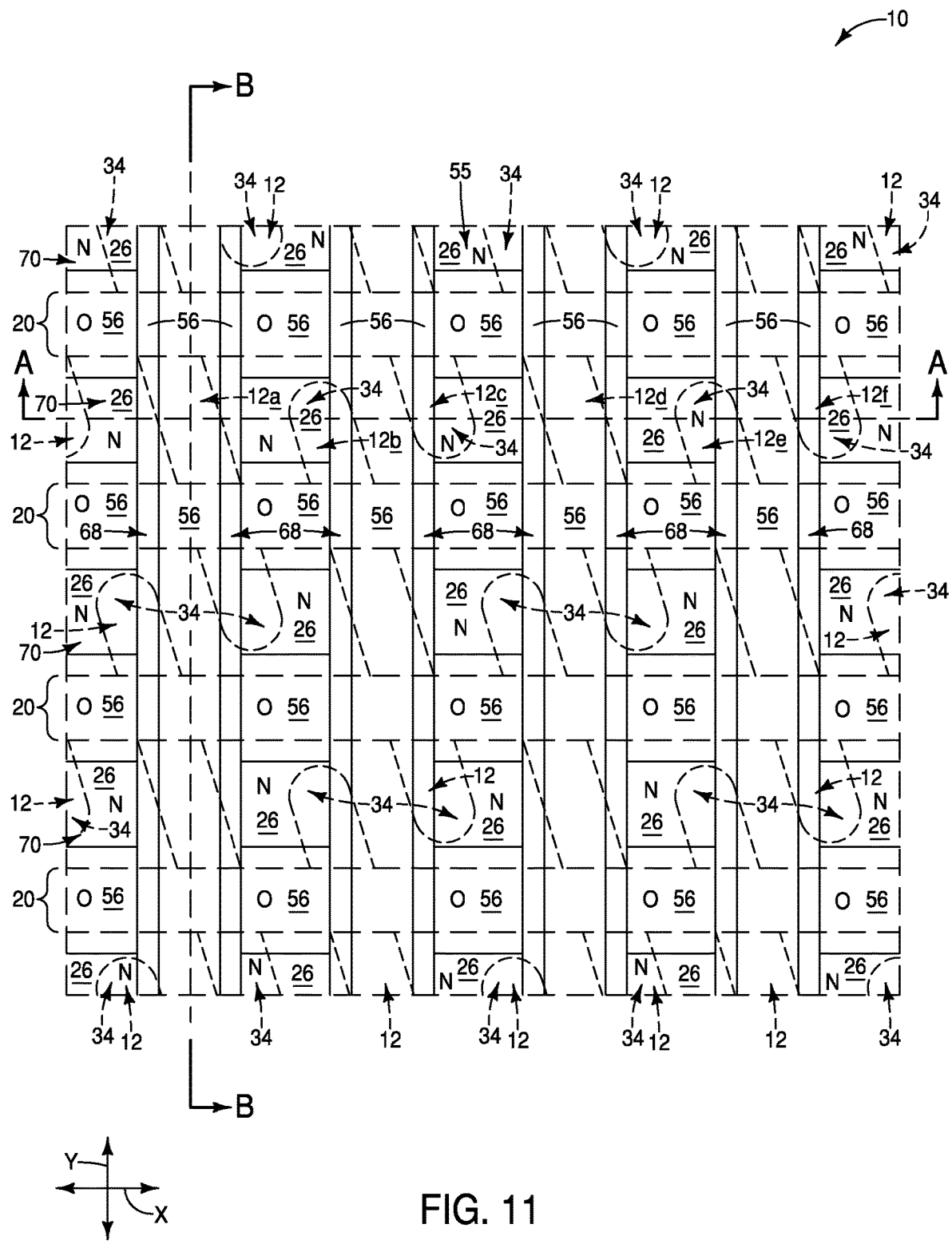
FIGS. 11-11B are diagrammatic views of the region of the example construction of FIGS. 1-1C at an example processing stage subsequent to that of FIGS. 10-10B.
Figure 11A:
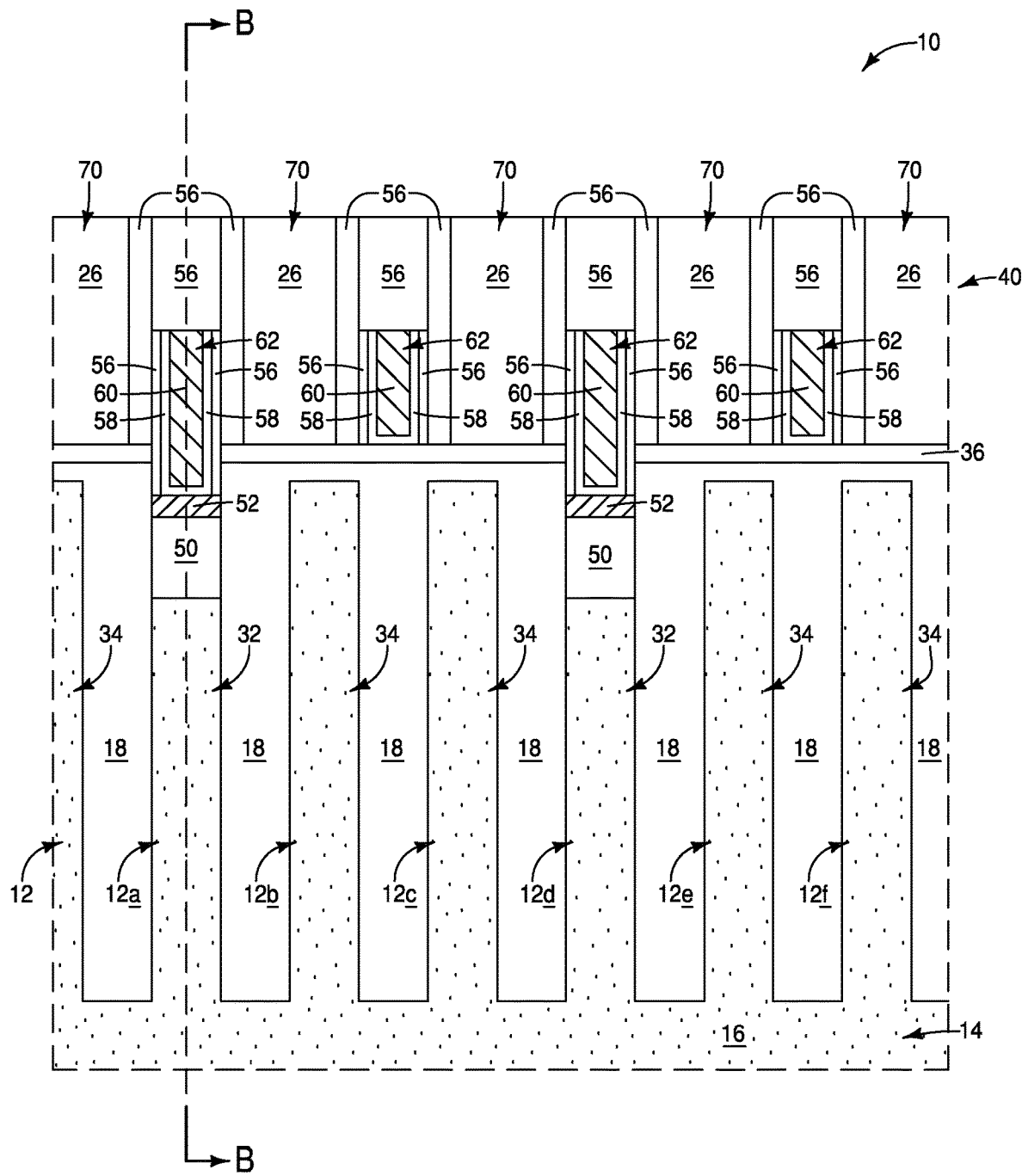
FIG. 11A is a diagrammatic cross-sectional side view along the lines A-A of FIGS. 11 and 11B.
Figure 11B:
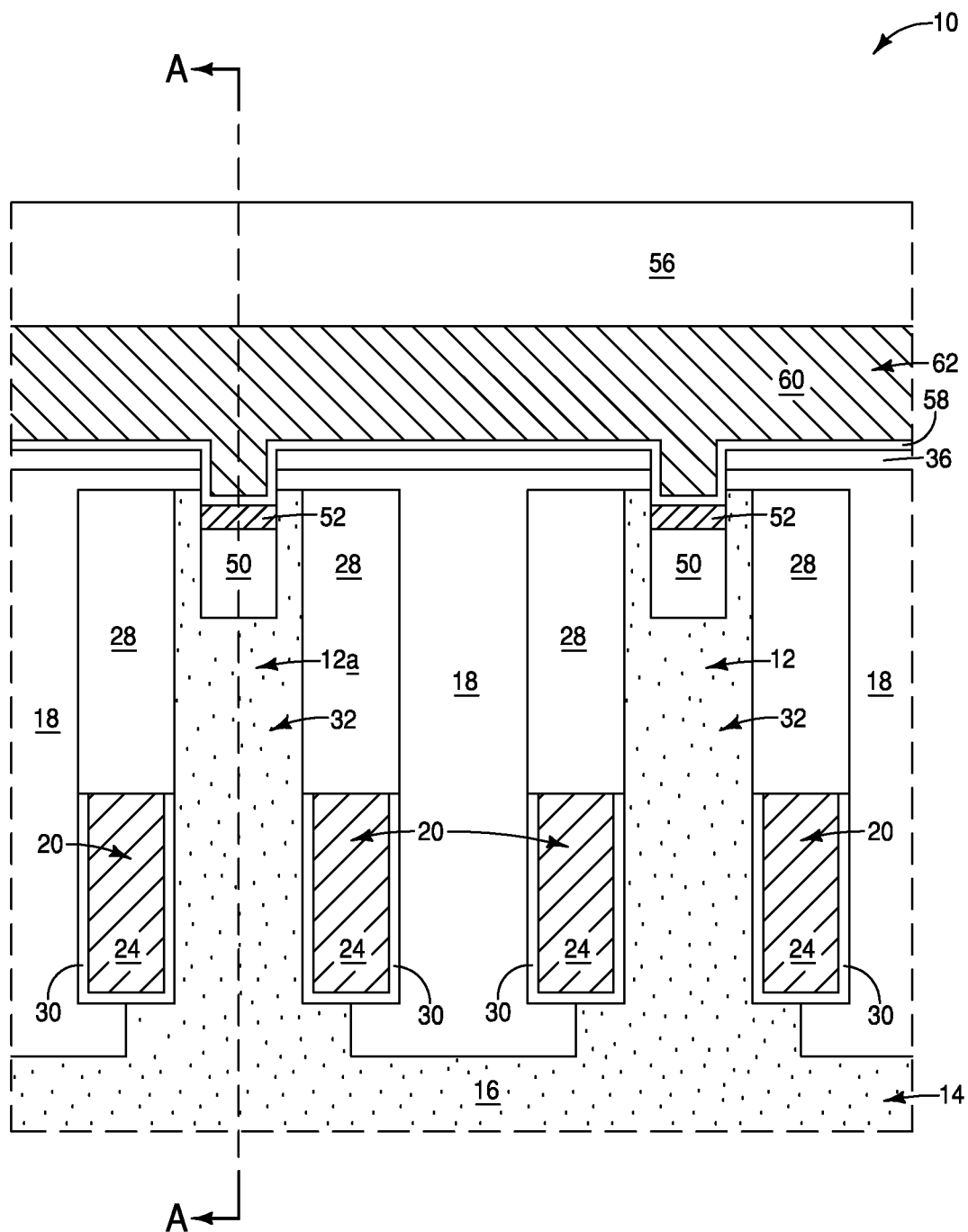

Referring to FIGS. 11-11B, the first material 26 is patterned into first-material-pillars 70 aligned with the storage-element-contact-regions 34. Only some of the pillars 70 are labeled with the number 70 in the top view of FIG. 11. However, all of the pillars 70 are labeled with an "N" to identify such pillars; with the label "N" indicating that in some embodiments the pillars may comprise silicon nitride. The second material 56 is formed within the trenches 63-67 (FIG. 10) and in regions between the pillars 70. Such regions are labeled with an "O" in the top view of FIG. 11 to identify such regions; with the label "O" indicating that in some embodiments the regions may comprise silicon dioxide.

The material 26 may be patterned into the pillars 70 utilizing any suitable processing. For instance, in some embodiments one or more masks may be extended along the x-axis direction and utilized to pattern the material 26 into the pillars 70 in combination with one or more suitable etches.

Figure 12:
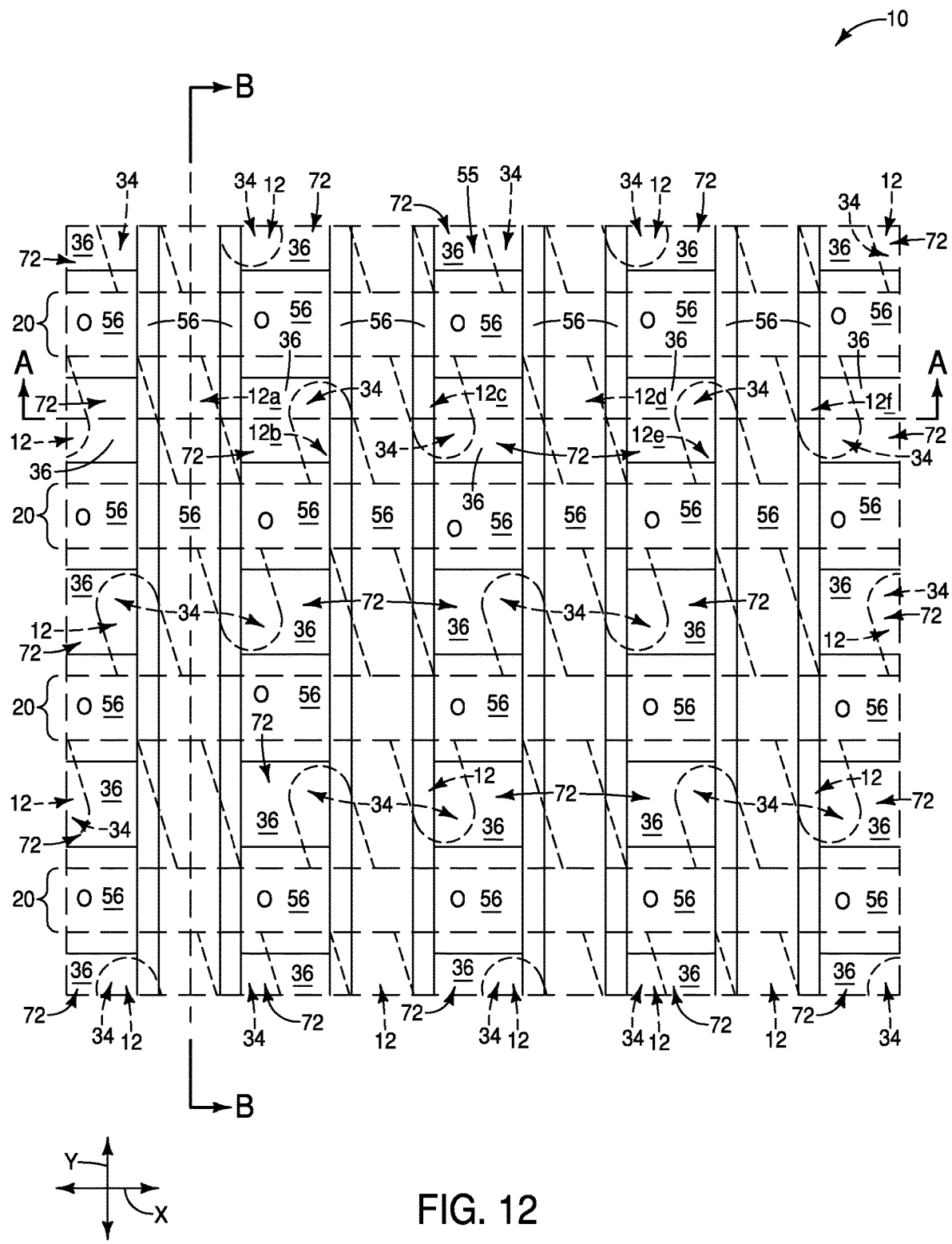
FIGS. 12-12B are diagrammatic views of the region of the example construction of FIGS. 1-1C at an example processing stage subsequent to that of FIGS. 11-11B.
Figure 12A:
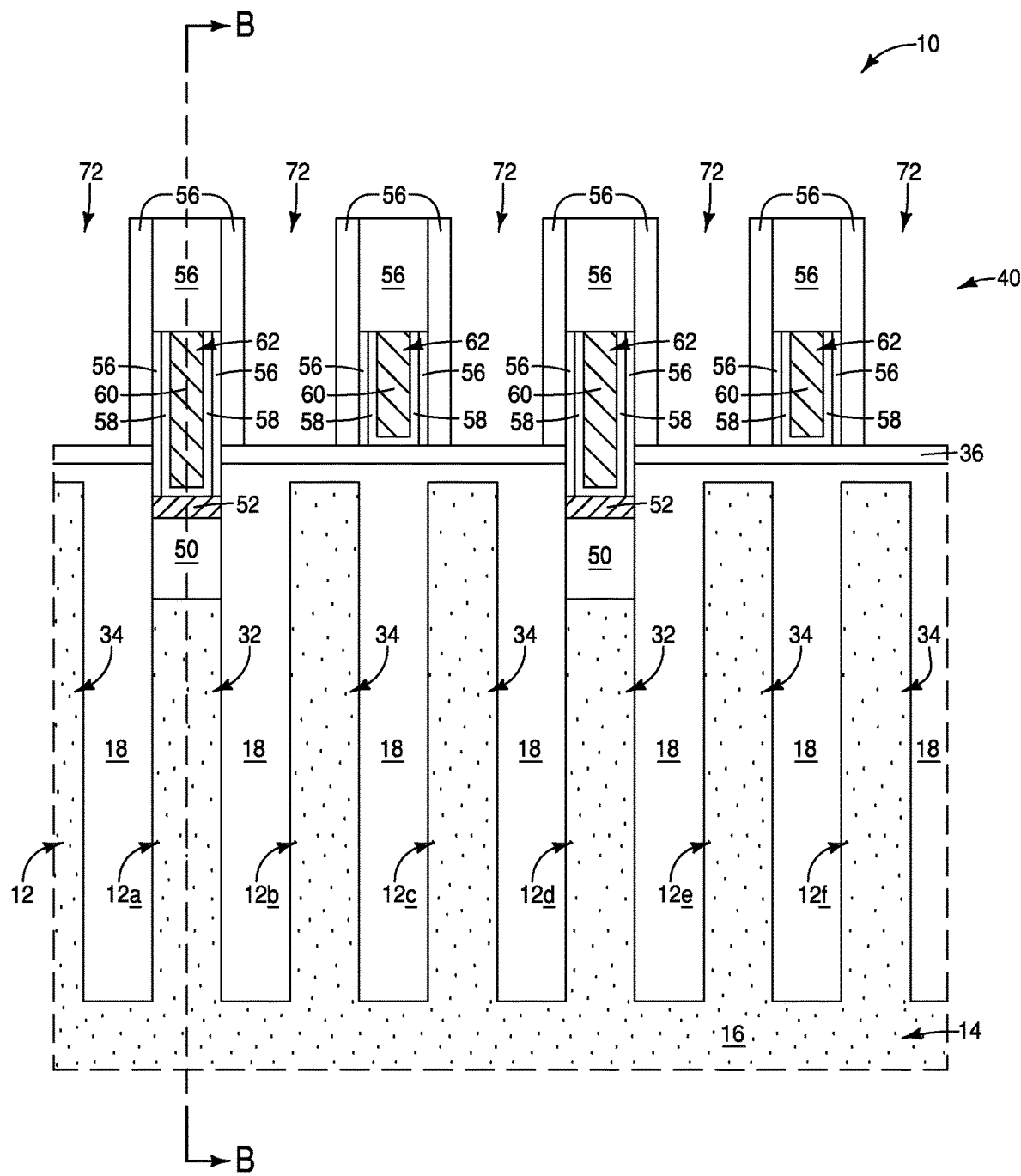
FIG. 12A is a diagrammatic cross-sectional side view along the lines A-A of FIGS. 12 and 12B.
Figure 12B:
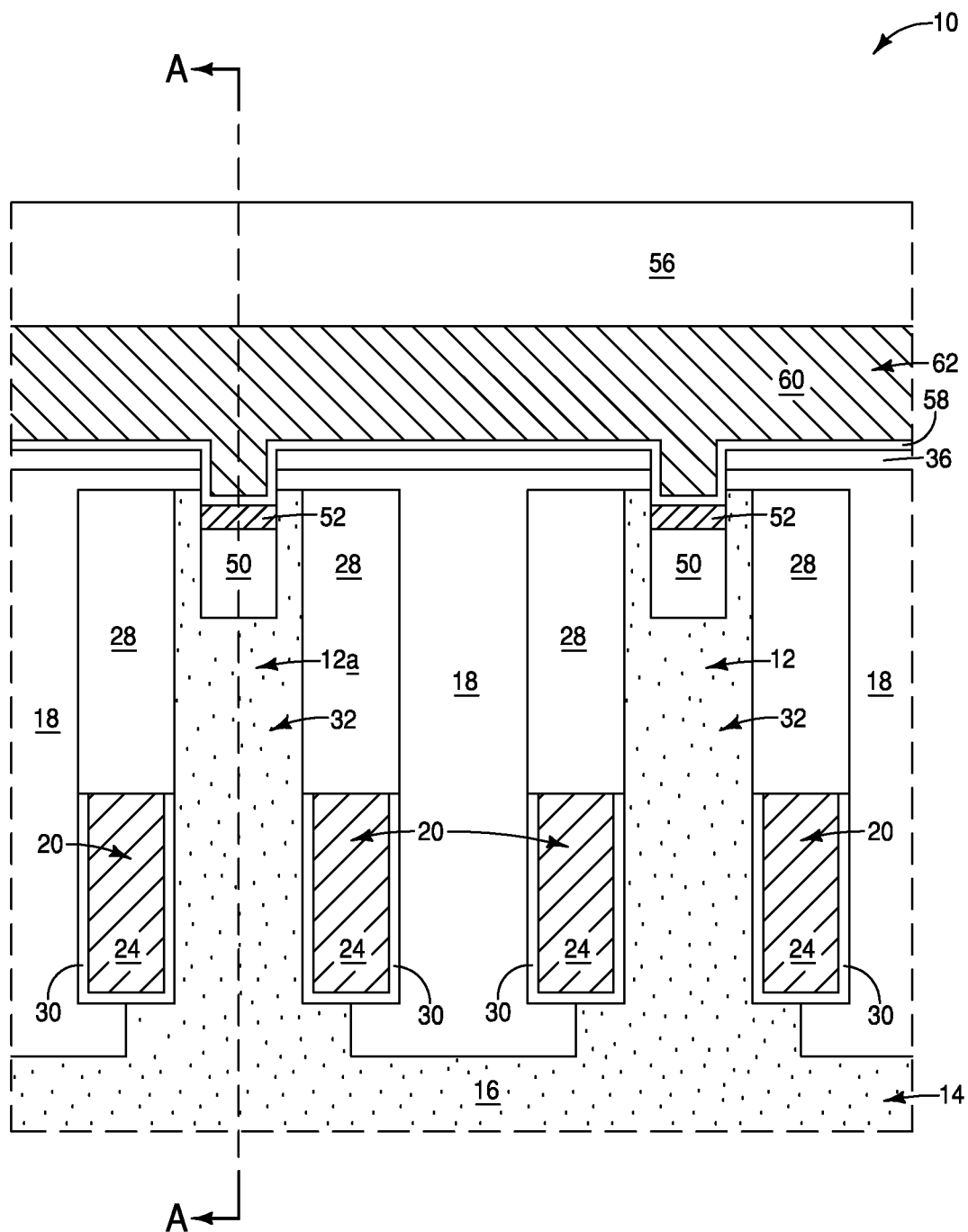

Referring to FIGS. 12-12B, the first material 26 (FIGS. 11-11B) is selectively removed relative to the second material 56 to form openings 72 aligned with portions of the storage-element-contact-regions 34. It is noted that in some embodiments the material 36 may comprise the same composition as the second material 56 (e.g., silicon dioxide), and accordingly the regions of material 36 may be considered to correspond to additional regions of the second material. The label "O" is utilized in the top view of FIG. 12 to assist the reader in understanding that the regions labeled "N" of FIG. 11 are selectively removed to relative to the regions labeled "O".

Figure 13:
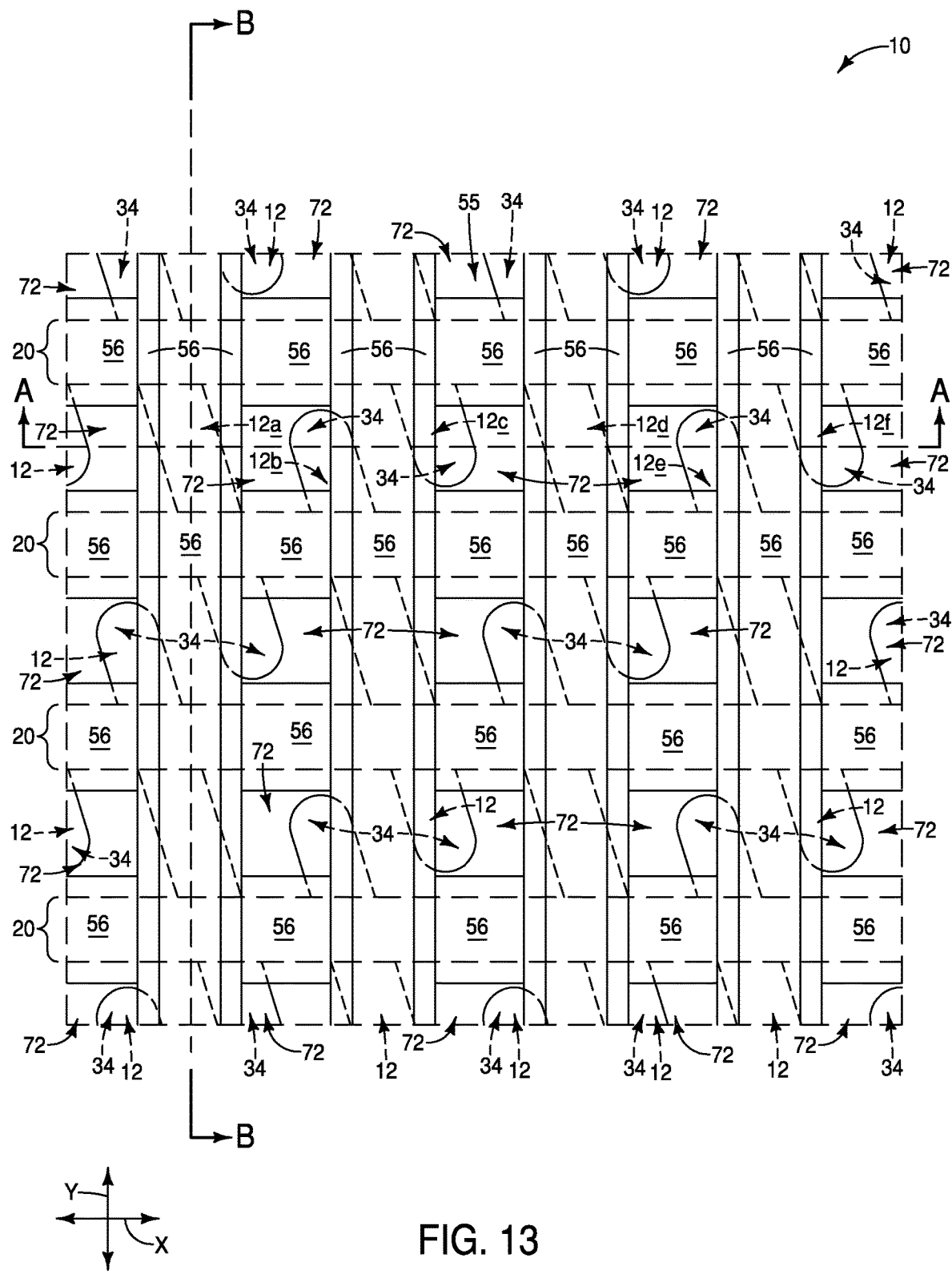
FIGS. 13-13B are diagrammatic views of the region of the example construction of FIGS. 1-1C at an example processing stage subsequent to that of FIGS. 12-12B.
Figure 13A:
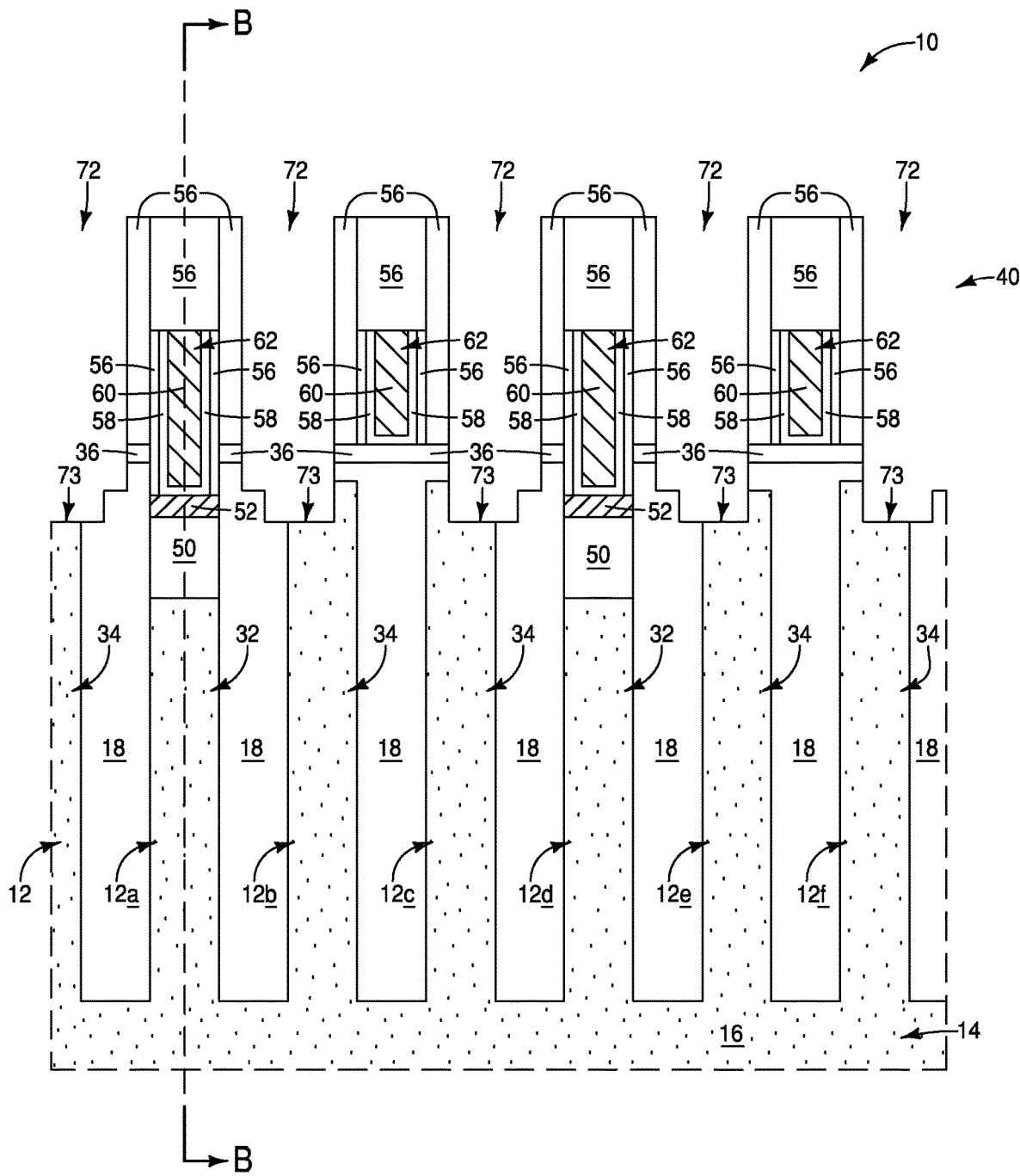
FIG. 13A is a diagrammatic cross-sectional side view along the lines A-A of FIGS. 13 and 13B.
Figure 13B:
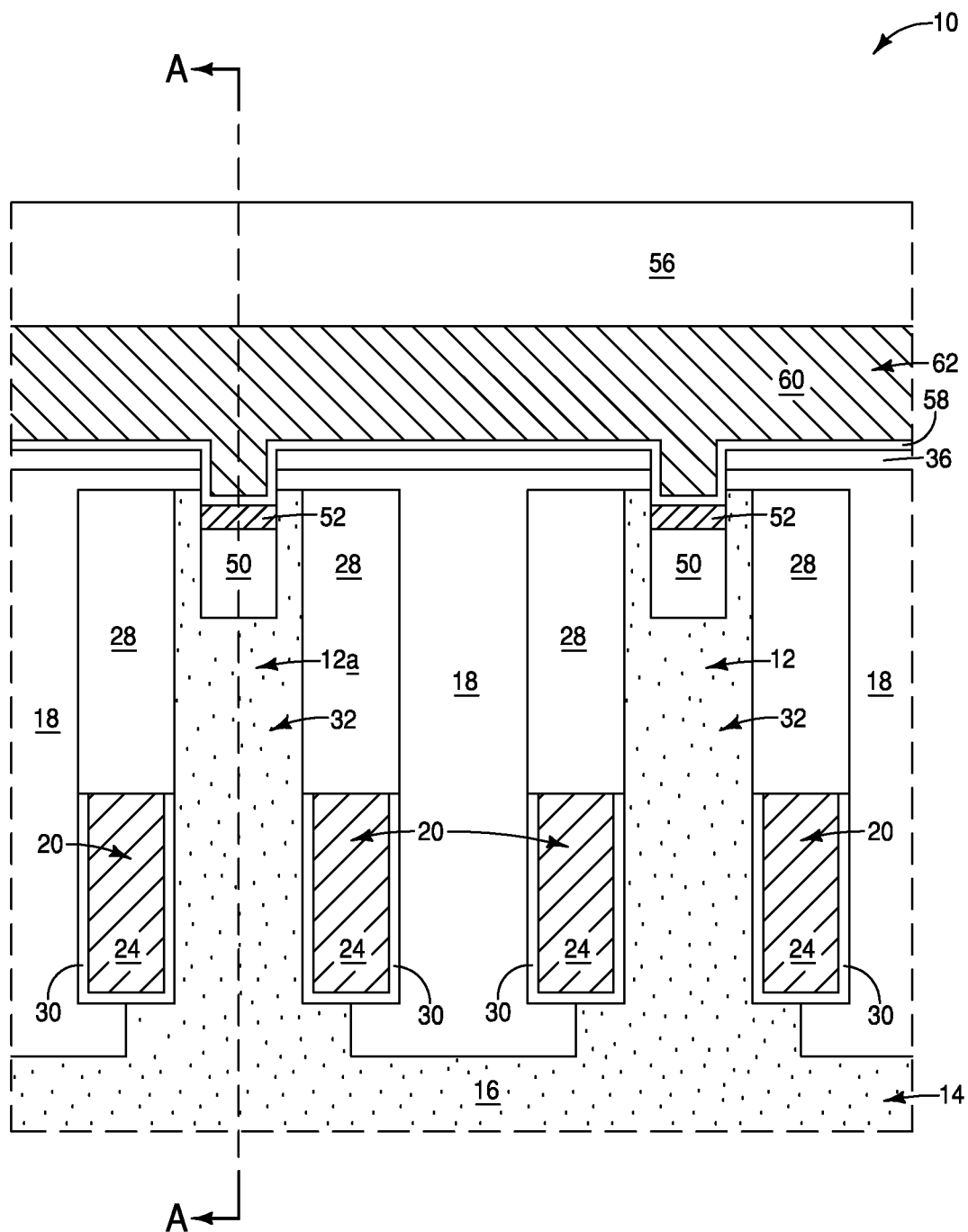

Referring to FIGS. 13-13B, the openings 72 are extended through the material 36 and into the semiconductor material 16 of the storage-element-contact-regions 34. The openings 72 may be extended with processing analogous to that described above with reference to FIGS. 3-3B relative to the extension of the openings 38.

The storage-element-contact-regions 34 have exposed surfaces 73 along the bottoms of the extended openings 72.

Figure 14:
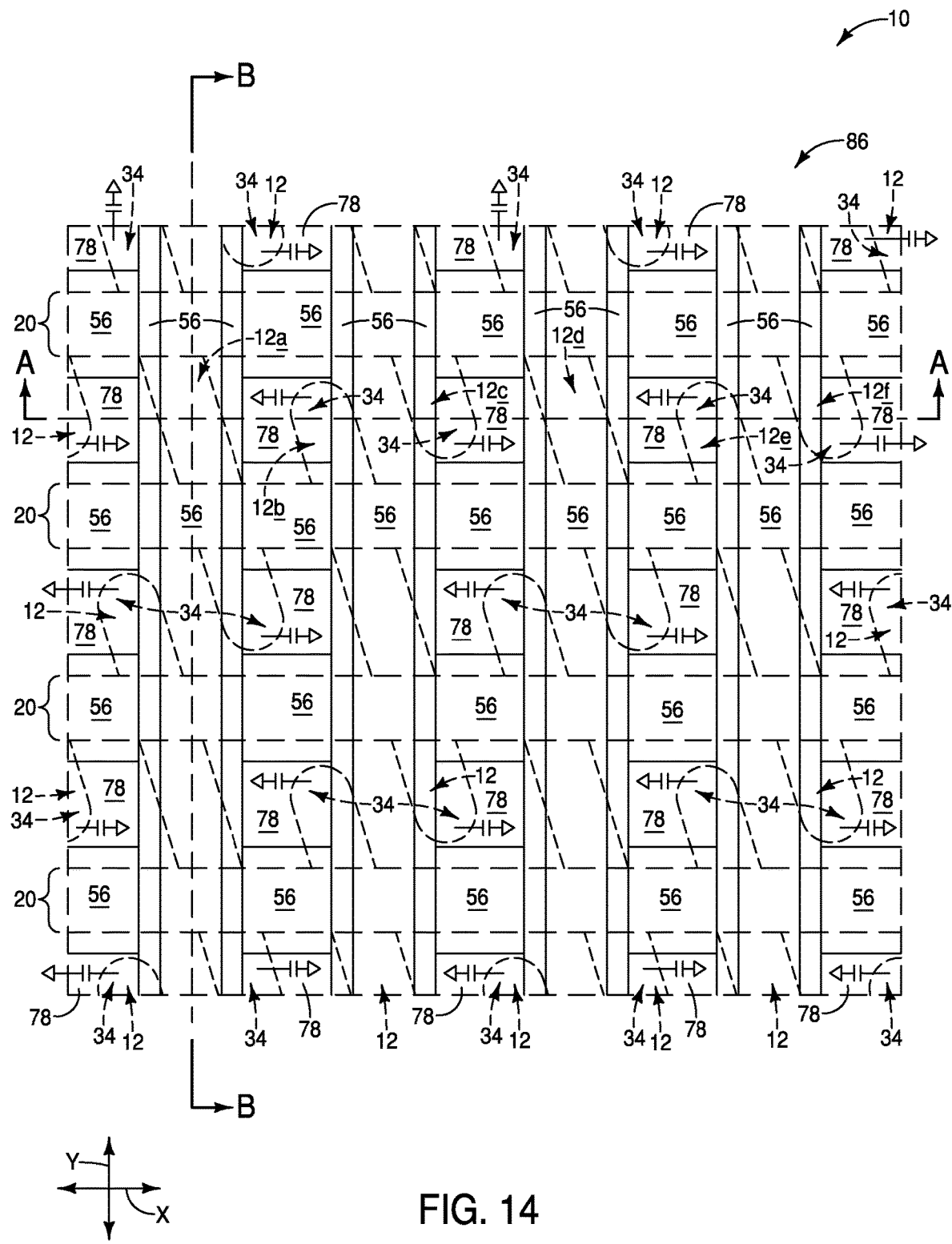
FIGS. 14-14B are diagrammatic views of the region of the example construction of FIGS. 1-1C at an example processing stage subsequent to that of FIGS. 13-13B.
Figure 14A:
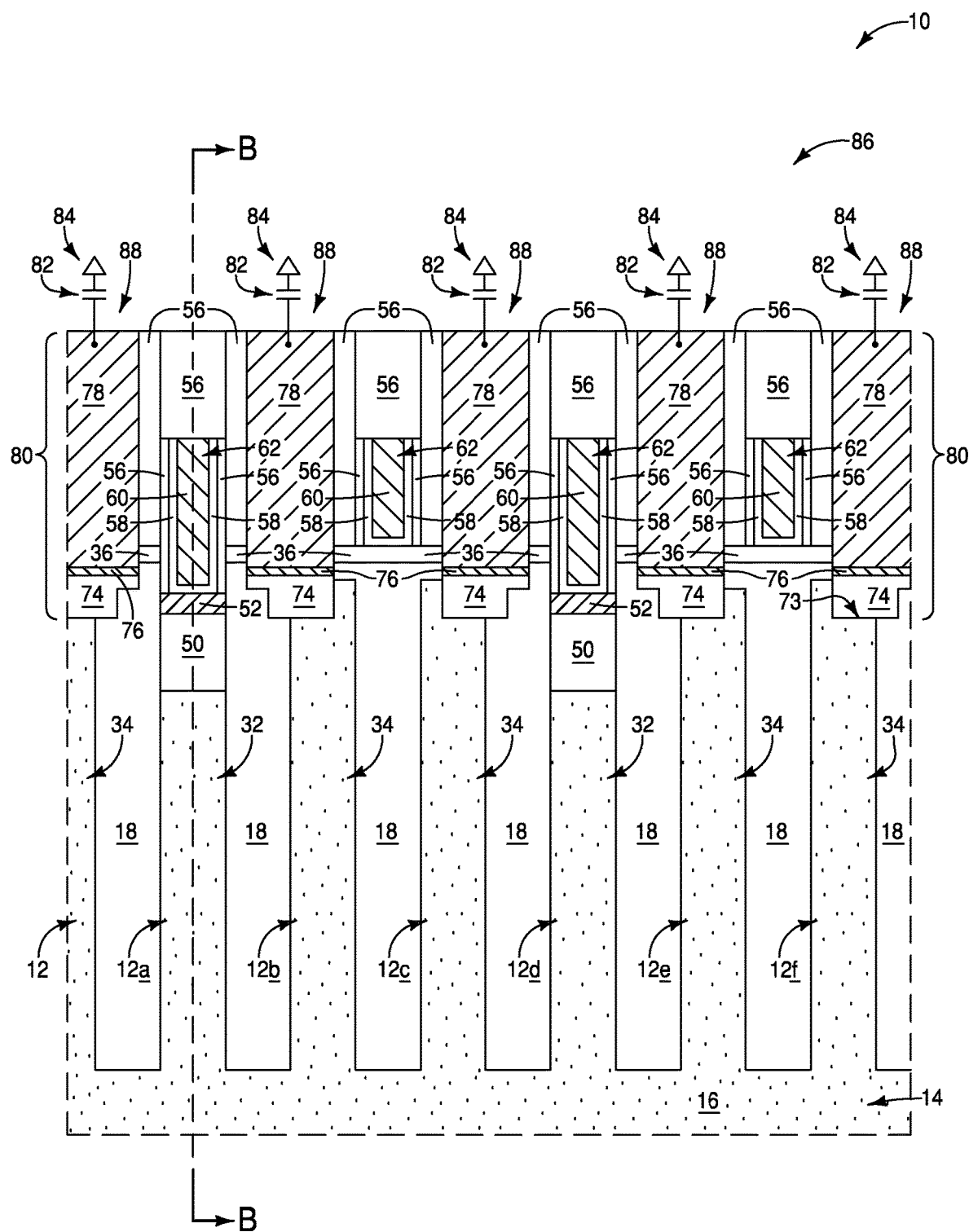
FIG. 14A is a diagrammatic cross-sectional side view along the lines A-A of FIGS. 14 and 14B.
Figure 14B:
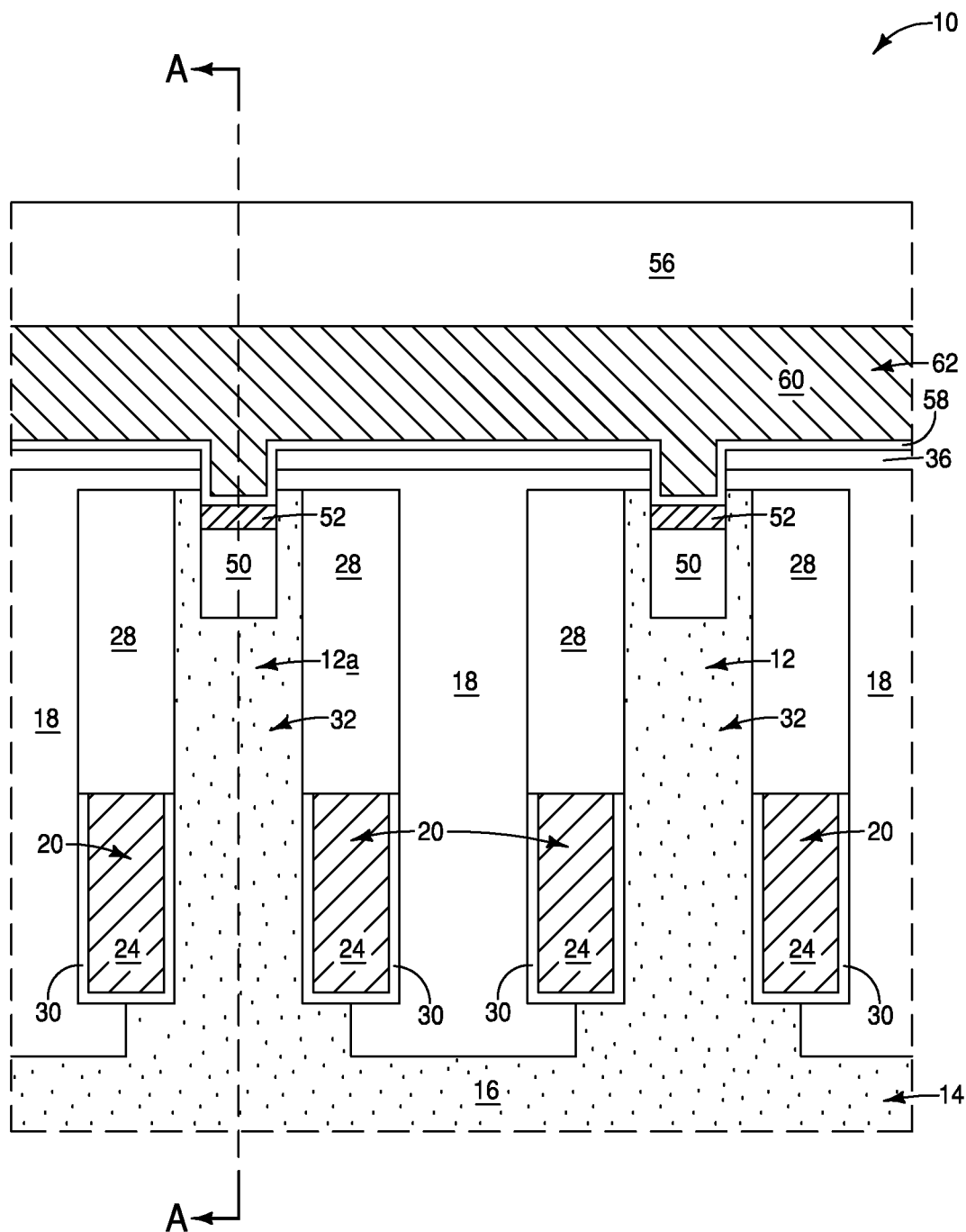

Referring to FIGS. 14-14B, silicon (or other suitable semiconductor material) 74 is epitaxially grown from the exposed surfaces 73 of the semiconductor material 16. The epitaxially-grown silicon may be formed to any suitable thickness. In some embodiments, the epitaxially-grown silicon 74 may be omitted. In some embodiments, the epitaxially-grown silicon 74 may be replaced with polycrystalline silicon which is deposited over the surfaces 73. However, in some applications it may be advantageous to utilize epitaxially-grown silicon 74 instead of polycrystalline silicon, in that the epitaxially-grown silicon may provide lower resistance and better uniformity than can be achieved with polycrystalline silicon, particularly in the tight confines of highly-integrated circuitry. The epitaxially-grown silicon 74 may be conductively-doped with one or more suitable dopants (e.g., phosphorus, boron, etc.).

Conductive metal-containing material 76 is formed over and directly against the epitaxially-grown silicon 74. In some embodiments, the metal-containing material 76 may comprise metal silicide. For instance, in some example embodiments the metal-containing material 76 may comprise, consist essentially of, or consist of cobalt silicide. In some embodiments, the metal-containing material 76 may be considered to be directly against silicon of the storage-element-contact-regions 34; regardless of whether the material 76 is directly against epitaxially-grown material 74, or directly against semiconductor material 16.

Conductive material 78 is provided over and in direct contact with the metal silicide 76. The conductive material 78 may comprise any suitable composition(s); and in some embodiments may comprise metal. For instance, in some embodiments the conductive material 78 may comprise, consist essentially of, or consist of one or more of copper, molybdenum, palladium, platinum, ruthenium, tungsten, titanium, and mixtures thereof. In some applications, the conductive material 78 may comprise, consist essentially, or consist of ruthenium; and such ruthenium may directly contact an upper surface of the metal silicide 76 (e.g., may directly contact an upper surface of a cobalt silicide 76). Optional barrier material (analogous to the optional barrier material 58 described above with reference to FIGS. 7-7B) may be provided between the conductive material 78 and the metal silicide 76 in some embodiments.

The materials 74, 76 and 78 together form conductive interconnects 80 which are coupled with the storage-element-contact-regions 34. Storage-elements 82 are formed to be electrically coupled with the conductive interconnects 80. The illustrated example storage-elements 82 are configured as capacitors. Each of the capacitors 82 has a node connected with a reference voltage 84. The reference voltage may be ground or any other suitable voltage.

In some embodiments, other storage-elements may be utilized instead of the capacitors 82. Any suitable device having two or more detectable states may be utilized as a storage-element; including, for example, devices comprising phase change material, conductive-bridging material, etc.

The configuration of FIGS. 14-14B may be considered to correspond to a region of a memory array 86 (for instance, a DRAM array). The memory array comprises memory cells 88 which include an access transistor (e.g., a transistor comprising a gate along one of the wordlines 20) coupled with a storage-element (e.g., a capacitor 82). An example memory array 86 is described with reference to FIG. 15. The memory array includes digit lines (DL1-DL4) corresponding to the digit lines 62, and includes wordlines (WL1-WL4) corresponding to the wordlines 20. Memory cells 88 comprise transistors coupled with the capacitors 82. Each of the memory cells 88 is uniquely addressed through the combination of a wordline and a digit line.

Figure 15:
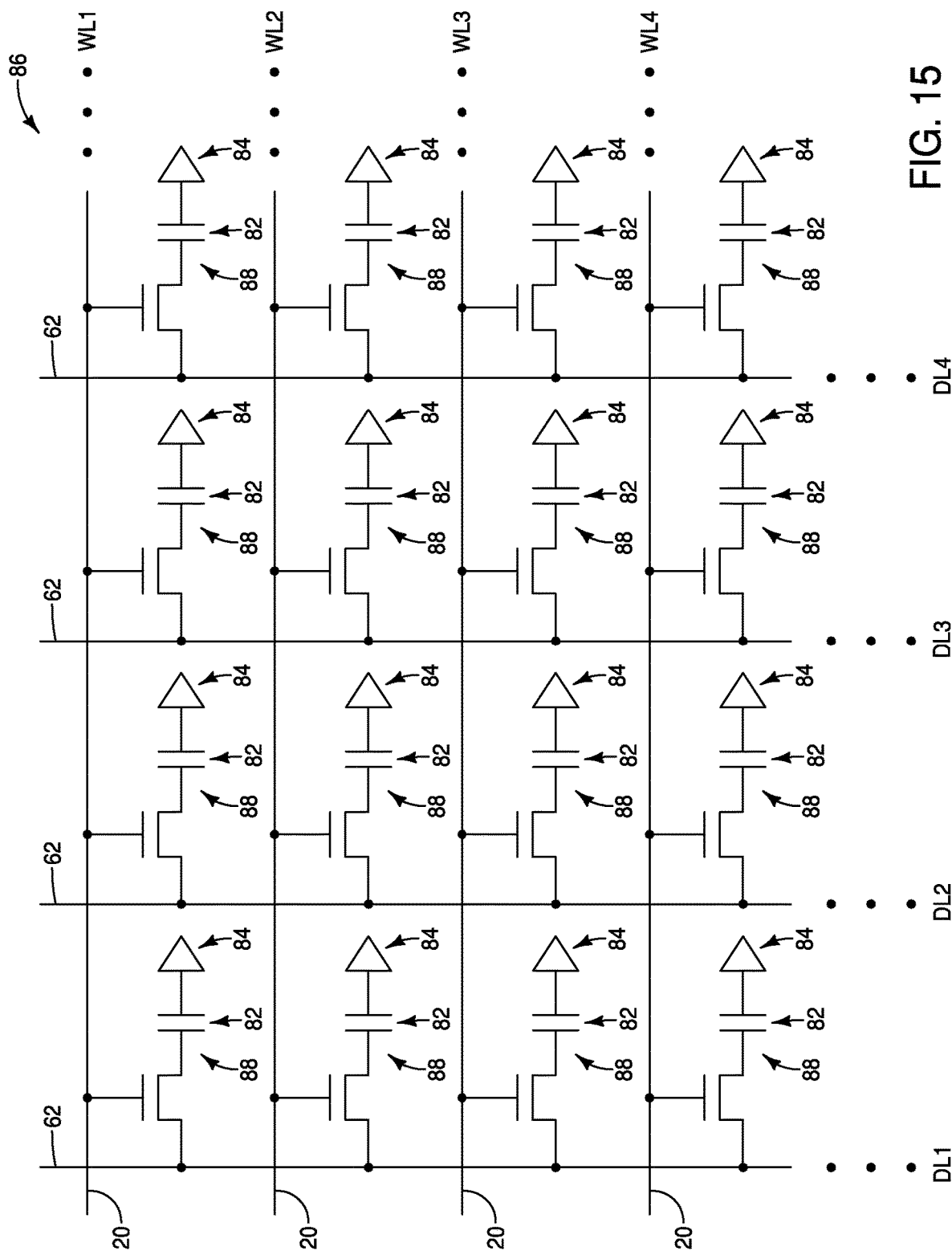
FIG. 15 is a diagrammatic schematic view of a region of an example memory array.

The memory array 86 of FIG. 15 is a DRAM array in which each of the memory cells 88 comprises a transistor and a capacitor. In other embodiments, configurations analogous to those described herein may be utilized in other memory arrays.

In some embodiments, it may be desirable to form voids (air gaps) adjacent sidewalls of the conductive interconnects 80 (FIG. 14A). Such may improve performance across a memory array by, for example, reducing parasitic capacitance between neighboring devices. An example method of forming voids adjacent sidewalls of the conductive interconnects is described with reference to FIGS. 16-19.

Figure 16:
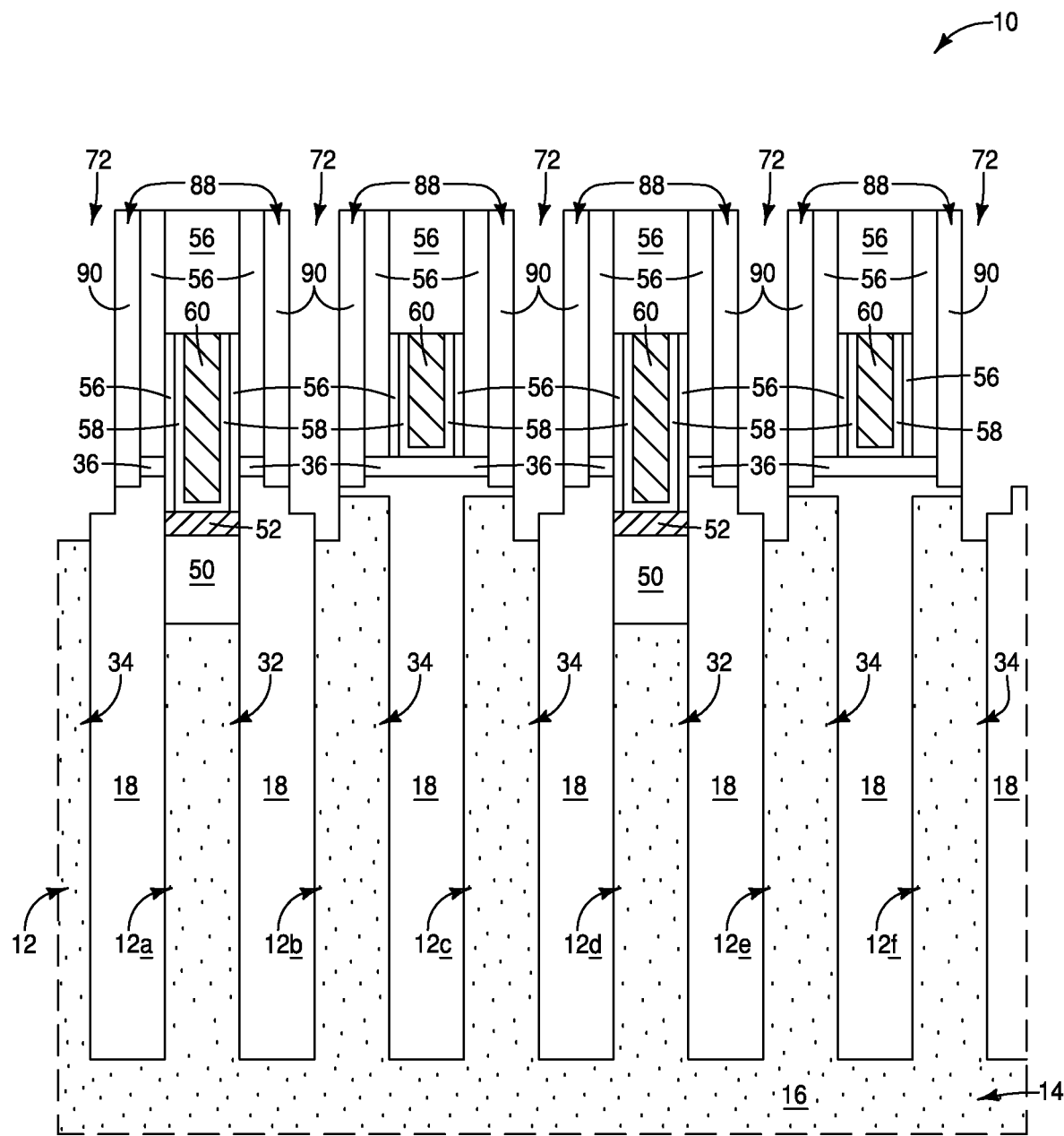
FIGS. 16-19 are diagrammatic cross-sectional side views along the same cross-section as FIG. 12A at example process stages of an example method which may follow the process stage of FIG. 12A.

Referring to FIG. 16, the assembly 10 is shown at a processing stage which may follow that of FIG. 12A. Sacrificial spacers 88 are optionally formed adjacent sidewalls of the second openings 72, and then the openings 72 are extended into the storage-element-contact regions 34 to form the extended second openings. The spacers comprise spacer material 90; which in some embodiments may comprise, consist essentially of, or consist of silicon nitride.

Figure 17:
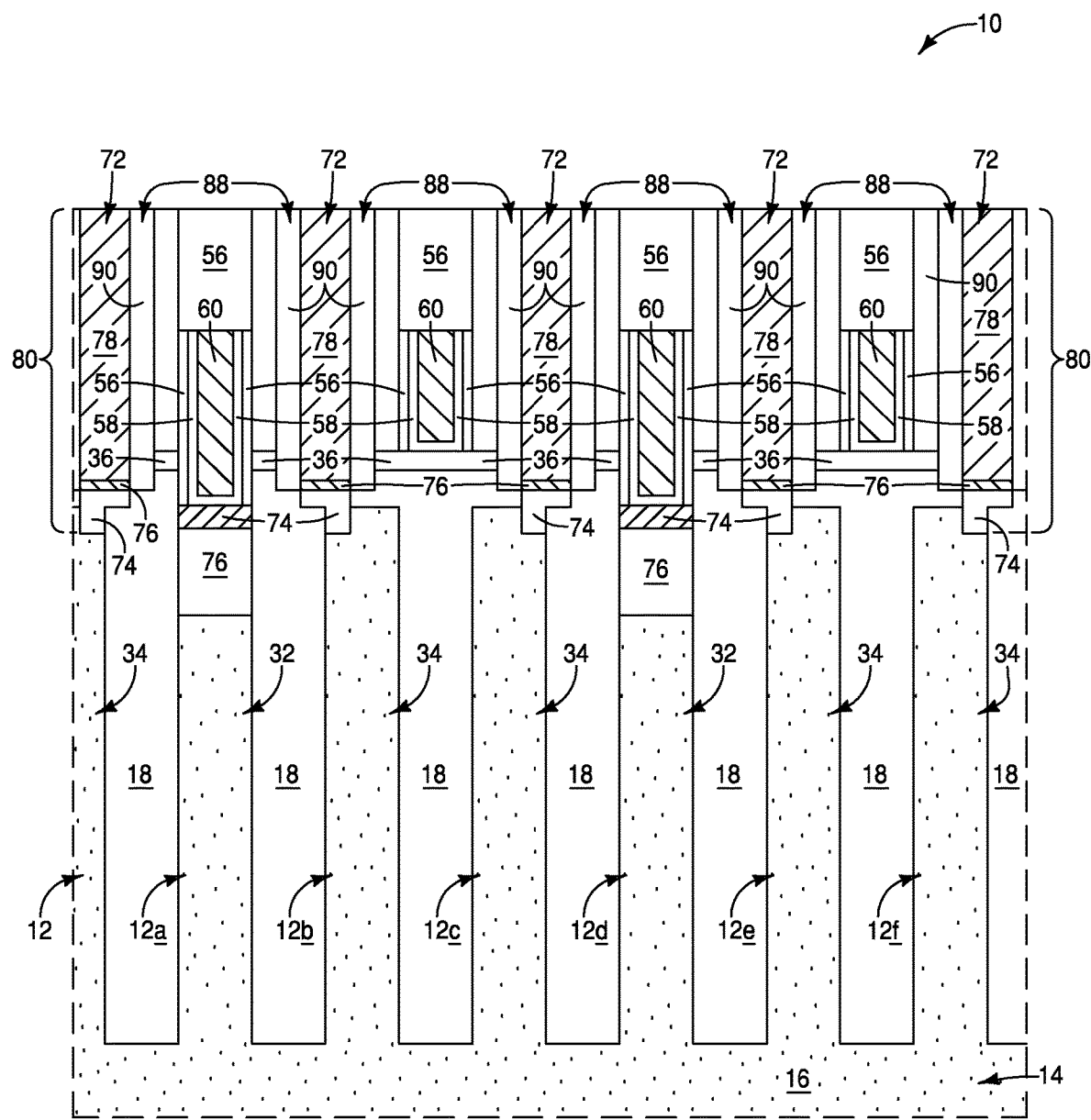

Referring to FIG. 17, the materials 74, 76 and 78 are formed within the extended openings 72 (FIG. 16) to form the conductive interconnects 80 electrically coupled with the storage-element-contact-regions 34.

Figure 18:
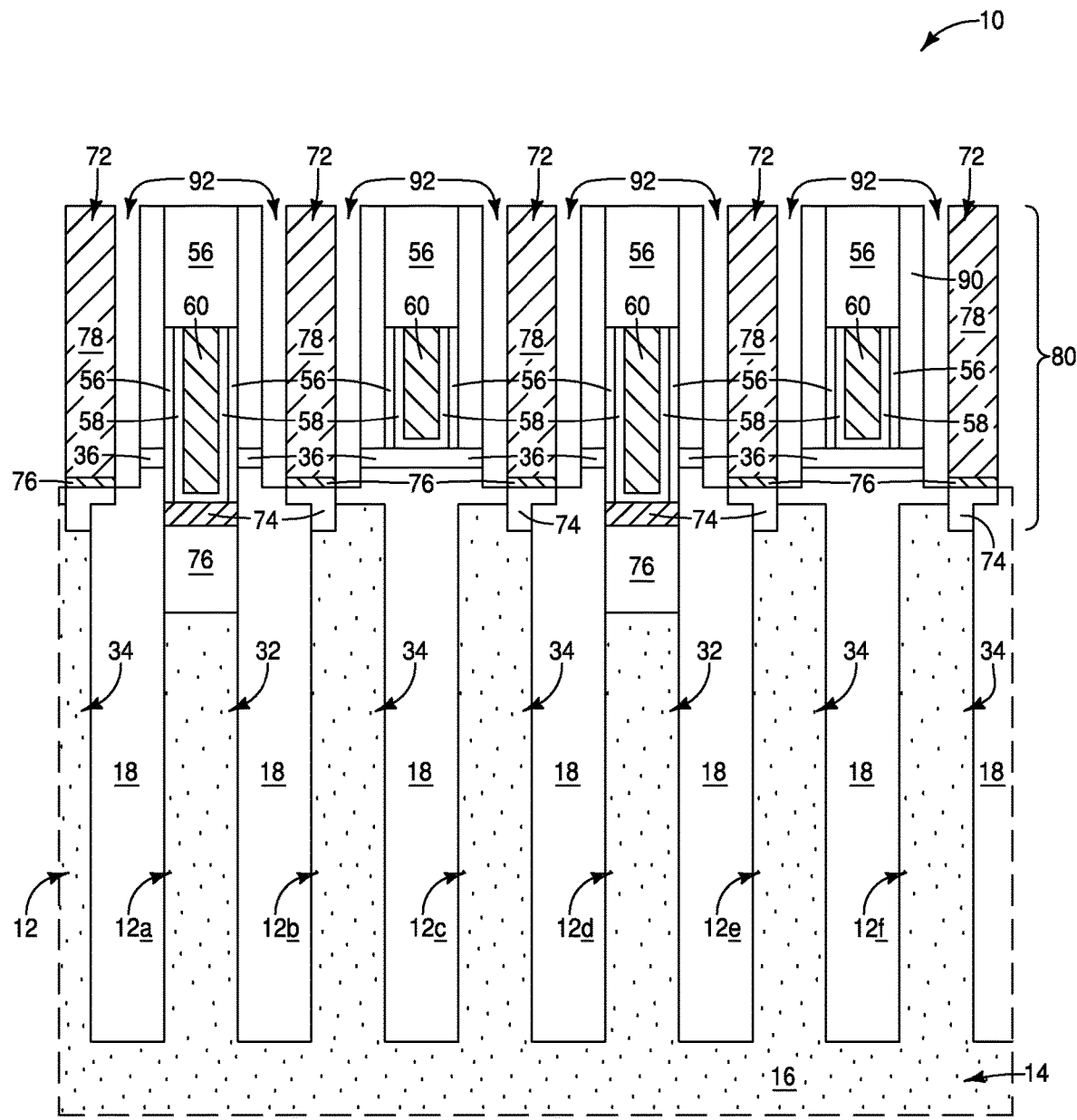

Referring to FIG. 18, the sacrificial spacers 88 (FIG. 17) are removed to leave voids (air gaps) 92 along sidewalls of the conductive interconnects 80. In the shown embodiment, the voids are along the sidewalls of the metal-containing material 78 and the metal-silicide 76. In some embodiments, the voids may or may not extend to also be along sidewalls of the epitaxially-grown semiconductor material 74. In some embodiments, the voids may extend along the metal-containing material 78 and not along the metal-silicide 76.

Figure 19:
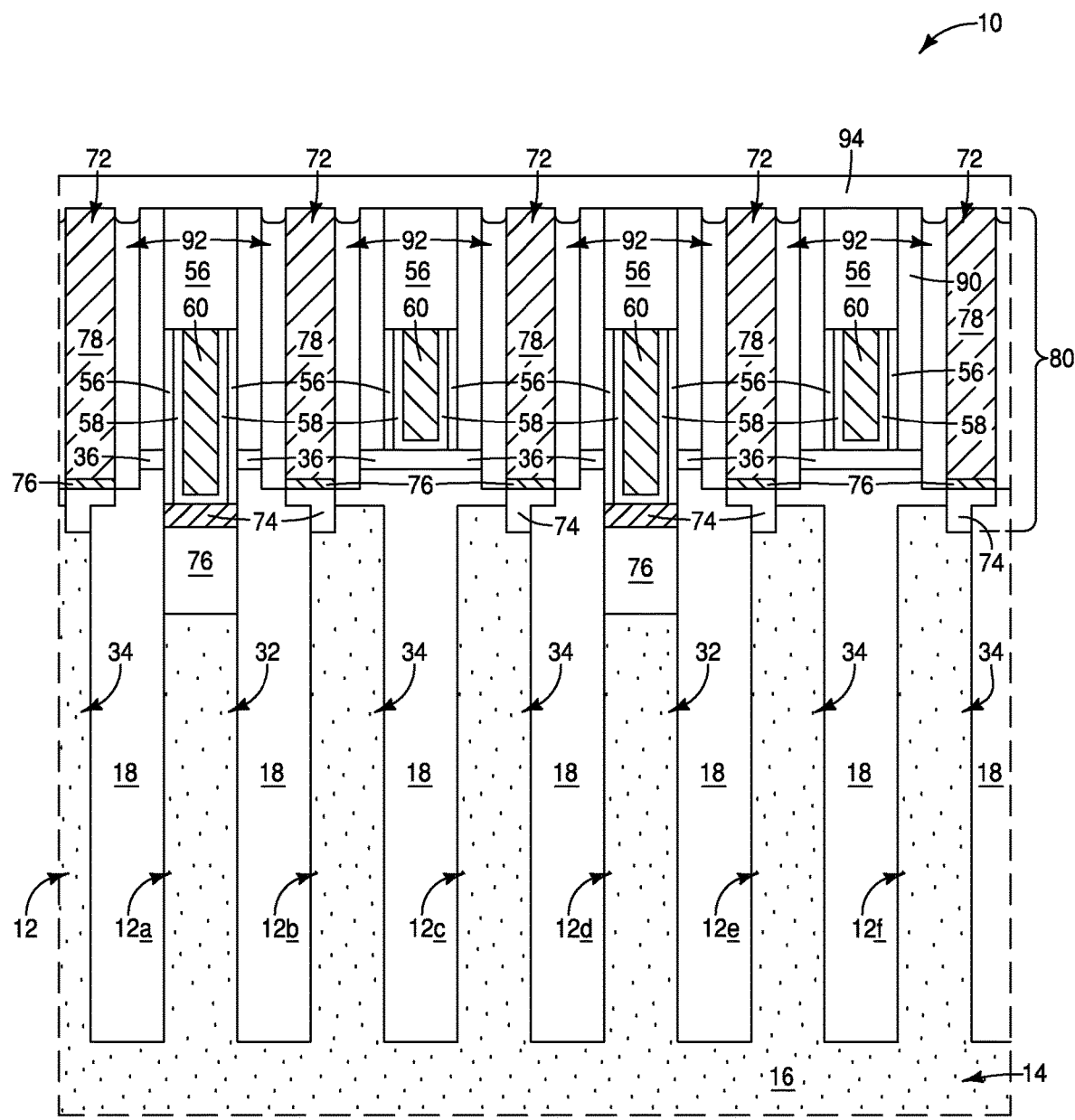

Referring to FIG. 19, sealant material 94 may be provided across the assembly 10 to seal the voids (air gaps) 92. The sealant material is electrically insulative material, and may comprise any suitable composition. In some example embodiments, the sealant material 94 may comprise one or more of silicon dioxide, silicon nitride, carbon-doped silicon dioxide, silicon oxynitride, etc. In some embodiments, the sealant material 94 may be low-k material.

The interconnects 80 of FIG. 19 may be subsequently coupled with storage-elements (e.g., the devices 82 of FIG. 14A) with any suitable processing.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc. The assemblies described herein may be provided along levels of a multi-level (e.g., multi-tier, multi-deck) assembly. Some of the levels may comprise memory and some may comprise control circuitry (e.g., drivers, sense amplifiers, etc.). In some embodiments, the memory may be over CMOS, with the CMOS being incorporated into control circuitry. The levels may be within separate dies (wafers) of a package, or may be part of the same die (wafer).

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include a method of forming an integrated assembly. A construction is provided which has active-region-pillars. Each active-region-pillar has a pair of storage-element-contact-regions, and has a digit-line-contact-region between the pair of storage-element-contact-regions. The active-region-pillars include semiconductor material. The construction includes wordlines along the active-region-pillars, and which extend along a first direction. A patterned mold is formed over the construction. The patterned mold has openings extending therethrough. The openings are aligned with the digit-line-contact-regions. The openings are extended into the semiconductor material of the digit-line-contact-regions. Carbon-containing-polymer is formed within the extended openings. Trenches are formed within the patterned mold. The trenches extend along a second direction and pass over the digit-line-contact-regions. The second direction crosses the first direction. The carbon-containing-polymer is removed from over the digit-line-contact-regions to reopen the openings. The reopened openings are at the bottoms of the trenches and extend into the semiconductor material of the digit-line-contact-regions. Surfaces of the digit-line-contact-regions are exposed within the reopened openings. Digit-line-material is formed within the trenches and is electrically coupled with the digit-line-contact-regions. The digit-line-material is configured as digit-lines extending along the second direction. Storage-elements are electrically coupled with the storage-element-contact-regions.

Some embodiments include a method of forming an integrated assembly. A construction is provided which has active-region-pillars. Each active-region-pillar has a pair of storage-element-contact-regions, and has a digit-line-contact-region between the pair of storage-element-contact-regions. The active-region-pillars include monocrystalline semiconductor material. The construction includes wordlines along the active-region-pillars and which extend along a first direction. A patterned mold is formed over the construction. The patterned mold has openings extending therethrough. The openings are aligned with the digit-line-contact-regions. The openings extend into the monocrystalline semiconductor material of the digit-line-contact-regions. Sacrificial material is formed within the extended openings. Trenches are formed within the patterned mold. The trenches extend along a second direction and pass over the digit-line-contact-regions. The second direction crosses the first direction. The sacrificial material is removed from over the digit-line-contact-regions to reopen the openings. The reopened openings are at the bottoms of the trenches and extend into the semiconductor material of the digit-line-contact-regions. Surfaces of the digit-line-contact-regions are exposed within the reopened openings. Silicon is epitaxially grown from the exposed surfaces of the digit-line-contact-regions. Digit-line-material is formed within the trenches and is electrically coupled with the epitaxially-grown-silicon. The digit-line-material is configured as digit-lines extending along the second direction. Storage-elements are electrically coupled with the storage-element-contact-regions.

Some embodiments include an integrated assembly having active-region-pillars. Each of the active-region-pillars has contact regions. The contact regions include a pair of storage-element-contact-regions, and include a digit-line-contact-region between the pair of storage-element-contact-regions. The active-region-pillars include silicon. Wordlines are along the active-region-pillars and extend along a first direction. Cobalt silicide is directly against silicon of one or more of the contact regions. Metal-containing material is directly against the cobalt silicide. Digit-lines are electrically coupled with the digit-line-contact-regions and extend along a second direction which crosses the first direction. Storage-elements are electrically coupled with the storage-element-contact-regions.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A method of forming an integrated assembly, comprising:
    providing a construction having active-region-pillars; each of the active-region-pillars having a pair of storage-element-contact-regions, and having a digit-line-contact-region between the storage-element-contact-regions of said pair; the active-region-pillars comprising semiconductor material; the construction including wordlines adjacent the active-region-pillars and extending along a first direction;
    forming a patterned mold over the construction; the patterned mold having openings extending therethrough; the openings being aligned with the digit-line-contact-regions;
    extending the openings into the semiconductor material of the digit-line-contact-regions;
    forming carbon-containing-polymer within the extended openings;

forming trenches within the patterned mold, the trenches extending along a second direction and passing over the digit-line-contact-regions; the second direction crossing the first direction;

removing the carbon-containing-polymer from over the digit-line-contact-regions to reopen the openings; the reopened openings being at the bottoms of the trenches and extending into the semiconductor material of the digit-line-contact-regions; surfaces of the digit-line-contact-regions being exposed within the reopened openings;

forming digit-line-material within the trenches and electrically coupled with the digit-line-contact-regions; the digit-line-material being configured as digit-lines extending along the second direction; and forming storage-elements electrically coupled with the storage-element-contact-regions of said pair.

2. The method of claim 1 wherein the trenches are formed with an etch followed by a clean to remove organic residues, and wherein the carbon-containing-polymer is removed during the clean.

3. The method of claim 2 wherein the patterned mold comprises silicon nitride, and wherein the clean utilizes ammonia and hydrogen peroxide.

4. The method of claim 1 further comprising forming metal silicide over the digit-line-contact-regions; and wherein the digit-line-material includes a metal over and directly against the metal silicide.

5. The method of claim 4 wherein the metal is selected from the group consisting of copper, molybdenum, palladium, platinum, ruthenium, tungsten, titanium, and mixtures thereof.

6. The method of claim 5 wherein the metal silicide is cobalt silicide.

7. The method of claim 1 further comprising forming cobalt silicide over the digit-line-contact-regions; and wherein the digit-line-material includes ruthenium which is over and directly against the cobalt silicide.

8. The method of claim 1 wherein the patterned mold comprises first material, wherein the openings are first openings, and wherein the trenches are first trenches; and further comprising:

forming spacers within the first trenches prior to forming the conductive-digit-line-material within the first trenches; the spacers comprising a second material;

recessing the conductive-digit-line-material within the first trenches and covering the recessed conductive-digit-line-material with the second material;

selectively removing the first material relative to the second material to form second trenches extending along the second direction;

forming first-material-pillars within the second trenches and aligned with portions of the storage-element-contact-regions;

forming the second material within the second trenches and between the first-material-pillars;

removing the first material selectively relative to the second material to remove the first-material-pillars and form second openings aligned with said portions of the storage-element-contact-regions;

extending the second openings into the storage-element-contact-regions; and forming conductive interconnects within the extended second openings; the storage-elements being electrically coupled with the storage-element-contact-regions through the conductive interconnects.

9. The method of claim 8 wherein the extending of the second openings into the storage-element-contact-regions exposes surfaces of the storage-element-contact-regions; wherein the semiconductor material comprise monocrystalline silicon; and wherein the forming of the conductive interconnects comprises:

epitaxially growing silicon from the exposed surfaces of the storage-element-contact-regions; and forming one or more metal-containing materials within the extended second openings and electrically coupled with the epitaxially-grown-silicon.

10. The method of claim 9 further comprising:

forming sacrificial material along sidewalls of the second openings prior to forming the one or more metal-containing materials within the extended second openings; and after forming the one or more metal-containing materials within the extended second openings, removing the sacrificial material to leave voids directly against regions of the conductive interconnects.

11. The method of claim 9 wherein the one or more metal-containing materials include a metal over a metal silicide; and wherein the metal silicide is directly against the epitaxially-grown-silicon.

12. The method of claim 11 wherein the metal is selected from the group consisting of copper, molybdenum, palladium, platinum, ruthenium, tungsten, titanium, and mixtures thereof.

13. The method of claim 12 wherein the metal silicide is cobalt silicide.

14. The method of claim 9 wherein the one or more metal-containing materials include ruthenium over cobalt silicide; and wherein the cobalt silicide is directly against the epitaxially-grown-silicon.

15. A method of forming an integrated assembly, comprising:

providing a construction having active-region-pillars; each of the active-region-pillars having a pair of storage-element-contact-regions, and having a digit-line-contact-region between the storage-element-contact-regions of said pair; the active-region-pillars comprising monocrystalline semiconductor material; the construction including wordlines adjacent the active-region-pillars and extending along a first direction;

forming a patterned mold over the construction; the patterned mold having openings extending therethrough; the openings being aligned with the digit-line-contact-regions;

extending the openings into the semiconductor material of the digit-line-contact-regions;

forming sacrificial material within the extended openings;

forming trenches within the patterned mold, the trenches extending along a second direction and passing over the digit-line-contact-regions; the second direction crossing the first direction;

removing the sacrificial material from over the digit-line-contact-regions to reopen the openings; the reopened openings being at the bottoms of the trenches and extending into the monocrystalline semiconductor material of the digit-line-contact-regions; surfaces of the digit-line-contact-regions being exposed within the reopened openings;

epitaxially growing silicon from the exposed surfaces of the digit-line-contact-regions;

forming digit-line-material within the trenches and electrically coupled with the epitaxially-grown-silicon; the digit-line-material being configured as digit-lines extending along the second direction; and forming storage-elements electrically coupled with the storage-element-contact-regions of said pair.

16. The method of claim 15 further comprising forming spacers adjacent sidewalls of the trenches prior to forming the digit-line-material within the trenches.

17. The method of claim 16 wherein the patterned mold comprises silicon nitride, and wherein the spacers comprise silicon dioxide.

18. The method of claim 15 further comprising forming barrier material adjacent sidewalls of the trenches prior to forming the digit-line-material within the trenches.

19. The method of claim 18 wherein the barrier material comprises one or more of ruthenium, tantalum and titanium; and wherein the digit-line-material comprises copper.

20. The method of claim 15 further comprising forming metal silicide directly against the epitaxially-grown-silicon; and wherein the digit-line-material includes a metal which is over and directly against the metal silicide.

21. The method of claim 20 wherein the metal is selected from the group consisting of copper, molybdenum, palladium, platinum, ruthenium, tungsten, titanium, and mixtures thereof.

22. The method of claim 21 wherein the metal silicide is cobalt silicide.

23. The method of claim 15 further comprising forming cobalt silicide directly against the epitaxially-grown-silicon; and wherein the digit-line-material includes ruthenium which is over and directly against the cobalt silicide.

24. The method of claim 15 wherein the sacrificial material is a carbon-containing-polymer; wherein the trenches are formed with an etch followed by a clean to remove organic residues, and wherein the carbon-containing-polymer is removed during the clean.

25. The method of claim 24 wherein the patterned mold comprises silicon nitride, and wherein the clean utilizes ammonia and hydrogen peroxide.

* * * * *